US011264362B2

(12) United States Patent
Chen et al.

(10) Patent No.: US 11,264,362 B2
(45) Date of Patent: Mar. 1, 2022

(54) SEMICONDUCTOR STRUCTURE AND METHOD OF FABRICATING THE SAME

(71) Applicant: Taiwan Semiconductor Manufacturing Co., Ltd., Hsinchu (TW)

(72) Inventors: Ming-Fa Chen, Taichung (TW); Chao-Wen Shih, Hsinchu County (TW); Min-Chien Hsiao, Taichung (TW); Nien-Fang Wu, Chiayi (TW); Sung-Feng Yeh, Taipei (TW); Tzuan-Horng Liu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/886,698

(22) Filed: May 28, 2020

(65) Prior Publication Data

US 2021/0375826 A1 Dec. 2, 2021

(51) Int. Cl.
*H01L 21/00* (2006.01)
*H01L 25/065* (2006.01)
*H01L 23/31* (2006.01)
*H01L 23/48* (2006.01)
*H01L 23/00* (2006.01)
(Continued)

(52) U.S. Cl.
CPC ...... *H01L 25/0657* (2013.01); *H01L 21/3043* (2013.01); *H01L 21/78* (2013.01); *H01L 23/3157* (2013.01); *H01L 23/481* (2013.01); *H01L 24/05* (2013.01); *H01L 24/80* (2013.01);
(Continued)

(58) Field of Classification Search
CPC ..... H01L 25/0657; H01L 24/05; H01L 21/78; H01L 23/481; H01L 24/94; H01L 23/3157; H01L 24/80; H01L 21/3043; H01L 2224/80001
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Nicholas J Tobergte
(74) *Attorney, Agent, or Firm* — JCIPRNET

(57) ABSTRACT

A die stack structure including a first semiconductor die, a second semiconductor die, an insulating encapsulation and a redistribution circuit structure is provided. The first semiconductor die includes a first semiconductor substrate including a first portion and a second portion, a first interconnect structure and a first bonding structure. The first interconnect structure is disposed on a top surface of the second portion, a lateral dimension of the first portion is greater than a lateral dimension of the top surface of the second portion. The second semiconductor die is disposed on the first semiconductor die and includes a second bonding structure, the second semiconductor die is electrically connected with the first semiconductor die through the first and second bonding structures. The insulating encapsulation is disposed on the first portion and laterally encapsulating the second portion and the second semiconductor die. The redistribution circuit structure is electrically connected with the first and second semiconductor dies, and the lateral dimension of the first portion is greater than a lateral dimension of the redistribution circuit structure.

15 Claims, 32 Drawing Sheets

(51) Int. Cl.
*H01L 21/304* (2006.01)
*H01L 21/78* (2006.01)

(52) U.S. Cl.
CPC .... *H01L 24/94* (2013.01); *H01L 2224/80001* (2013.01)

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2009/0166835 | A1* | 7/2009 | Yang ............ H01L 25/105 257/686 |
| 2012/0220082 | A1* | 8/2012 | Ng ............ H01L 21/568 438/124 |
| 2016/0315071 | A1* | 10/2016 | Zhai ............ H01L 24/24 |
| 2017/0170155 | A1* | 6/2017 | Yu ............ H01L 24/20 |
| 2019/0131277 | A1* | 5/2019 | Yang ............ H01L 23/3135 |
| 2020/0235073 | A1* | 7/2020 | Chen ............ H01L 23/3107 |
| 2021/0082874 | A1* | 3/2021 | Chen ............ H01L 25/0657 |
| 2021/0091064 | A1* | 3/2021 | Chen ............ H01L 25/0657 |
| 2021/0183844 | A1* | 6/2021 | Cheng ............ H01L 21/565 |
| 2021/0193582 | A1* | 6/2021 | Yu ............ H01L 23/5389 |

\* cited by examiner

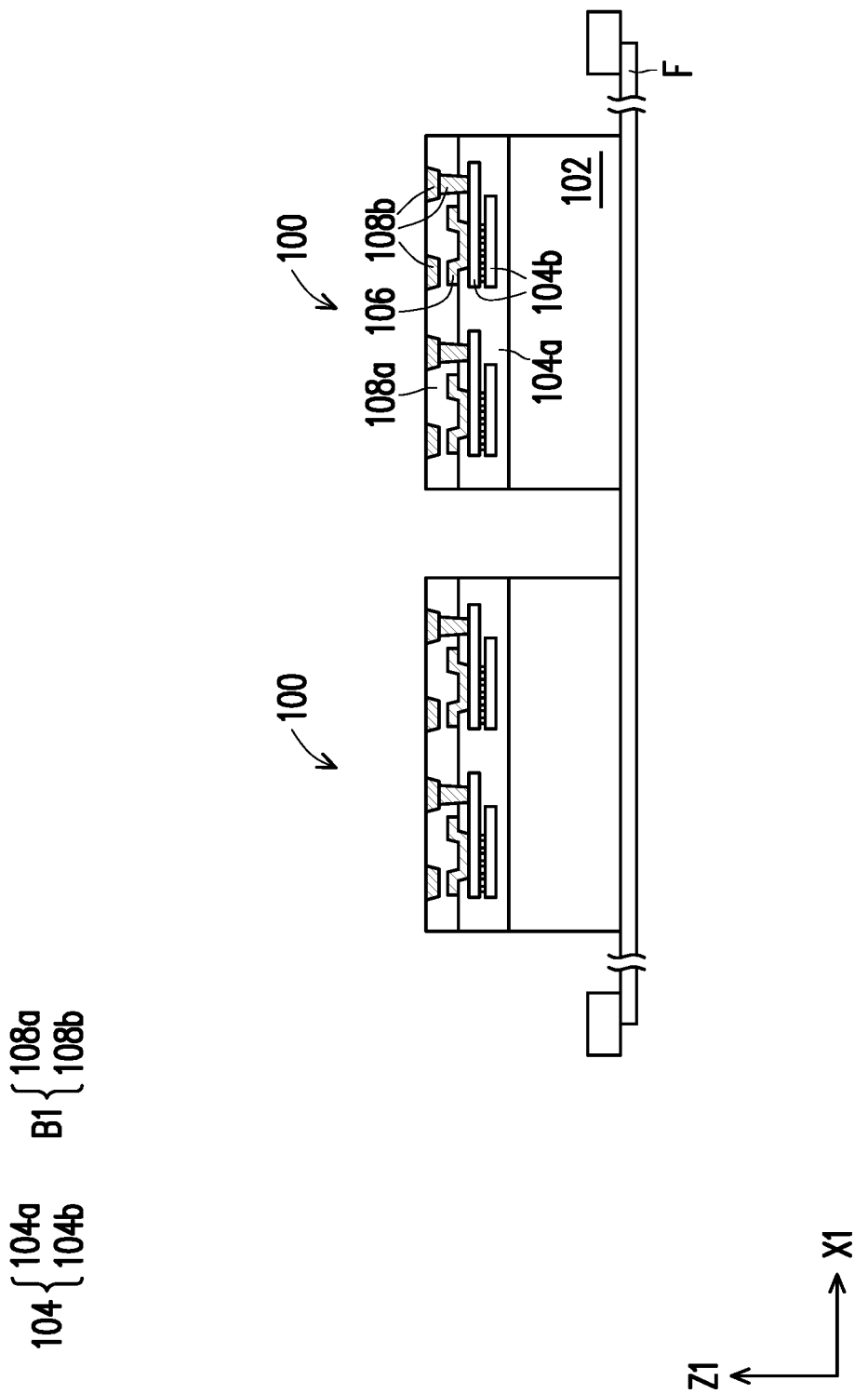

SEMICONDUCTOR STRUCTURE AND METHOD OF FABRICATING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness. However, there are challenges related to packaging process of the SoIC components.

BRIEF DESCRIPTION OF THE DRAWINGS

Aspects of the present disclosure are best understood from the following detailed description when read with the accompanying FIGS. It is noted that, in accordance with the standard practice in the industry, various features are not drawn to scale. In fact, the dimensions of the various features may be arbitrarily increased or reduced for clarity of discussion.

FIG. 1A to FIG. 1C are schematic cross-sectional views illustrating a process flow for fabricating a top tier semiconductor die in accordance with some embodiments of the present disclosure.

DETAILED DESCRIPTION

Figure 1A:
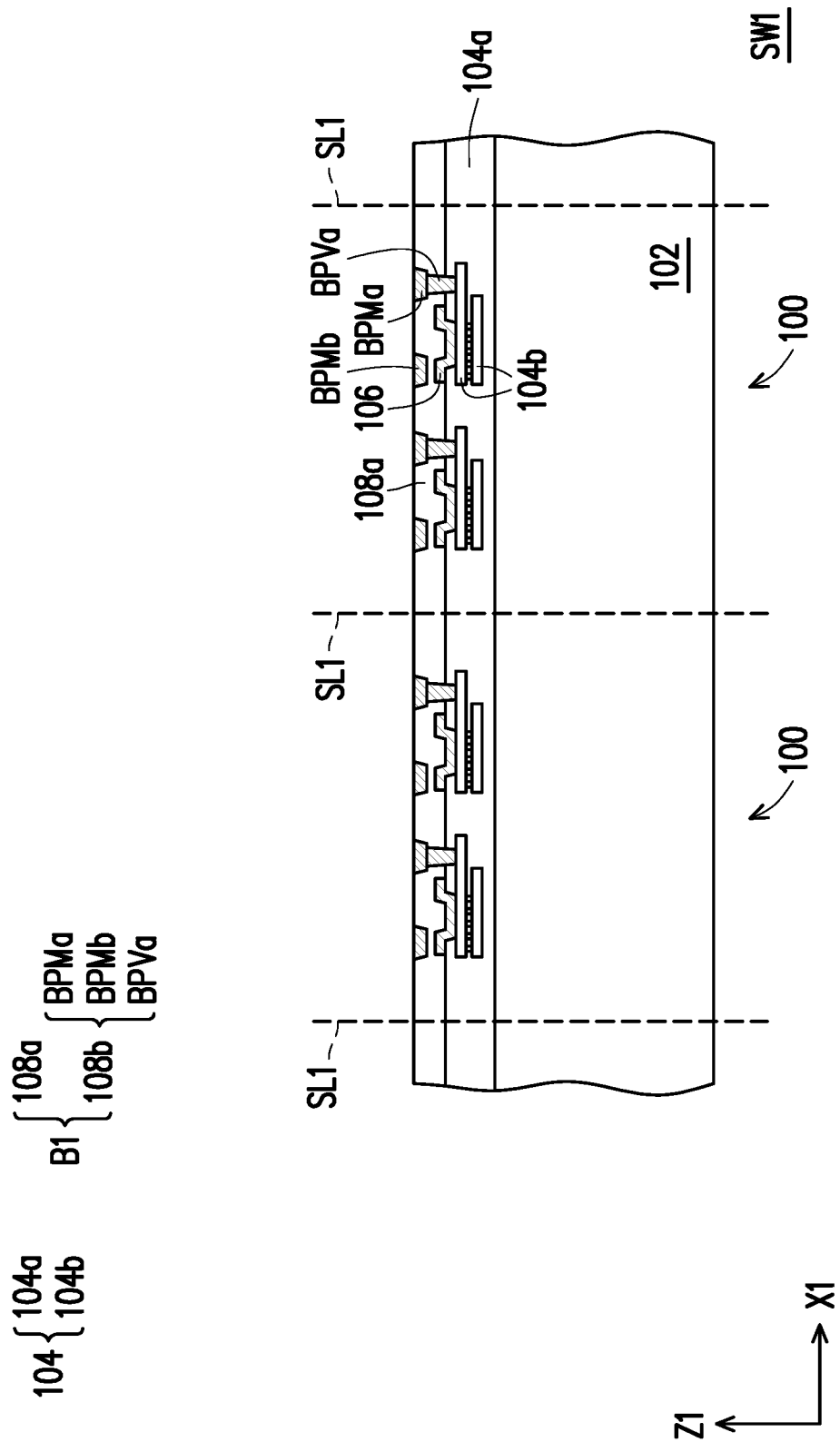

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
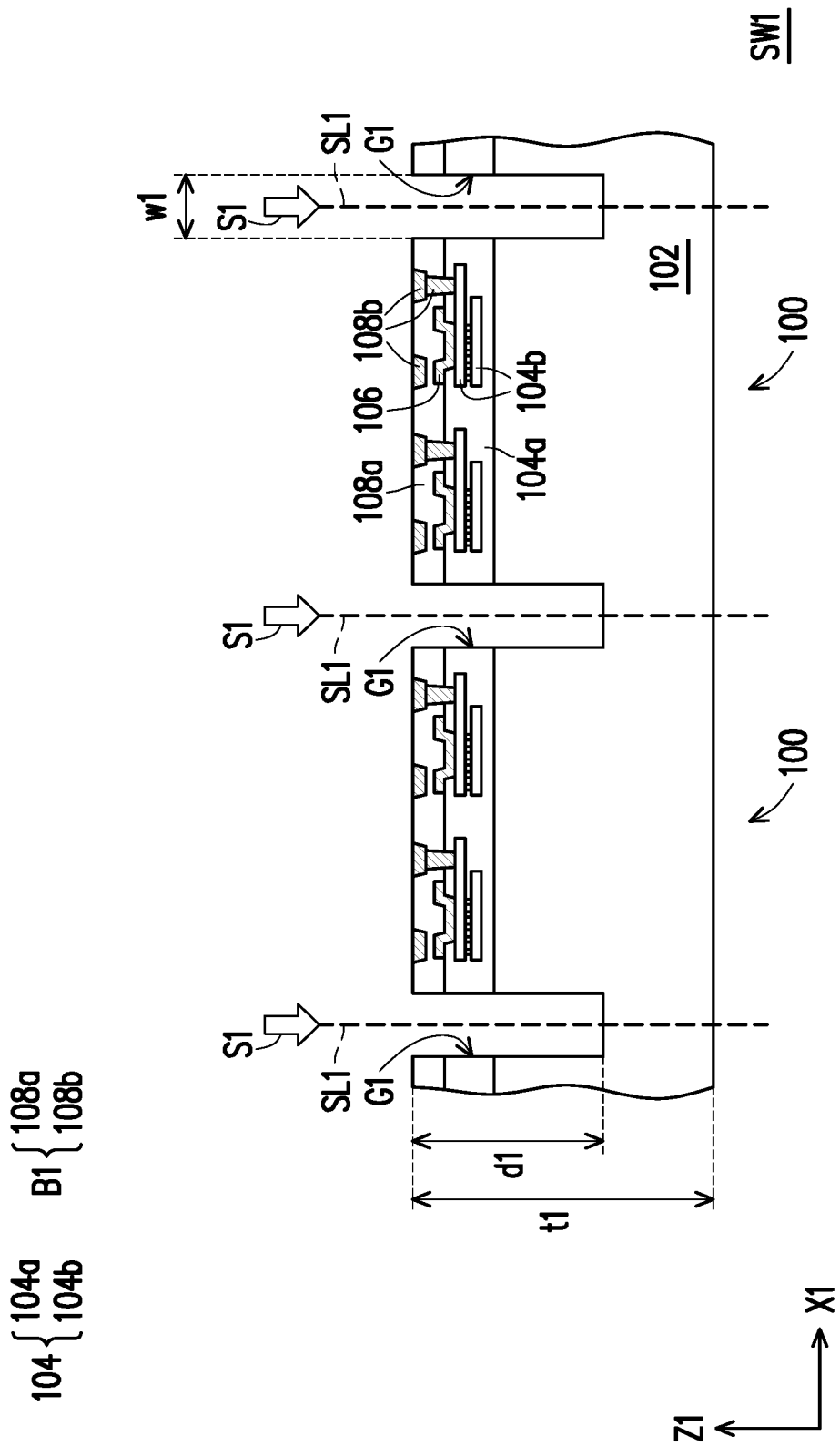

FIG. 1A to FIG. 1C are schematic cross-sectional views illustrating a process flow for fabricating a top tier semiconductor die in accordance with some embodiments of the present disclosure. Referring to FIG. 1A, a semiconductor wafer SW1 including top tier semiconductor dies 100 arranged in array is provided. As shown FIG. 1A, the top tier semiconductor dies 100 included in the semiconductor wafer SW1 are defined by intersected scribe lines SL1 (represented by the dash line in FIG. 1A). In some embodiments, the top tier semiconductor die 100 may include a memory chip such as a high bandwidth memory chip, a dynamic random access memory (DRAM) chip or a static random access memory (SRAM) chip. In some alternative embodiments, the top tier semiconductor die 100 may include a logic chip (e.g., central processing unit (CPU), graphics processing unit (GPU), system-on-a-chip (SoC), application processor (AP), microcontroller, etc.), an application-specific integrated circuit (ASIC) chip, an analog chip, a sensor chip, a wireless application chip (e.g., a Bluetooth chip, a radio frequency chip, etc.), or a voltage regulator chip. In one embodiment, the top tier semiconductor die 100 includes a SoC chip.

As illustrated in FIG. 1A, each of the top tier semiconductor dies 100 includes a semiconductor substrate 102, a interconnect structure 104, conductive pads 106, and a bonding structure B1. In some embodiments, the semiconductor substrate 102 may be made of elemental semiconductor materials such as crystalline silicon, diamond or germanium; compound semiconductor materials such as silicon carbide, gallium arsenic, indium arsenide or indium phosphide, or alloy semiconductor materials such as silicon germanium, silicon germanium carbide, gallium arsenic phosphide or gallium indium phosphide. In some embodiments, the semiconductor substrate 102 may be a bulk semiconductor material. For example, the semiconductor substrate 102 may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. However, the disclosure is not limited thereto. In some alternative embodiments, the semiconductor substrate 102 may include active components (e.g., transistors and/or memories such as NMOS and/or PMOS devices, or the like) and optionally passive components (e.g., resistors, capacitors, inductors or the like) formed therein. The active components and passive components are formed in the semiconductor substrate 102 through front end of line (FEOL) fabrication processes of the semiconductor wafer SW1.

In some embodiments, the interconnect structure 104 is disposed on the semiconductor substrate 102. In certain embodiments, the interconnect structure 104 is electrically connected with the active components and/or the passive components formed in the semiconductor substrate 102. The interconnect structure 104 is formed through back end of line (BEOL) fabrication processes of the semiconductor wafer SW1. In some embodiments, the interconnect structure 104 includes an inter-dielectric layer 104a and a plurality of conductive layers 104b. In some embodiments, the conductive layers 104b are embedded in the inter-dielectric layer 104a. For simplicity, the inter-dielectric layer 104a is illustrated as a bulky layer in FIG. 1A, but it should be understood that the inter-dielectric layer 104a may be constituted by multiple dielectric layers, and the number of the dielectric layers in the inter-dielectric layer 104a may be adjusted depending on product requirement. Further, the conductive layers 104b and the dielectric layers of the inter-dielectric layer 104a may be stacked alternately. It should be noted that the number of the conductive layers 104b in each top tier semiconductor die 100 shown in FIG. 1A is merely an illustration, and the disclosure is not limited. In some alternative embodiments, the number of the conductive layers 104b in each top tier semiconductor die 100 may be adjusted based on product requirement.

In some embodiments, the material of the inter-dielectric layer 104a may include a low-k dielectric material, a nitride such as silicon nitride ($SiN_x$, where x>0), an oxide such as silicon oxide ($SiO_x$, where x>0), undoped silicate glass (USG), doped silicon oxide such as phosphosilicate glass (PSG), borosilicate glass (BSG) or boron-doped phosphosilicate glass (BPSG), or a combination thereof. In some embodiments, the low-k dielectric material is generally a dielectric material having a dielectric constant (k-value) lower than about 3. For example, the inter-dielectric layer 104a may be made of a low-k dielectric material having a k-value lower than about 2.3, which is sometimes referred to as an extra low-k (ELK) dielectric material. In some embodiments, examples of the low-k material may include benzocyclobutene (BCB), FLARE®, SILK®, hydrogen silsesquioxane (HSQ), porous HSQ, methyl silsesquioxane (MSQ), porous MSQ, SiOF, NANOGLASS®, hybrid-organo siloxane polymer (HOSP), CORAL®, AURORA®, BLACK DIAMOND®, Xerogel, Aerogel, amorphous fluorinated carbon, or Parylene. In some embodiments, the inter-dielectric layer 104a may be formed by suitable fabrication techniques such as spin-on coating, chemical vapor deposition (CVD), low pressure chemical vapor deposition (LPCVD), plasma enhanced chemical vapor deposition (PECVD), high density plasma chemical vapor deposition (HDPCVD), flowable chemical vapor deposition (FCVD), atomic layer chemical vapor deposition (ALCVD) or physical vapor deposition (PVD). In some embodiments, the conductive layers 104b may include interconnect wirings and interconnect vias. Those skilled in the art should understand that the conductive layers 104b may further include seal ring structures (not shown) surrounding the conductive pads 106 (described hereinafter) at the periphery of each top tier semiconductor die 100. In some embodiments, the conductive layers 104b may be made of copper or other suitable metal. In some embodiments, the conductive layers 104b may be formed by suitable fabrication techniques such as electroplating or deposition. In certain embodiments, the conductive layers 104b may be formed by dual-damascene process. In some alternative embodiments, the conductive layers 104b may be formed by multiple single damascene processes.

In some embodiments, the conductive pads 106 are disposed on and electrically connected with the conductive layers 104b of the interconnect structure 104. The conductive pads 106 are formed through back end of line (BEOL) fabrication processes of the semiconductor wafer SW1. In some embodiments, the conductive pads 106 may be aluminum pads, copper pads or other suitable metal pads.

In some embodiments, the bonding structure B1 may include a bonding dielectric layer 108a and bonding conductors 108b embedded in the bonding dielectric layer 108a. As illustrated in FIG. 1A, the bonding dielectric layer 108a is disposed over the interconnect structure 104 and the conductive pads 106, and covers the conductive pads 106. In some embodiments, the bonding dielectric layer 108a may be made of silicon oxide ($SiO_x$, where x>0), silicon oxynitride ($SiO_xN_y$, where x>0 and y>0), silicon nitride ($SiN_x$, where x>0), or other suitable dielectric material. In some embodiments, the bonding dielectric layer 108a may be formed by suitable fabrication techniques such as CVD, HDPCVD or PECVD. In some embodiments, the bonding conductors 108b may include bonding pad metals BPMa, bonding pad metals BPMb, and bonding pad vias BPVa. Specifically, as shown in FIG. 1A, the bonding pad metals BPMa are electrically connected with the bonding pad vias BPVa, the bonding pad vias BPVa penetrate through the bonding dielectric layer 108a and the inter-dielectric layer 104a to establish electrical connection with conductive layers 104b of the interconnect structure 104, and the bonding pad metals BPMb are electrically insulate from the bonding pad metals BPMa, the bonding pad vias BPVa, and the conductive pads 106. In some embodiments, the bonding conductors 108b may be made of copper or other suitable metal that is easy for forming hybrid bonding. In some embodiments, the bonding conductors 108b may be formed by suitable fabrication techniques such as electroplating or deposition. In certain embodiments, the bonding conductors 108b may be formed by dual-damascene process. In some alternative embodiments, the bonding conductors 108b may be formed by multiple single damascene processes. In some embodiments, a barrier layer may be disposed between each bonding conductor 108b and the bonding dielectric layer 108a. The material of the barrier layer may include Ta, TaN, Ti, TiN, CoW or a combination thereof, for example. The number of the bonding conductors 108b in each top tier semiconductor die 100 may be less than or more than what is depicted in FIG. 1A, and may be designated based on the demand and/or design layout; the disclosure is not specifically limited thereto. In some embodiments, as shown in FIG. 1A, the illustrated top surfaces of the bonding pad metals BPMa, the bonding pad metals BPMb and the bonding dielectric layer 108a are substantially coplanar so as to provide an appropriate surface for hybrid bonding. The planarity may be achieved, for example, through a planarization step such as a chemical mechanical polishing (CMP) step or a mechanical grinding step.

Referring to FIG. 1B, a pre-cut process S1 is performed along the intersected scribe lines SL1 of the semiconductor wafer SW1 such that intersected grooves G1 are formed on the front surface of the semiconductor wafer SW1. In other words, as shown in FIG. 1B, during the pre-cut process S1, the grooves G1 are formed on the illustrated top surface of the semiconductor wafer SW1. In some embodiments, the grooves G1 are formed through an etching process performed along the intersected scribe lines SL1 of the semiconductor wafer SW1. That is to say, the grooves G1 are formed through a non-contact cutting process performed along the intersected scribe lines SL1 of the semiconductor wafer SW1. In certain embodiments, the pre-cut process S1 may include the steps of forming a patterned resist layer (not shown) on the bonding structure B1, and etching portions of the semiconductor wafer SW1 that are not covered by the patterned resist layer by a dry etching process, a wet etching process, combinations thereof, or the like to form the intersected grooves G1. For example, the grooves G1 are formed through a plasma dicing process (e.g., bosch process) performed along the intersected scribe lines SL1 of the semiconductor wafer SW1. In some embodiments, the grooves G1 may extend downwardly along a direction Z1 parallel to a normal direction of the semiconductor wafer SW1 through the interconnect structures 104, and portions of the semiconductor substrates 102 are revealed by the grooves G1.

In some embodiments, the grooves G1 do not penetrate through the semiconductor wafer SW1. That is to say, in the direction Z1, the depth d1 of the grooves G1 is less than the thickness t1 of the semiconductor wafer SW1. In certain embodiments, the depth d1 of the grooves G1 may range from about 5 micrometers to about 200 micrometers. In other words, the cutting depth of the pre-cut process S1 may range from about 5 micrometers to about 200 micrometers. In a direction X1 perpendicular the direction Z1, the maximum lateral dimension w1 of the grooves G1 may be designated based on the demand and/or design layout, as long as the sidewalls of the grooves G1 are laterally spaced from the seal ring structures of the interconnect structures 104 by the inter-dielectric layers 104a of interconnect structures 104, i.e., during the pre-cut process S1, the seal ring structures of the interconnect structures 104 are not diced. For example, in certain embodiments, the maximum lateral dimension w1 of the grooves G1 ranges from about 5 micrometers to about 120 micrometers. In other words, the maximum cutting width of the pre-cut process S1 ranges from about 5 micrometers to about 120 micrometer.

Referring to FIG. 1B and FIG. 1C, after performing pre-cut process S1, a thinning down process of the semiconductor wafer SW1 is performed to thin down the semiconductor substrates 102, such that the top tier semiconductor dies 100 are separated from each other. In some embodiments, the semiconductor wafer SW1 may be flipped (i.e., turned upside down), and the semiconductor substrates 102 are thinned down from the back surface of the semiconductor wafer SW1 through a thinning down process. In some embodiments, the semiconductor substrates 102 are thinned down through a mechanical grinding process, a CMP process, an etching process, combinations thereof or other suitable removal processes. Continue referring to FIG. 1C, after the singulated top tier semiconductor dies 100 are formed, the said top tier semiconductor dies 100 are placed on a frame structure F. Up to here, the top tier semiconductor dies 100 of the exemplary embodiment may be fabricated.

FIG. 2A to FIG. 2K are schematic cross-sectional views illustrating a process flow for fabricating a die stack structure in accordance with some embodiments of the present disclosure.

Figure 2A:
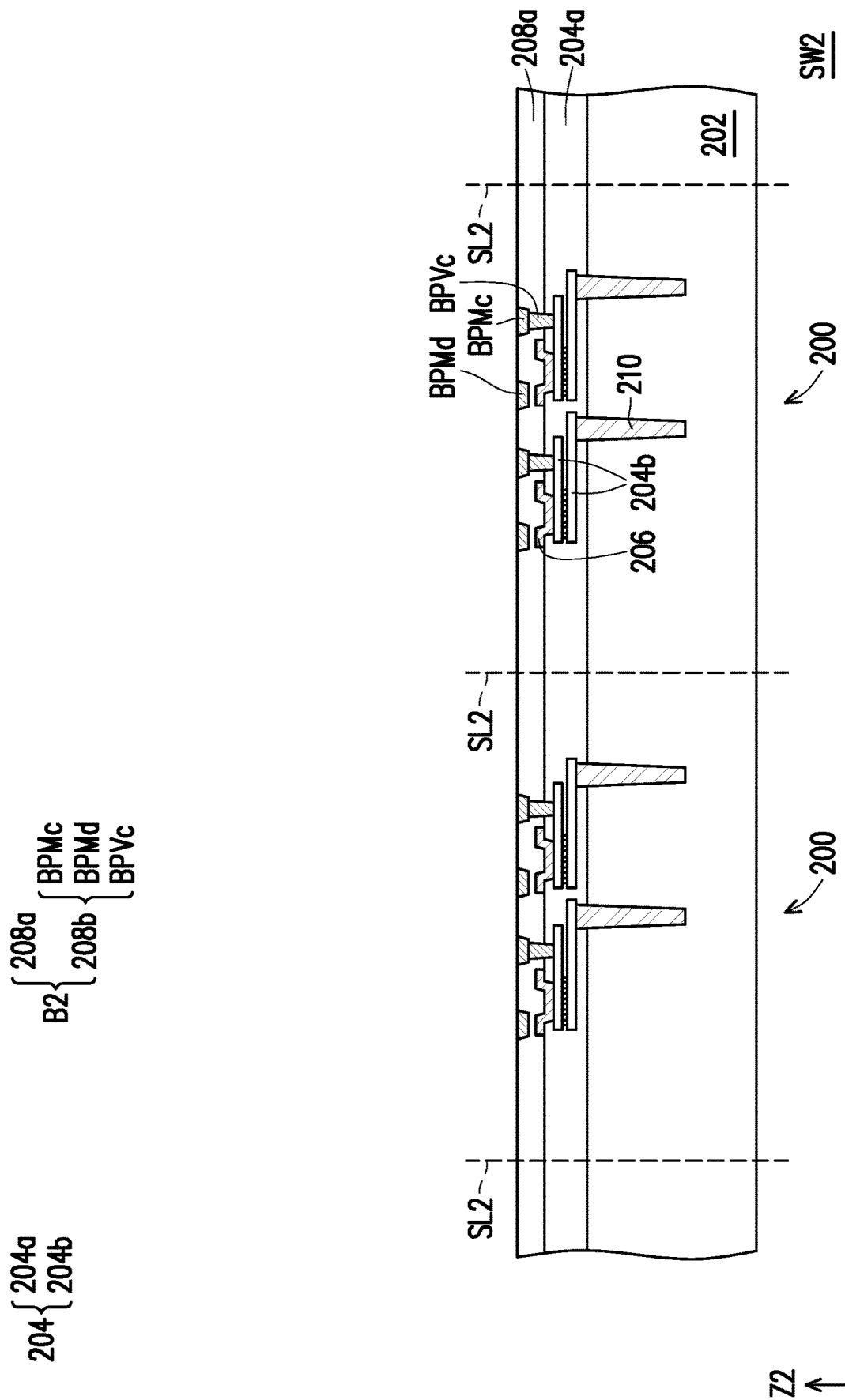
FIG. 2A to FIG. 2K are schematic cross-sectional views illustrating a process flow for fabricating a die stack structure in accordance with some embodiments of the present disclosure.

Referring to FIG. 2A, a semiconductor wafer SW2 including bottom tier semiconductor dies 200 arranged in array is provided. As shown FIG. 2A, the bottom tier semiconductor dies 200 included in the semiconductor wafer SW2 are defined by intersected scribe lines SL2 (represented by the dash line in FIG. 2A). In some embodiments, the bottom tier semiconductor die 200 may include a memory chip such as a high bandwidth memory chip, a DRAM chip or a SRAM chip. In some alternative embodiments, the bottom tier semiconductor die 200 may include a logic chip (e.g., central processing unit (CPU), graphics processing unit (GPU), system-on-a-chip (SoC), application processor (AP), microcontroller, etc.), an application-specific integrated circuit (ASIC) chip, an analog chip, a sensor chip, a wireless application chip (e.g., a Bluetooth chip, a radio frequency chip, etc.), or a voltage regulator chip. In one embodiment, the bottom tier semiconductor die 200 includes a SRAM chip.

As illustrated in FIG. 2A, each of the bottom tier semiconductor dies 200 includes a semiconductor substrate 202, a interconnect structure 204, conductive pads 206, through semiconductor vias 210, and a bonding structure B2. In some embodiments, the semiconductor substrate 202 may be made of elemental semiconductor materials such as crystalline silicon, diamond or germanium; compound semiconductor materials such as silicon carbide, gallium arsenic, indium arsenide or indium phosphide, or alloy semiconductor materials such as silicon germanium, silicon germanium carbide, gallium arsenic phosphide or gallium indium phosphide. In some embodiments, the semiconductor substrate 202 may be a bulk semiconductor material. For example, the semiconductor substrate 202 may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. However, the disclosure is not limited thereto. In some alternative embodiments, the semiconductor substrate 202 may include active components (e.g., transistors and/or memories such as NMOS and/or PMOS devices, or the like) and optionally passive components (e.g., resistors, capacitors, inductors or the like) formed therein. The active components and passive components are formed in the semiconductor substrate 202 through front end of line (FEOL) fabrication processes of the semiconductor wafer SW2.

In some embodiments, the interconnect structure 204 is disposed on the semiconductor substrate 202. In certain embodiments, the interconnect structure 204 is electrically connected with the active components and/or the passive components formed in the semiconductor substrate 202. The interconnect structure 204 is formed through back end of line (BEOL) fabrication processes of the semiconductor wafer SW2. In some embodiments, the interconnect structure 204 includes an inter-dielectric layer 204a and a plurality of conductive layers 204b. In some embodiments, the conductive layers 204b are embedded in the inter-dielectric layer 204a. For simplicity, the inter-dielectric layer 204a is illustrated as a bulky layer in FIG. 2A, but it should be understood that the inter-dielectric layer 204a may be constituted by multiple dielectric layers, and the number of the dielectric layers in the inter-dielectric layer 204a may be adjusted depending on product requirement. Further, the conductive layers 204b and the dielectric layers of the inter-dielectric layer 204a may be stacked alternately. It should be noted that the number of the conductive layers 204b in each bottom tier semiconductor die 200 shown in FIG. 2A is merely an illustration, and the disclosure is not limited. In some alternative embodiments, the number of the conductive layers 204b in each bottom tier semiconductor die 200 may be adjusted based on product requirement.

In some embodiments, the material of the inter-dielectric layer 204a may include a low-k dielectric material, a nitride such as silicon nitride ($SiN_x$, where x>0), an oxide such as silicon oxide ($SiO_x$, where x>0), undoped silicate glass (USG), doped silicon oxide such as phosphosilicate glass (PSG), borosilicate glass (BSG) or boron-doped phosphosilicate glass (BPSG), or a combination thereof. In some embodiments, the low-k dielectric material is generally a dielectric material having a dielectric constant (k-value) lower than about 3. For example, the inter-dielectric layer 204a may be made of a low-k dielectric material having a k-value lower than about 2.3, which is sometimes referred to as an extra low-k (ELK) dielectric material. In some embodiments, examples of the low-k material may include benzocyclobutene (BCB), FLARE®, SILK®, hydrogen silsesquioxane (HSQ), porous HSQ, methyl silsesquioxane (MSQ), porous MSQ, SiOF, NANOGLASS®, hybrid-organo siloxane polymer (HOSP), CORAL®, AURORA®, BLACK DIAMOND®, Xerogel, Aerogel, amorphous fluorinated carbon, or Parylene. In some embodiments, the inter-dielectric layer 204a may be formed by suitable fabrication techniques such as spin-on coating, CVD, LPCVD, PECVD, HDPCVD, FCVD, ALCVD or PVD. In some embodiments, the conductive layers 204b may include interconnect wirings and interconnect vias. Those skilled in the art should understand that the conductive layers 204b may further include seal ring structures (not shown) surrounding the conductive pads 206 (described hereinafter) at the periphery of each bottom tier semiconductor die 200. In some embodiments, the conductive layers 204b may be made of copper or other suitable metal. In some embodiments, the conductive layers 204b may be formed by suitable fabrication techniques such as electroplating or deposition. In certain embodiments, the conductive layers 204b may be formed by dual-damascene process. In some alternative embodiments, the conductive layers 204b may be formed by multiple single damascene processes.

In some embodiments, the conductive pads 206 are disposed on and electrically connected with the conductive layers 204b of the interconnect structure 204. The conductive pads 206 are formed through back end of line (BEOL) fabrication processes of the semiconductor wafer SW2. In some embodiments, the conductive pads 206 may be aluminum pads, copper pads or other suitable metal pads.

In some embodiments, the through semiconductor vias 210 are located in the semiconductor substrate 202 and the interconnect structure 204. In some embodiments, the through semiconductor vias 210 are electrically connected with the conductive layers 204b of the interconnect structure 204. As illustrated in FIG. 2A, the through semiconductor vias 210 are embedded in the semiconductor substrate 202 and the interconnect structure 204, and the through semiconductor vias 210 are not revealed from the illustrated bottom surface of the semiconductor substrate 202. In other words, the through semiconductor vias 210 of each bottom tier semiconductor die 200 are not revealed from the back surface of the semiconductor substrate 202. In some embodiments, the through semiconductor via 210 may be referred to as through silicon via.

In some embodiments, the bonding structure B2 may include a bonding dielectric layer 208a and bonding conductors 208b embedded in the bonding dielectric layer 208a. As illustrated in FIG. 2A, the bonding dielectric layer 208a is disposed over the interconnect structure 204 and the conductive pads 206, and covers the conductive pads 206. In some embodiments, the bonding dielectric layer 208a may be made of silicon oxide ($SiO_x$, where x>0), silicon oxynitride ($SiO_xN_y$, where x>0 and y>0), silicon nitride ($SiN_x$, where x>0), or other suitable dielectric material. In some embodiments, the bonding dielectric layer 208a may be formed by suitable fabrication techniques such as CVD, HDPCVD or PECVD. In some embodiments, the bonding conductors 208b may include bonding pad metals BPMc, bonding pad metals BPMd, and bonding pad vias BPVc. Specifically, as shown in FIG. 2A, the bonding pad metals BPMc are electrically connected with the bonding pad vias BPVc, the bonding pad vias BPVc penetrate through the bonding dielectric layer 208a and the inter-dielectric layer 204a to establish electrical connection with conductive layers 204b of the interconnect structure 204, and the bonding pad metals BPMd are electrically insulate from the bonding pad metals BPMc, the bonding pad vias BPVc, and the conductive pads 206. In some embodiments, the bonding conductors 208b may be made of copper or other suitable metal that is easy for forming hybrid bonding. In some embodiments, the bonding conductors 208b may be formed by suitable fabrication techniques such as electroplating or deposition. In certain embodiments, the bonding conductors 208b may be formed by dual-damascene process. In some alternative embodiments, the bonding conductors 208b may be formed by multiple single damascene processes. In some embodiments, a barrier layer may be disposed between each bonding conductor 208b and the bonding dielectric layer 208a. The material of the barrier layer may include Ta, TaN, Ti, TiN, CoW or a combination thereof, for example. The number of the bonding conductors 208b in each bottom tier semiconductor die 200 may be less than or more than what is depicted in FIG. 2A, and may be designated based on the demand and/or design layout; the disclosure is not specifically limited thereto. In some embodiments, as shown in FIG. 2A, the illustrated top surfaces of the bonding pad metals BPMc, the bonding pad metals BPMd and the bonding dielectric layer 208a are substantially coplanar so as to provide an appropriate surface for hybrid bonding. The planarity may be achieved, for example, through a planarization step such as a CMP step or a mechanical grinding step.

Figure 2B:
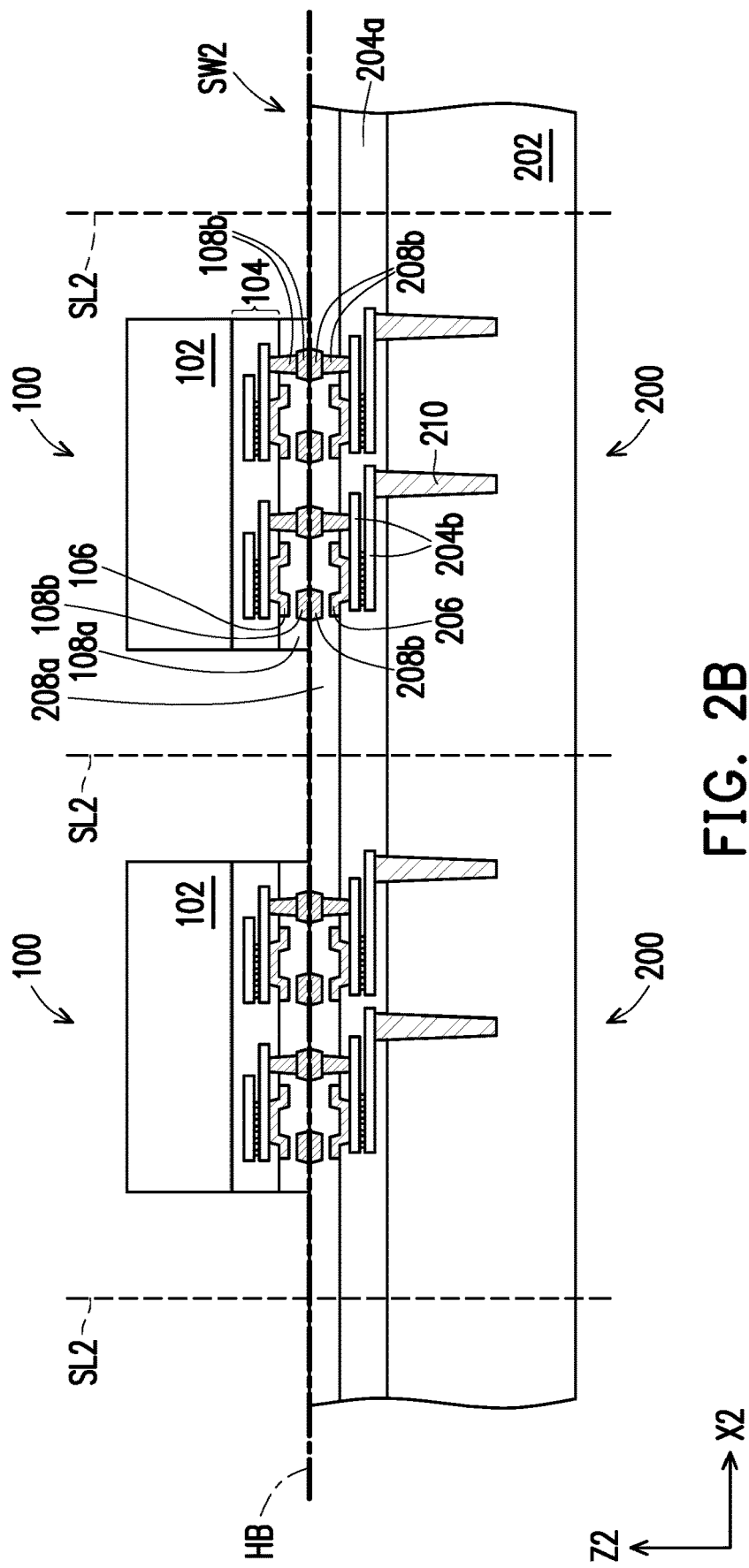

Referring to FIG. 2B, the top tier semiconductor dies 100 are provided and bonded with the semiconductor wafer SW2. Although FIG. 2B illustrates that one top tier semiconductor die 100 is bonded with one bottom tier semiconductor die 200 of the semiconductor wafer SW2, it should be noted that the number of the top tier semiconductor die 100 bonded with one bottom tier semiconductor die 200 is not limited thereto, and this can be adjusted based on design requirement. For example, in some embodiments, at least two top tier semiconductor dies 100 may be bonded with one bottom tier semiconductor die 200 side-by-side.

Specifically, a bonding process is performed to bond the top tier semiconductor dies 100 with the bottom tier semiconductor dies 200 of the semiconductor wafer SW2. As shown in FIG. 2B, the top tier semiconductor dies 100 and the bottom tier semiconductor dies 200 are face-to-face bonded through the bonding structures B1 and the bonding structures B2 in a one-to-one way. In detail, as shown in FIG. 2B, the bonding dielectric layer 108a of the bonding structure B1 is bonded to the bonding dielectric layer 208a of the bonding structure B2 through the dielectric-to-dielectric bonding, and the bonding conductors 108b of the bonding structure B1 are bonded to the bonding conductors 208b of the bonding structure B2 through the metal-to-metal bonding. That is to say, during the bonding process, the top tier semiconductor dies 100 are hybrid bonded to the bottom tier semiconductor dies 200, and a hybrid bonding interface HB (represented by the dash line in FIG. 2B) is achieved between the top tier semiconductor dies 100 and the bottom tier semiconductor dies 200. In other words, the bonding process is a hybrid bonding process. In some embodiments, the top tier semiconductor dies 100 are electrically connected to the bottom tier semiconductor dies 200 by the bonding structures B1 and the bonding structures B2. In some embodiments, the metal-to-metal bonding at the hybrid bonding interface HB is copper-to-copper bonding. In some embodiments, the dielectric-to-dielectric bonding at the hybrid bonding interface HB is achieved with Si—O—Si bonds generated. In some embodiments, the top tier semiconductor dies 100 are hybrid bonded to the bottom tier semiconductor dies 200 of the semiconductor wafer SW2 through chip-to-wafer bonding technology.

In some embodiments, during the bonding process, a low temperature heating process at a temperature of about 100° C. to about 300° C. is performed to strengthen the dielectric-to-dielectric bonding at the hybrid bonding interface HB, and a high temperature heating process is performed at a temperature of about 150° C. to about 400° C. to facilitate the metal-to-metal bonding at the hybrid bonding interface HB. In some embodiments, to facilitate the hybrid bonding between the top tier semiconductor dies 100 and the bottom tier semiconductor dies 200 of the semiconductor wafer SW2, surface preparation for the bonding surfaces of the top tier semiconductor dies 100 and the bottom tier semiconductor dies 200 may be performed. The surface preparation may include surface cleaning and activation, for example. In some embodiments, the bonding surfaces of the top tier semiconductor dies 100 and the bottom tier semiconductor dies 200 may be cleaned by wet cleaning, for example. In addition, before the bonding process is performed, the top tier semiconductor dies 100 may be placed on the illustrated top surface (i.e., front surface) of the semiconductor wafer SW2 such that the illustrated top surface of the semiconductor wafer SW2 is in contact with the illustrated bottom surface (i.e., front surface) of each top tier semiconductor die 100. Meanwhile, the bonding conductors 108b of the top tier semiconductor dies 100 are substantially aligned and in direct contact with the bonding conductors 208b of the bottom tier semiconductor dies 200.

Figure 2C:
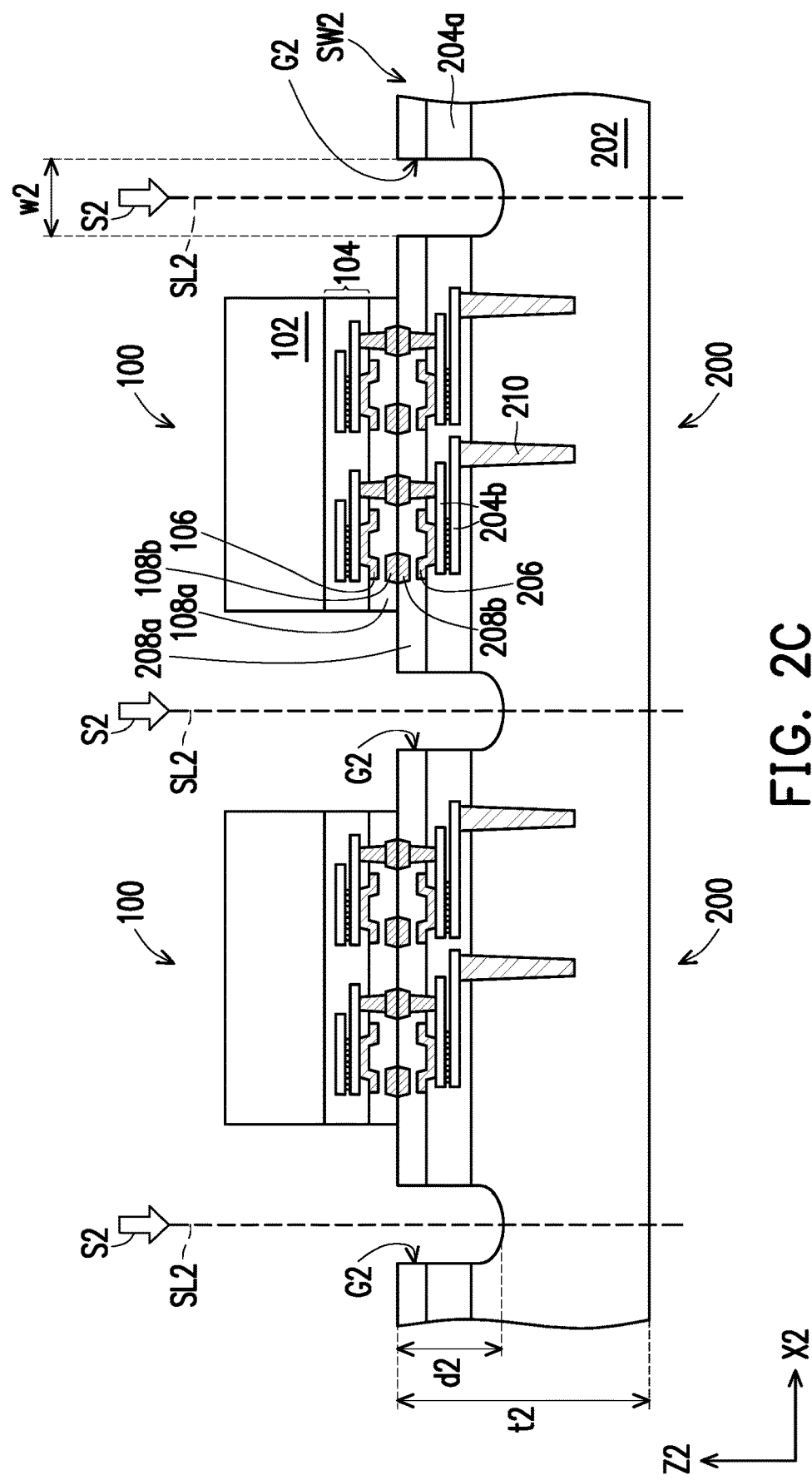

Referring to FIG. 2C, after bonding the top tier semiconductor dies 100 to the semiconductor wafer SW2, a pre-cut process S2 is performed along intersected scribe lines SL2 of the semiconductor wafer SW2 such that intersected grooves G2 are formed on a front surface of the semiconductor wafer SW2. That is to say, the pre-cut process S2 is performed from the front side of the semiconductor wafer SW2. In other words, as shown in FIG. 2C, during the pre-cut process S2, the grooves G2 are formed on the illustrated top surface of the semiconductor wafer SW2. In some embodiments, the grooves G2 are formed through a non-contact cutting process performed along the intersected scribe lines SL2 of the semiconductor wafer SW2. For example, the grooves G2 are formed through a laser grooving process performed along the intersected scribe lines SL2 of the semiconductor wafer SW2. In some embodiments, the grooves G2 may extend downwardly along a direction Z2 parallel to a normal direction of the semiconductor wafer SW2 through the interconnect structure 204, and portions of the semiconductor substrates 202 are revealed by the grooves G2. That is to say, the pre-cut process S2 performed to the semiconductor wafer SW2 cuts through the interconnect structures 204 and over cuts into the semiconductor substrates 202. In this way, after performing the pre-cut process S2, the portions of the semiconductor substrates 202 revealed by the grooves G2 may be rendered into an amorphous state, such that during the subsequently wafer sawing process (e.g., the wafer sawing process S4 as shown in FIG. 2I), the semiconductor substrates 202 can be prevented from cracking and/or delamination prone to occur at the surfaces of the second semiconductor devices 202 in contact with the blade used in the subsequently wafer sawing process. In some embodiments, as shown in FIG. 2C, the pre-cut process S2 performed to the semiconductor wafer SW2 cuts through the inter-dielectric layers 204a of the interconnect structures 204 without cutting the conductive layers 204b of the interconnect structures 204. However, the disclosure is not limited thereto. In some alternative embodiments, the pre-cut process S2 may cut through the inter-dielectric layers 204a and cut some portions of the conductive layers 204b (e.g., testing pads).

In some embodiments, the grooves G2 do not penetrate through the semiconductor wafer SW2. That is to say, in the direction Z2, the maximum depth d2 of the grooves G2 is less than the thickness t2 of the semiconductor wafer SW2. In certain embodiments, the maximum depth d2 of the grooves G2 may range from about 5 micrometers to about 100 micrometers. In other words, the maximum cutting depth of the pre-cut process S2 may range from about 5 micrometers to about 100 micrometers. For example, in one embodiment, the maximum depth d2 of the grooves G2 may be about 40 micrometers. In a direction X2 perpendicular the direction Z2, the maximum lateral dimension w2 of the grooves G2 may be designated based on the demand and/or design layout, as long as the sidewalls of the grooves G2 are laterally spaced from the seal ring structures of the interconnect structures 204 by the inter-dielectric layers 204a of interconnect structures 204, i.e., during the pre-cut process S2, the seal ring structures of the interconnect structures 204 are not cut. For example, in certain embodiments, the maximum lateral dimension w2 of the grooves G2 ranges from about 40 micrometers to about 180 micrometers. In other words, the maximum cutting width of the pre-cut process S2 ranges from about 40 micrometers to about 180 micrometer. Moreover, as shown in FIG. 2C, the illustrated bottom surface of each groove G2 has a substantially smooth curved contour. However, the disclosure is not limited thereto. In some alternative embodiments, the bottom surface of each groove G2 may has an irregular and uneven contour.

Figure 2D:
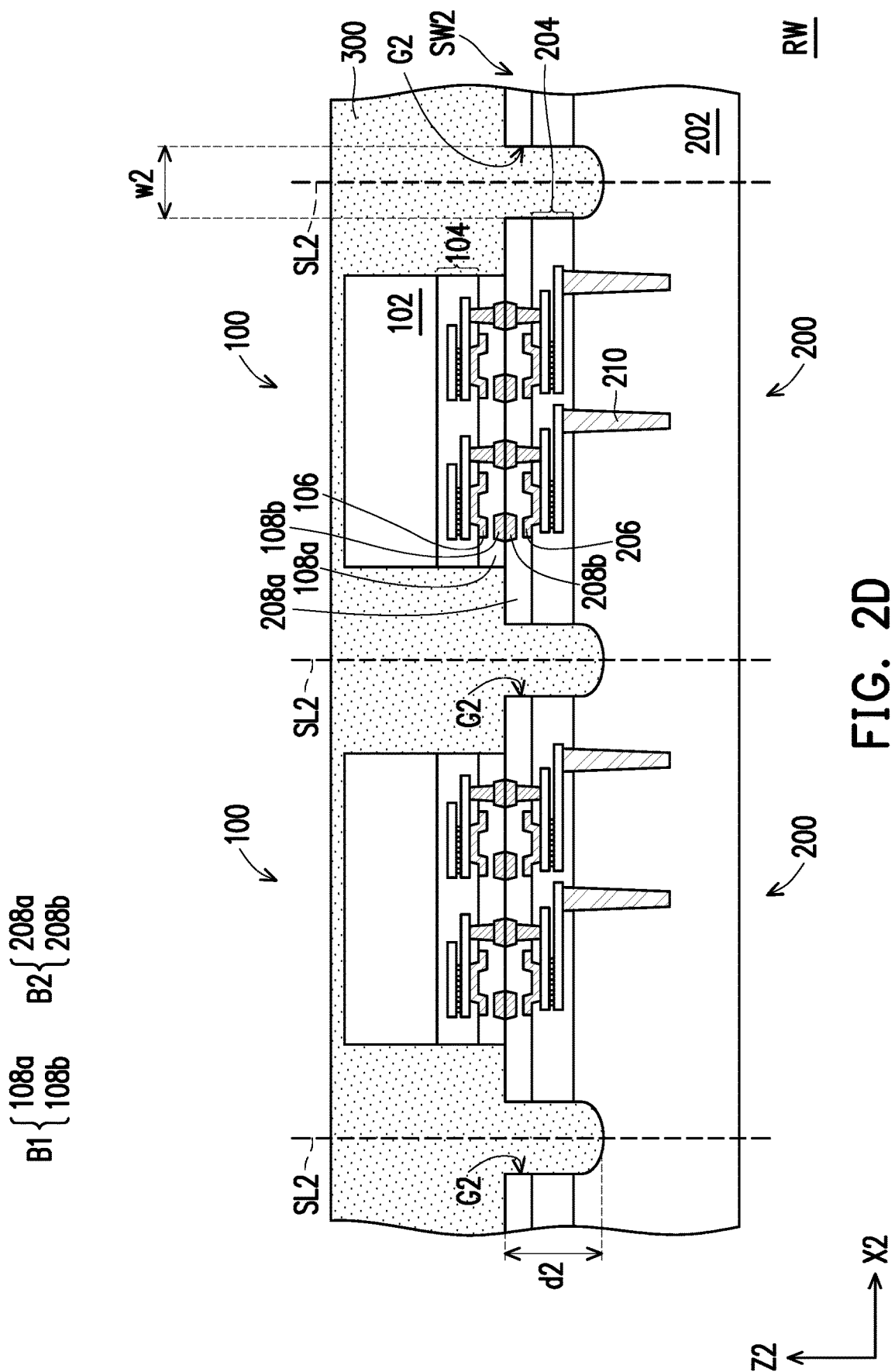

Referring to FIG. 2D, after performing the pre-cut process S2, an insulating encapsulation 300 is formed over the semiconductor wafer SW2 to form a reconstructed wafer RW. In some embodiments, the insulating encapsulation 300 at least laterally encapsulates the top tier semiconductor dies 100. As shown in FIG. 2D, the insulating encapsulation 300 is formed to fill the gaps between any two adjacent top tier semiconductor dies 100 and wrap around the sidewalls of the top tier semiconductor dies 100. In some embodiments, the insulating encapsulation 300 may be referred to as "gap-fill material". In some embodiments, the insulating encapsulation 300 further extends and fills into the grooves G2 to cover the bottom tier semiconductor dies 200. Moreover, as shown in FIG. 2D, the top tier semiconductor dies 100 are not revealed from the illustrated top surface of the insulating encapsulation 300. That is to say, at the stage of FIG. 2D, the insulating encapsulation 300 fully cover the top tier semiconductor dies 100. In some embodiments, the method of forming the insulating encapsulation 300 may include the following steps: forming an insulating material over the semiconductor wafer SW2 through an over-molding process or a film deposition process, and then performing a grinding process to partially remove the insulating material and form the insulating encapsulation 300 with a high degree of planarity. In some embodiments, the over-molding process is a compression molding process, for example. In some embodiments, the film deposition process may include CVD, HDPCVD, PECVD, ALD, or combinations thereof. In some embodiments, the grinding process for partially removing the insulating material may include a mechanical grinding process, a CMP process, or combinations thereof. In some embodiments, the material of the insulating encapsulation 300 may include a molding compound, a molding underfill, a resin (such as epoxy resin), or the like. In some embodiments, the insulating encapsulation 300 may include a base material (e.g., a polymer, a resin or the like) and filler particles (e.g., silica, clay or the like) distributed in the base material.

Figure 2E:
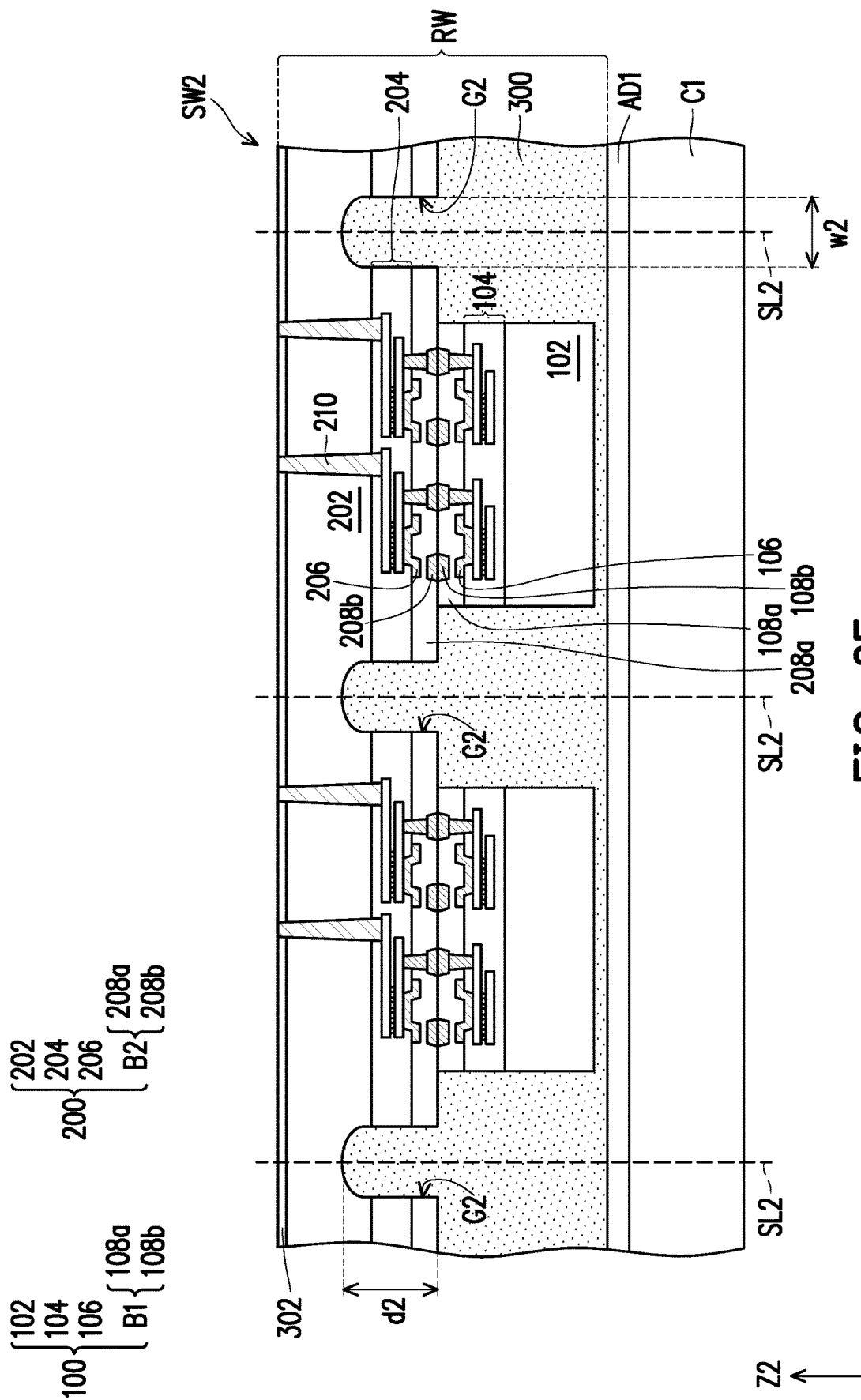

Referring to FIG. 2E, after the reconstructed wafer RW is formed, a carrier C is provided and bonded on the insulating encapsulation 300. In some embodiments, the carrier C is boned to the insulating encapsulation 300 through an adhesive layer AD1, as shown in FIG. 2E. In some embodiments, the adhesive layer AD1 may include a die attach film (DAF). However, the disclosure is not limited thereto. In some alternative embodiments, other materials may be adapted as the adhesive layer AD1 as long as the said materials are able to strengthen the adhesion between the carrier C and the insulating encapsulation 300. In certain embodiments, the carrier C is a glass carrier.

Continued on FIG. 2E, after the carrier C is bonded to the reconstructed wafer RW, the resulted structure is flipped (i.e., turned upside down). Subsequently, the reconstructed wafer RW is thinned down from the backside until the through semiconductor vias 210 are revealed through a thinning down process. As shown in FIG. 2E, during the thinning down process, the semiconductor substrates 202 are thinned down and over-removed slightly from the back surfaces (i.e., the illustrated top surfaces) to form a recess R revealing portions of the through semiconductor vias 210. In other words, the through semiconductor vias 210 are partially located in the recess R. From another point of view, portions of the through semiconductor vias 210 protrude from the thinned semiconductor substrates 202 of the semiconductor wafer SW2. That is to say, the illustrated top surfaces of the through semiconductor vias 210 are located at a level height higher than the illustrated top surfaces of the thinned semiconductor substrates 202. In some embodiments, the thinning down process for partially removing the semiconductor substrates 202 to from the recess R may include a planarization process, an etching process, combinations thereof or other suitable removal processes. The planarization process includes, for example, a mechanical grinding process and/or a CMP process. The etching process includes, for example, an isotropic etching process and/or an anisotropic etching process. In certain embodiments, the etching process is dry etching process. In some embodiments, the recess R is formed through an etching process after a planarization process is performed on the semiconductor substrates 202 and the through semiconductor vias 210 to obtain a substantially planar surface topography. However, the disclosure is not limited thereto. In some alternative embodiments, the recess R may be formed through a planarization process.

Figure 2F:
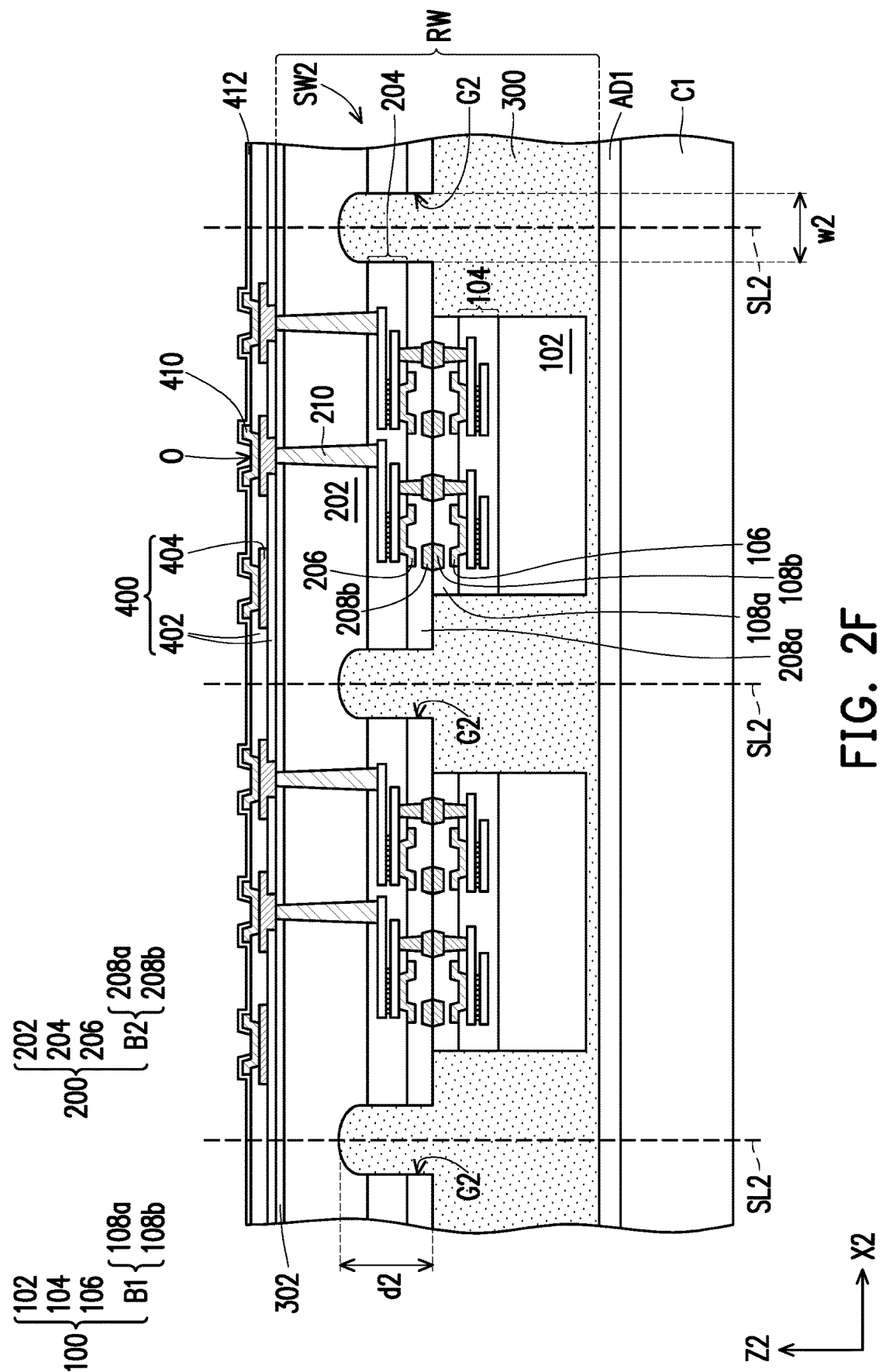

Continued on FIG. 2E, after the recess R is formed, an isolation layer 302 is formed to fill the recess R. As illustrated in FIG. 2E, the protruding portion of each through semiconductor via 210 is laterally encapsulated by the isolation layer 302. As shown in FIG. 2E, the illustrated top surfaces of the through semiconductor vias 210 are substantially flush or coplanar with the illustrated top surface of the isolation layer 302. In some embodiments, the through semiconductor vias 210 penetrate through the thinned semiconductor substrates 202 and the isolation layer 302 for dual-side connection (as shown in FIG. 2F). In some embodiments, the material of the isolation layer 302 includes polyimide (PI), PBO, BCB, a nitride such as silicon nitride ($SiN_x$, where x>0), an oxide such as silicon oxide ($SiO_x$, where x>0), PSG, BSG, BPSG, a combination thereof. In some embodiments, the isolation layer 302 may be formed by the following steps. First, a protection material layer (not shown) is formed in the recess R and over the through semiconductor vias 210. Subsequently, a grinding process is performed on the protection material layer until the through semiconductor vias 210 are revealed. In some embodiments, the grinding process for partially removing the protection material layer includes a mechanical grinding process, a CMP process, or combinations thereof.

Referring to FIG. 2F, a redistribution circuit structure 400 is formed on the isolation layer 302 and the through semiconductor vias 210. In some embodiments, as shown in FIG. 2F, the redistribution circuit structure 400 is formed on the illustrated top surfaces of the through semiconductor vias 210 and the isolation layer 302. From another point of view, the redistribution circuit structure 400 is formed on the backsides of the bottom tier semiconductor dies 200. In view of this, the redistribution circuit structure 400 may be referred as a back-side redistribution circuit structure, which provides a routing function for the top tier semiconductor dies 100 and the bottom tier semiconductor dies 200. In some embodiments, the redistribution circuit structure 400 is electrically connected with the bottom tier semiconductor dies 200 through the through semiconductor vias 210.

Furthermore, in some embodiments, the formation of the redistribution circuit structure 400 includes sequentially forming one or more dielectric layers 402, and one or more conductive layers 404 in alternation. In some embodiments, as shown in FIG. 2F, the illustrated top surface of the conductive layer 404 is exposed by the topmost layer of the dielectric layers 402 to connect conductive terminals 420 (described hereinafter), and the illustrated bottom surface of the conductive layer 404 is exposed by the lowest layer of the dielectric layers 402 to connect the through semiconductor vias 210 of the top tier semiconductor dies 100 and the. Although one conductive layer 404 and two dielectric layers 402 are illustrated herein, the scope of the disclosure is not limited by the embodiments of the disclosure. In some alternative embodiments, multiple dielectric layers 402 and multiple conductive layers 404 are sequentially formed in alternation, and the number of the dielectric layers 402 and the number of the conductive layers 404 may be adjusted based on product requirement. In such case, the multiple conductive layers 404 are sandwiched between the multiple dielectric layers 402, but the illustrated top surface of the topmost layer of the multiple conductive layers 404 is exposed by the topmost layer of the multiple dielectric layers 402 to connect the conductive terminals 420 (described hereinafter), and the lowest layer of the multiple conductive layers 404 is exposed by the lowest layer of the multiple dielectric layers 402 to connect the through semiconductor vias 210.

In some embodiments, the material of the dielectric layers 402 may include polyimide (PI), PBO, BCB, a nitride such as silicon nitride ($SiN_x$, where x>0), an oxide such as silicon oxide ($SiO_x$, where x>0), PSG, BSG, BPSG, a combination thereof or the like, which may be patterned using a photolithography and/or etching process. In some embodiments, the dielectric layers 402 may be formed by suitable fabrication techniques such as spin-on coating, CVD, HDPCVD, PECVD, atomic layer deposition (ALD) or the like. In some embodiments, the conductive layers 404 may be made of conductive materials formed by electroplating or deposition, such as aluminum, titanium, copper, nickel, tungsten, and/or alloys thereof. In certain embodiments, the conductive layer 404 may be formed by a damascene process. In certain embodiments, the conductive layer 404 may be formed by a bumping process. In some embodiments, the conductive layer 404 may be patterned copper layers or other suitable patterned metal layers.

After forming the redistribution circuit structure 400, conductive pads 410 are disposed on an exposed top surface of the conductive layer 404. As shown in FIG. 2F, the conductive pads 410 are formed on and electrically connected with the redistribution circuit structure 400. In some embodiments, the material of the conductive pads 410 may include aluminum, copper, nickel, titanium, tungsten, or alloys thereof or the like, and may be formed by an electroplating process, for example. In certain embodiments, the conductive pads 410 are, for example, under-ball metallurgy (UBM) patterns. The number of conductive pads 410 are not limited in this disclosure, and may be selected based on the design layout. In some alternative embodiments, the conductive pads 410 may be omitted. In such case, the conductive terminals 420 (described hereinafter) formed in subsequent steps may be directly disposed on the redistribution circuit structure 400.

Subsequently, an insulating layer 412 is formed on the redistribution circuit structure 400 and the conductive pads 410. As shown in FIG. 2F, the insulating layer 412 is formed with openings O exposing some of the underlying conductive pads 410. In some embodiments, the material of the insulating layer 412 may include PI, PBO, BCB, epoxy, silicon oxide ($SiO_x$, where x>0), silicon nitride ($SiN_x$, where x>0), or combinations thereof.

Figure 2G:
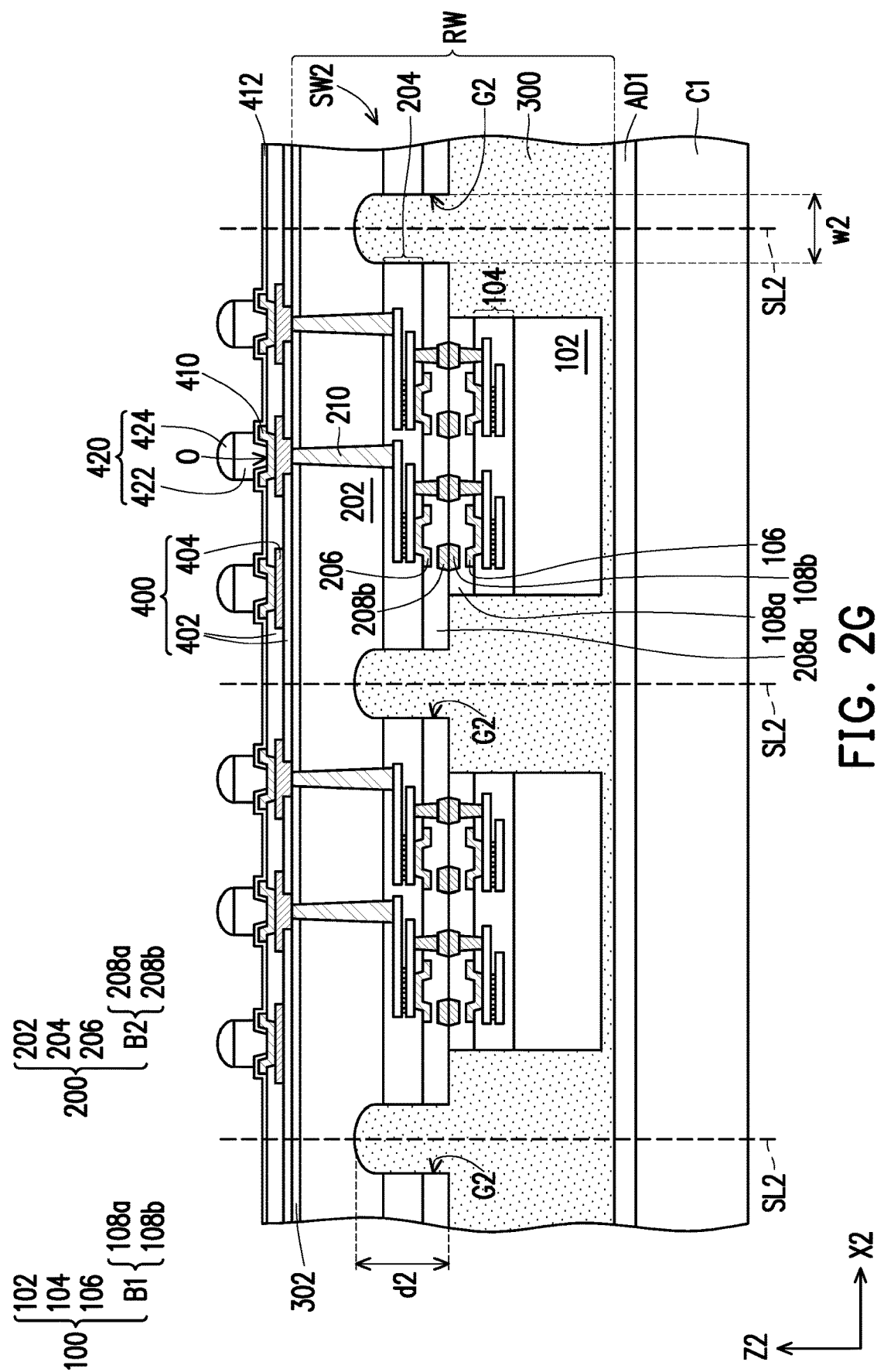

Referring to FIG. 2G, after forming the insulating layer 412, the conductive terminals 420 are formed in the openings O to contact the exposed conductive pads 410. In other word, the conductive pads 410 are electrically connected between the redistribution circuit structure 400 and the conductive terminals 420. From another point of view, the redistribution circuit structure 400 is located between the conductive terminals 420 and the semiconductor wafer SW2 of the reconstructed wafer RW. Furthermore, as mentioned above, the redistribution circuit structure 400 is electrically connected with the bottom tier semiconductor dies 200 of the semiconductor wafer SW2, thereby the redistribution circuit structure 400 is electrically connected between the conductive terminals 420 and the bottom tier semiconductor dies 200. As such, the redistribution circuit structure 400 may be considered as a fine-pitch redistribution circuit structure. In some embodiments, the redistribution circuit structure 400 may have a fine pitch (e.g. ≤1.6 μm) due to multi-die stacking. Herein, a pitch is defined as a sum of a line width of the conductive patterns in the conductive layer and a space width between the conductive patterns in the conductive layer. In some embodiments, the redistribution circuit structure 400 may have a fine pitch having a line width of ≤0.8 μm and a space width of ≤0.8 μm. In some embodiments, the conductive terminals 420 are formed as conductive bumps. As shown in FIG. 2G, each conductive terminal 420 includes a metal post 422 and a glop 424 disposed on the metal post 422. In some embodiments, the material of the metal post 422 may include copper or copper alloys, and the material of the glop 424 may include solder. In some embodiments, as shown in FIG. 2G, the metal posts 422 are metal micro-pillars, such as copper micro-pillars. In such case, the conductive terminals 420 may be microbumps. From another point of view, the conductive terminals 420 may be copper pillar bumps (CPB). However, the disclosure is not limited thereto. In some alternative embodiments, the conductive terminals 420 may be solder bumps, controlled collapse chip connection (C4) bumps, ball grid array (BGA) bumps, electroless nickel-electroless palladium-immersion gold technique (ENEPIG) formed bumps, or other suitable conductive bumps. In some alternative embodiments, only the metal posts 422 are formed in the openings O1 and connected to the exposed conductive pads 410. In some embodiments, the method for forming the conductive terminals 420 may include one or more plating process (e.g., electroplating process or electroless plating process) and a reflow process, but the disclosure is not limited thereto. In some embodiments, the conductive terminals 420 are connected to the redistribution circuit structure 400 through the conductive pads 410. The number of the conductive terminals 420 is not limited to the disclosure, and may be designated and selected based on the number of the conductive pads 410.

Figure 2H:
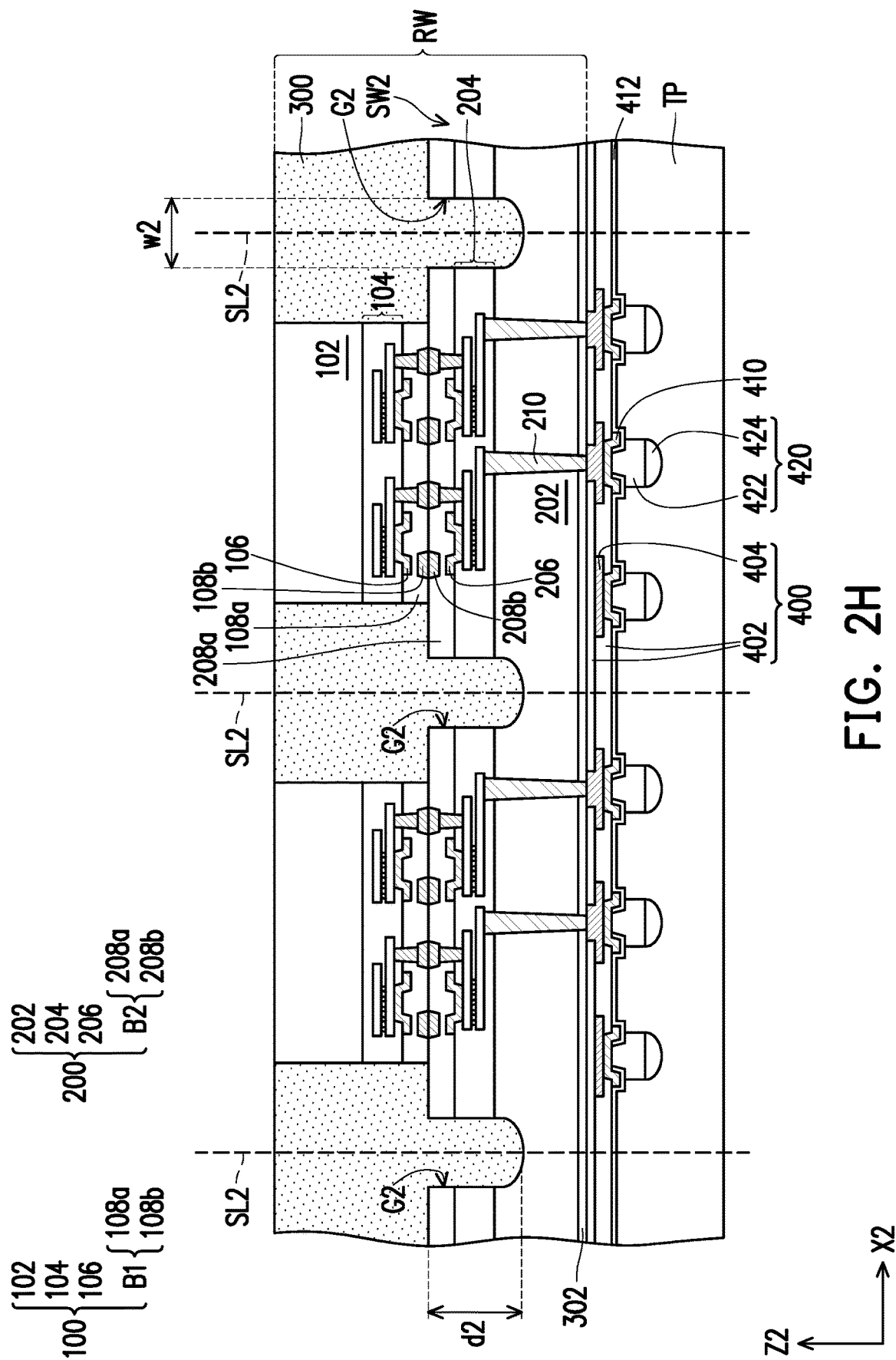
Figure 2I:
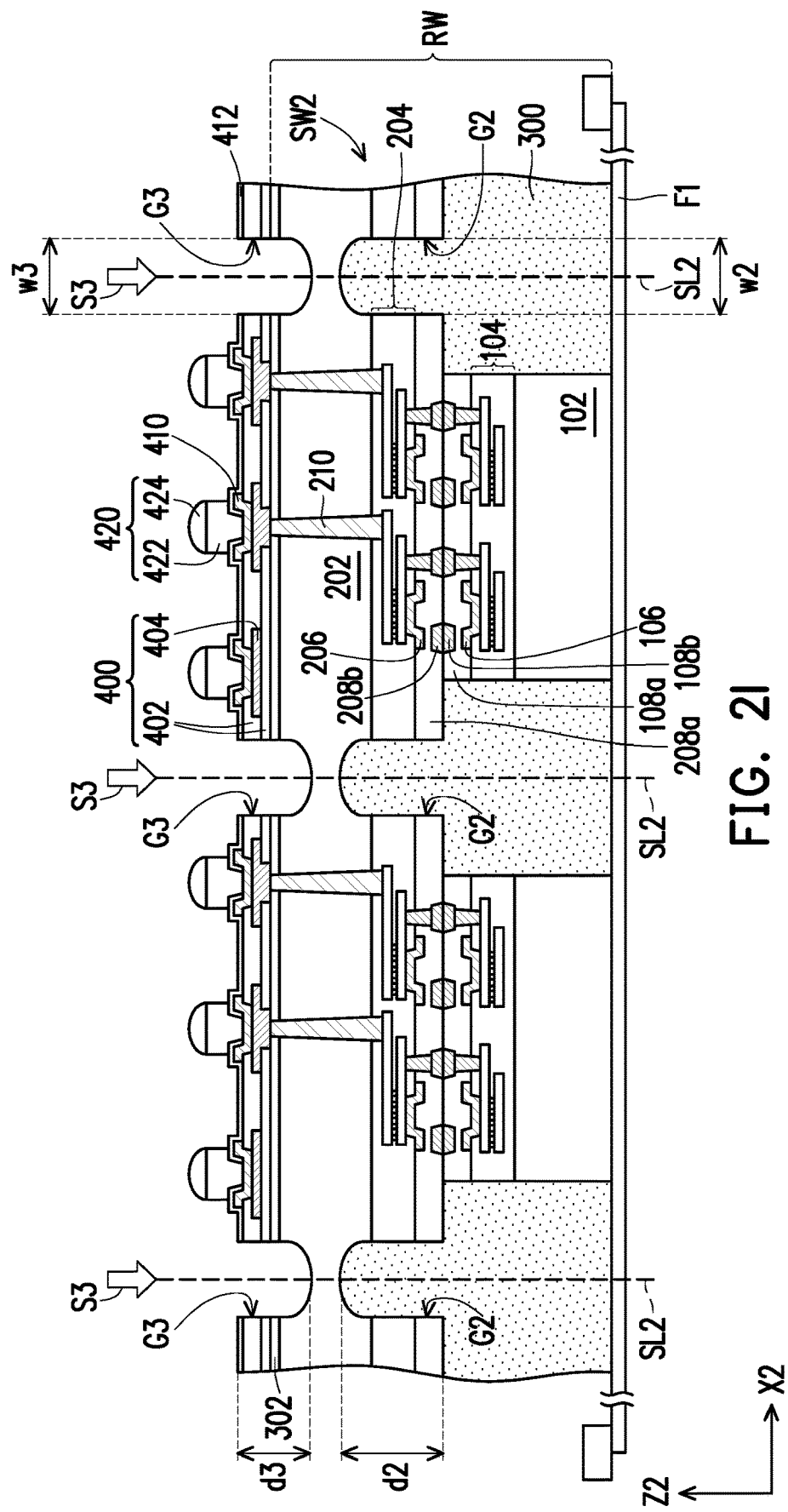

Referring to FIG. 2H, after forming the conductive terminals 420, the structure shown in FIG. 2G may be turned upside down and placed on a tape TP for further processing. As illustrated in FIG. 2H, the conductive terminals 420 and the insulating layer 412 contact the tape TP. Further, as illustrated in FIG. 2H, the carrier C is de-bonded and is separated from the insulating encapsulation 300. In some embodiments, the tape TP may be formed of a material which can secure the structure shown in FIG. 2G during the de-bonding process of the carrier C. Subsequently, after the de-bonding process, a grinding process is performed on the insulating encapsulation 300 until the back surfaces of the top tier semiconductor dies 100 are revealed. After performing the said grinding process, the top tier semiconductor dies 100 are laterally encapsulated by the insulating encapsulation 300 having reduced thickness. In some embodiments, the grinding process for partially removing the insulating encapsulation 300 may include a mechanical grinding process, a CMP process, or combinations thereof. In some embodiments, the tape TP may also be formed of a material which can secure the structure shown in FIG. 2G without the carrier C during the grinding process.

Referring to FIG. 2H and FIG. 2I, after the completion of the grinding process for revealing the top tier semiconductor dies 100, the tape TP is removed from the conductive terminals 420 and the insulating layer 412. In other words, the tape TP is detachable. Continued on FIG. 2I, the structure illustrated in FIG. 2H is mounted on a frame structure F1 for further processing. For example, a cleaning process may be performed to remove impurities or residues derived from the previous processes. Subsequently, a pre-cut process S3 is performed along the intersected scribe lines SL2 of the semiconductor wafer SW2 such that intersected grooves G3 are formed in the redistribution circuit structure 400. Since the redistribution circuit structure 400 is formed on the backside of the semiconductor wafer SW2 including the bottom tier semiconductor dies 200, the pre-cut process S3 is performed from the backside of the semiconductor wafer SW2. From another point of view, the pre-cut process S3 and the pre-cut process S2 are performed from the different sides of the semiconductor wafer SW2.

As shown in FIG. 2I, the grooves G3 may extend downwardly along the direction Z2 through the insulating layer 412 and the redistribution circuit structure 400, and portions of the semiconductor substrates 202 are revealed by the grooves G3. That is to say, the pre-cut process S3 cuts through the redistribution circuit structure 400 and over cuts into the semiconductor substrates 202. From another point of view, the pre-cut process S3 is performed from the back surface of the semiconductor wafer SW2 to cut through the redistribution circuit structure 400. In some embodiments, the grooves G3 are formed through a non-contact cutting process performed along the intersected scribe lines SL2 of the semiconductor wafer SW2. For example, the grooves G3 are formed through a laser grooving process performed along the intersected scribe lines SL2 of the semiconductor wafer SW2. In some embodiments, as shown in FIG. 2I, the pre-cut process S3 cuts through the dielectric layers 402 of the redistribution circuit structure 400 without cutting the conductive layer 404 of the redistribution circuit structure 400. However, the disclosure is not limited thereto. In some alternative embodiments, the pre-cut process S3 may cut through the dielectric layers 402 and cut some portions of the conductive layer 404.

In some embodiments, the grooves G3 do not penetrate through the semiconductor wafer SW2. In the direction Z2, the maximum depth d3 of the grooves G3 may be designated based on the demand and/or design layout, as long as the grooves G3 are vertically spaced from the grooves G2 by the semiconductor substrates 202. For example, in certain embodiments, the maximum depth d3 of the grooves G3 may range from about 5 micrometers to about 50 micrometers. In other words, the maximum cutting depth of the pre-cut process S3 may range from about 5 micrometers to about 50 micrometers. Moreover, in the direction X2, the maximum lateral dimension w3 of the grooves G3 may be designated based on the demand and/or design layout. As shown in FIG. 2I, the maximum lateral dimension w3 of the grooves G3 is substantially the same as the maximum lateral dimension w2 of the grooves G2. However, the disclosure is not limited thereto. In some alternative embodiments, the maximum lateral dimension w3 of the grooves G3 is different from the maximum lateral dimension w2 of the grooves G2. For example, in certain embodiments, the maximum lateral dimension w3 of the grooves G3 ranges from about 40 micrometers to about 180 micrometers. In other words, the maximum cutting width of the pre-cut process S3 ranges from about 40 micrometers to about 180 micrometer. In addition, as shown in FIG. 2I, the illustrated bottom surface of each groove G3 has a substantially smooth curved contour. However, the disclosure is not limited thereto. In some alternative embodiments, the bottom surface of each groove G3 may has an irregular and uneven contour.

Figure 2J:
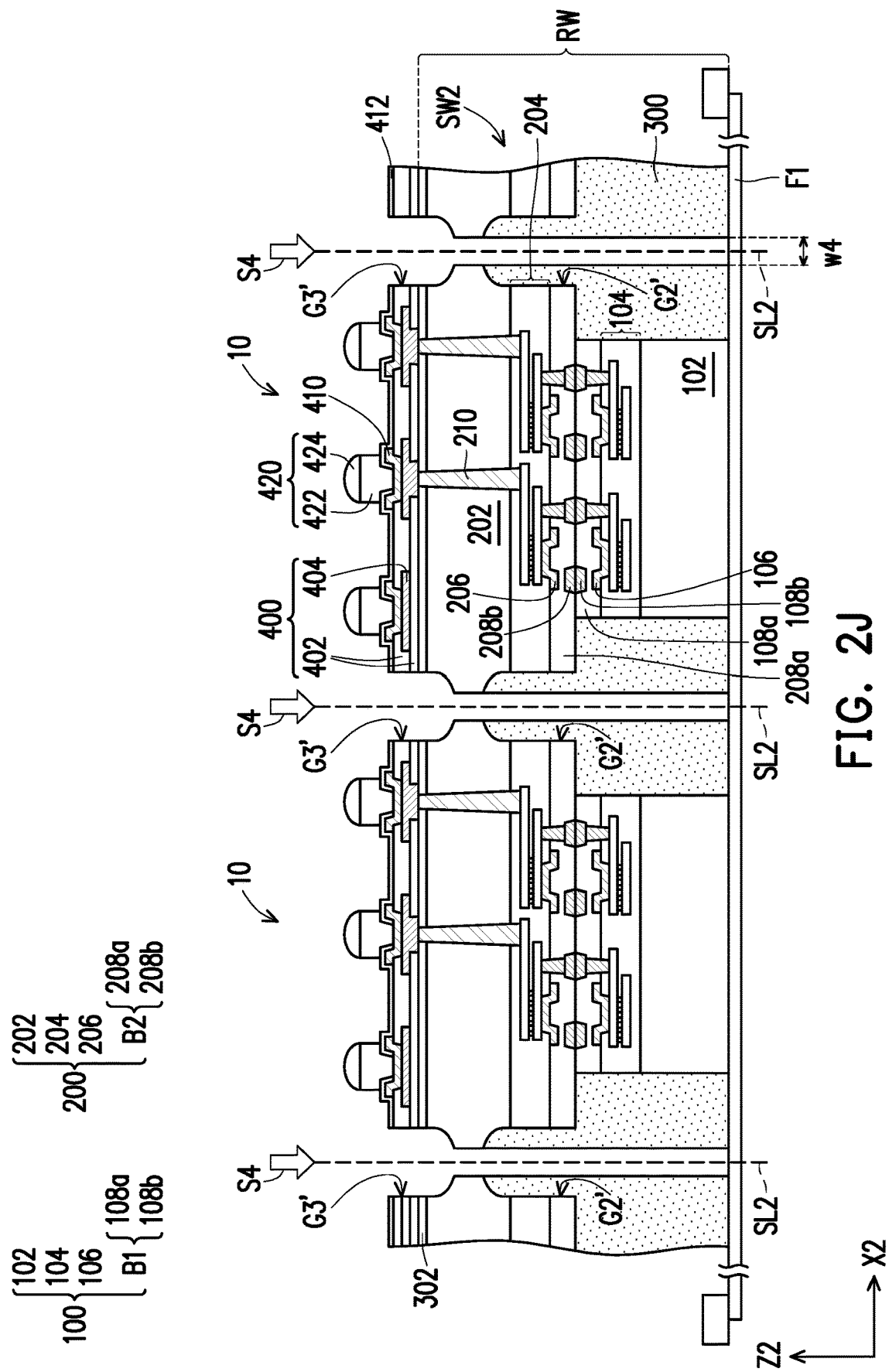

Referring to both FIG. 2I and FIG. 2J, after performing the pre-cut process S3, a wafer sawing process S4 is performed from the backside of the semiconductor wafer SW2 to saw the reconstructed wafer RW. That is to say, the wafer sawing process S4 and the pre-cut process S3 are performed from the same side of the semiconductor wafer SW2, i.e., the backside. In detail, as shown in FIG. 2J, the wafer sawing process S4 is performed along the grooves G3 or the intersected scribe lines SL2 of the semiconductor wafer SW2 to saw the semiconductor substrates 202 of the semiconductor wafer SW2 and the insulating encapsulation 300. In addition, referring to both FIG. 2I and FIG. 2J, the maximum lateral dimension w3 of the grooves G3 is wider than the maximum cutting width w4 of the wafer sawing process S4. In other words, the maximum cutting width of the pre-cut process S3 is wider than the maximum cutting width w4 of the wafer sawing process S4. In some embodiments, the pre-cut process S3 is a laser grooving process while the wafer sawing process S4 is a blade saw process, wherein the maximum cutting width of the pre-cut process S3 (e.g., the laser grooving process) is wider than the maximum cutting width of the wafer sawing process S4 (e.g., the blade saw process). Furthermore, as shown in FIG. 2J, the maximum lateral dimension w2 of the grooves G2 is wider than the maximum cutting width w4 of the wafer sawing process S4. In other words, the maximum cutting width of the pre-cut process S2 is wider than the maximum cutting width w4 of the wafer sawing process S4. In some embodiments, the pre-cut process S2 is a laser grooving process while the wafer sawing process S4 is a blade saw process, wherein the maximum cutting width of the pre-cut process S2 (e.g., the laser grooving process) is wider than the maximum cutting width of the wafer sawing process S4 (e.g., the blade saw process). The maximum cutting width w4 of the wafer sawing process S4 may be designated based on the demand and/or design layout, as long as the maximum cutting width w4 of the wafer sawing process S4 is smaller than the maximum lateral dimension w2 of the grooves G2 and the maximum lateral dimension w3 of the grooves G3. In certain embodiments, the maximum cutting width w4 of the wafer sawing process S4 may range from about 36 micrometers to about 176 micrometers.

Figure 2K:
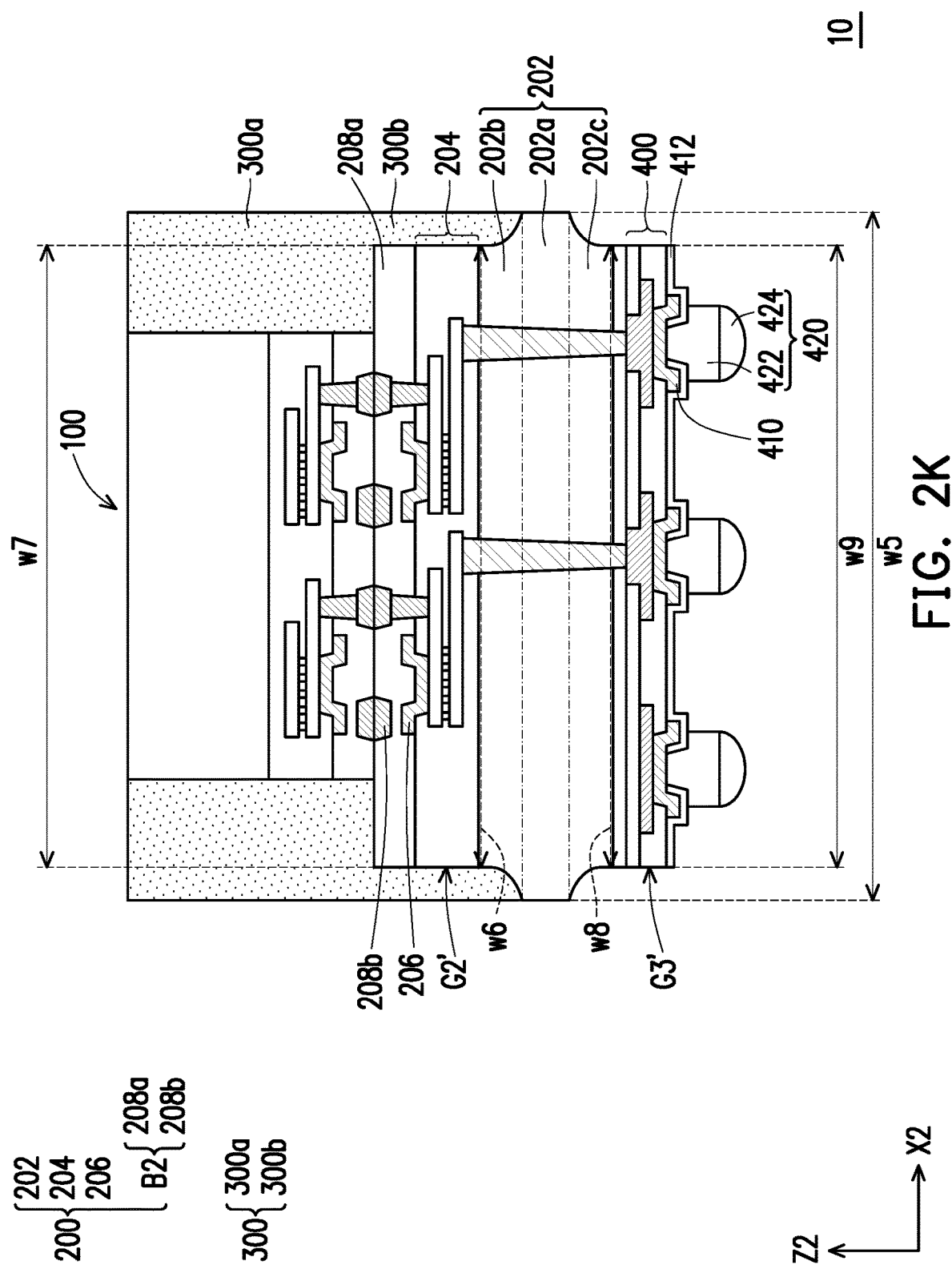

Referring to both FIG. 2J and FIG. 2K, after performing the wafer sawing process S4, singulated die stack structures 10 each having a ring-shaped groove G2' and a ring-shaped groove G3' are obtained. As illustrated in FIG. 2K, the singulated die stack structure 10 may include the singulated bottom tier semiconductor die 200, the singulated top tier semiconductor die 100 stacked over the singulated bottom tier semiconductor die 200, the insulating encapsulation 300, the redistribution circuit structure 400, the conductive pads 410, the insulating layer 412, and the conductive terminals 420. As illustrated in FIG. 2K, the semiconductor substrate 202 of the singulated bottom tier semiconductor die 200 may include a first portion 202a, a second portion 202b and a third portion 202c, wherein the second portion 202b is disposed on the first portion 202a, the first portion 202a is located between the second portion 202b and the third portion 202c. In some embodiments, as shown in FIG. 2K, the interconnect structure 204 of the singulated bottom tier semiconductor die 200 is disposed on the illustrated top surface of the second portion 202b, and along the direction X2, the lateral dimension w5 of the first portion 202a is greater than the lateral dimension w6 of the illustrated top surface of the second portion 202b, the lateral dimension w5 of the first portion 202a is greater than the lateral dimension w7 of the interconnect structure 204. Since the wafer sawing process S4 is performed to saw the semiconductor substrates 202 of the semiconductor wafer SW2, the lateral dimension w5 of the first portion 202a is determined by the maximum cutting width w4 of the wafer sawing process S4 (e.g., the blade saw process). Further, since the ring-shaped groove G2' is originated from the grooves G2, the lateral dimension of the second portion 202b and the lateral dimension w7 of the interconnect structure 204 are determined by the maximum cutting width of the pre-cut process S2 (i.e., the maximum lateral dimension w2 of the grooves G2 as shown in FIG. 2C). In detail, as shown in FIG. 2K, due to the ring-shaped groove G2', the second portion 202b may have a minimum lateral dimension at the illustrated top surface contacting the interconnect structure 204 and a maximum lateral dimension at the illustrated bottom surface contacting the first portion 202a. That is to say, in the singulated die stack structure 10, the lateral dimension w5 of the first portion 202a is greater than the minimum lateral dimension w6 of the second portion 202b.

In some embodiments, as shown in FIG. 2K, the redistribution circuit structure 400 is disposed over the illustrated bottom surface of the third portion 202c, and the lateral dimension w5 of the first portion 202a is greater than the lateral dimension w8 of the illustrated bottom surface of the third portion 202c, the lateral dimension w5 of the first portion 202a is greater than the lateral dimension w9 of the redistribution circuit structure 400. Since the ring-shaped groove G3' is originated from the grooves G3, the lateral dimension of the third portion 202c and the lateral dimension w9 of the redistribution circuit structure 400 are determined by the maximum cutting width of the pre-cut process S3 (i.e., the maximum lateral dimension w3 of the grooves G3 as shown in FIG. 2I). In detail, as shown in FIG. 2J, due to the ring-shaped groove G3', the third portion 202c may have a minimum lateral dimension at the illustrated bottom surface contacting the isolation layer 302 and a maximum lateral dimension at the illustrated top surface contacting the first portion 202a. That is to say, in the singulated die stack structure 10, the lateral dimension w5 of the first portion 202a is greater than the minimum lateral dimension w8 of the third portion 202c.

In the singulated die stack structure 10, as shown in FIG. 2K, the insulating encapsulation 300 covers sidewalls of the second portion 202b of the semiconductor substrate 202, and sidewalls of the insulating encapsulation 300 are substantially aligned with sidewalls of the first portion 202a of the semiconductor substrate 202. In some embodiments, as shown in FIG. 2K, the insulating encapsulation 300 may include a body portion 300a and a ring portion 300b, wherein the body portion 300a laterally encapsulates the top tier semiconductor die 100, and the ring portion 300b extends along sidewalls of the interconnect structure 204, sidewalls of the bonding structure B2 and the sidewalls of the second portion 202b. From another point of view, the ring portion 300b extends downwardly along the direction Z2 into the ring-shaped groove G2' from the bottom of the body portion 300a. Furthermore, the sidewalls of the interconnect structure 204 may be covered and protected by the ring portion 300b of the insulating encapsulation 300. The ring portion 300b laterally encapsulates the second portion 202b of the semiconductor substrate 202.

As mentioned above, since the maximum cutting width of the pre-cut process S2 (i.e. the maximum lateral dimension w2 of the grooves G2) is wider than the maximum cutting width w4 of the wafer sawing process S4, during the wafer sawing process S4, the interconnect structure 204 and the bonding structure B2 of each singulated bottom tier semiconductor die 200 can be spaced apart from the blade used in the wafer sawing process S4 by the insulating encapsulation 300 in the grooves G2. Accordingly, during the wafer sawing process S4, the interconnect structure 204 and the bonding structure B2 of each singulated bottom tier semiconductor die 200 are not be in contact with the blade used in the wafer sawing process S4, such that the interconnect structure 204 and the bonding structure B2 can be protected from delamination and being damaged.

Also, as mentioned above, since the maximum cutting width of the pre-cut process S3 (i.e. the maximum lateral dimension w3 of the grooves G3) is wider than the maximum cutting width w4 of the wafer sawing process S4, during the wafer sawing process S4, the redistribution circuit structure 400 and the insulating layer 412 of each singulated die stack structure 10 can be spaced apart from the blade used in the wafer sawing process S4 with a certain distance (i.e., a gap). Accordingly, during the wafer sawing process S4, the redistribution circuit structure 400 and the insulating layer 412 of each singulated die stack structure 10 are not be in contact with the blade used in the wafer sawing process S4, such that the redistribution circuit structure 400 and the insulating layer 412 can be protected from delamination and being damaged.

In the die stack structure 10 as shown in FIG. 2K, the top tier semiconductor die 100 is stacked on and electrically connected with the bottom tier semiconductor die 200 through hybrid bonding. That is to say, in the die stack structure 10, multiple dies are integrated into a compact form through direct bonding as well as hybrid bonding. As such, the die stack structure 10 may be considered as an integrated circuit (IC) die or a system-on-integrated-chip (SoIC) die.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the manufacturing method of the die stack structure 10 illustrated in FIG. 2A to FIG. 2K, the conductive terminals 420 are formed as conductive bumps, thereby the die stack structure 10 can be utilized in flip-chip applications. That is, the die stack structure 10 can be further bonded onto a substrate, such as a printed circuit board (PCB), an interposer, or the like, in a flip-chip manner. However, the disclosure is not limited thereto. In some alternative embodiments, the die stack structure can be further packaged in different package types or modules, such as integrated fan-out (InFO) package.

FIG. 3A to FIG. 3K are schematic cross-sectional views illustrating a process flow for fabricating a package structure in accordance with some alternative embodiments of the present disclosure. FIG. 4 is an enlarged cross-sectional view of the region A illustrated in FIG. 3K. The elements similar to or substantially the same as the elements described previously will use the same reference numbers, and certain details or descriptions (e.g. the materials, formation processes, positioning configurations, etc.) of the same or similar elements would not be repeated herein, and differences between the embodiments with reference to FIGS. 3A-3K and the embodiments described previously will be described below.

Figure 3A:
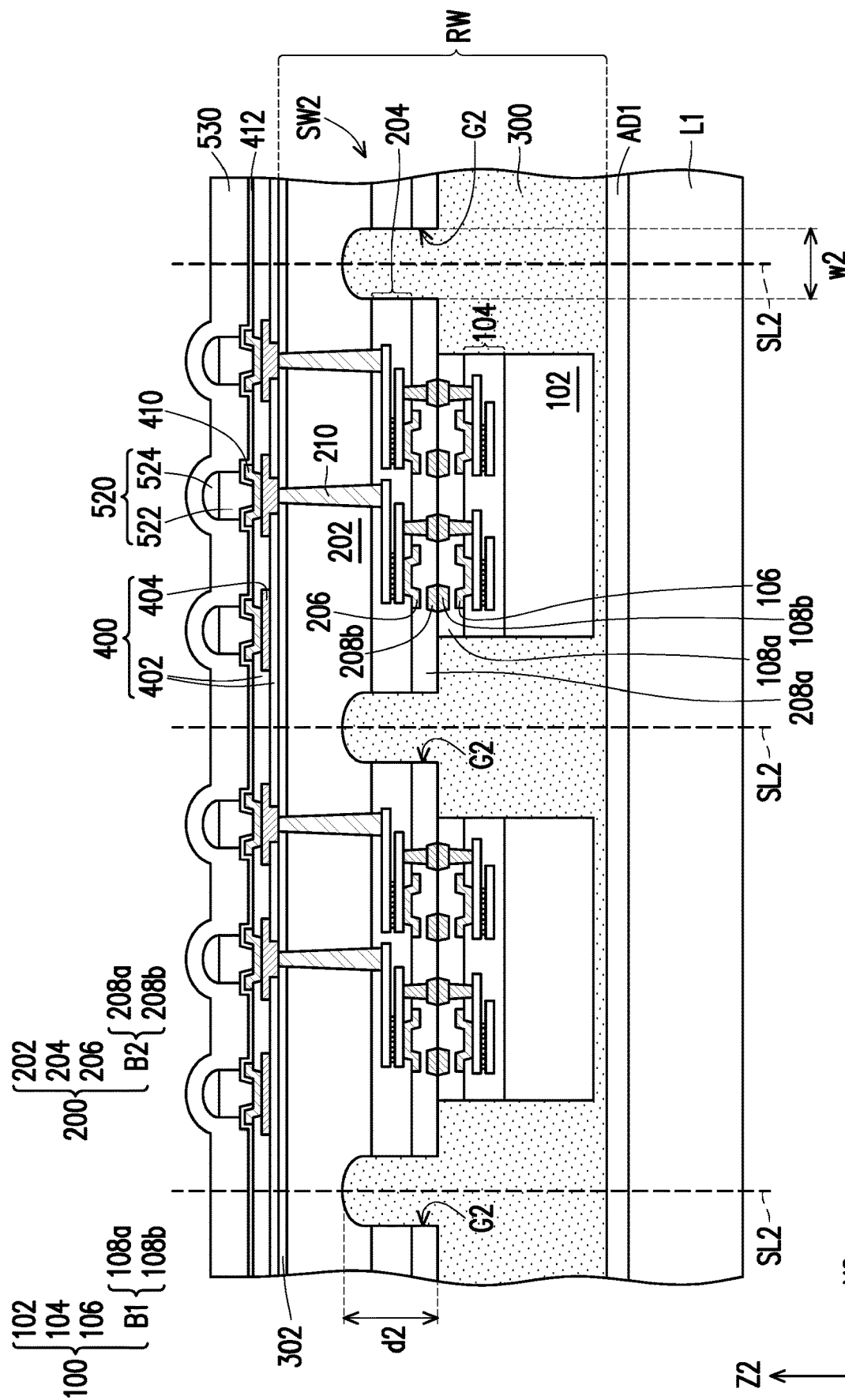
FIG. 3A to FIG. 3K are schematic cross-sectional views illustrating a process flow for fabricating a package structure in accordance with some alternative embodiments of the present disclosure.
Figure 4:
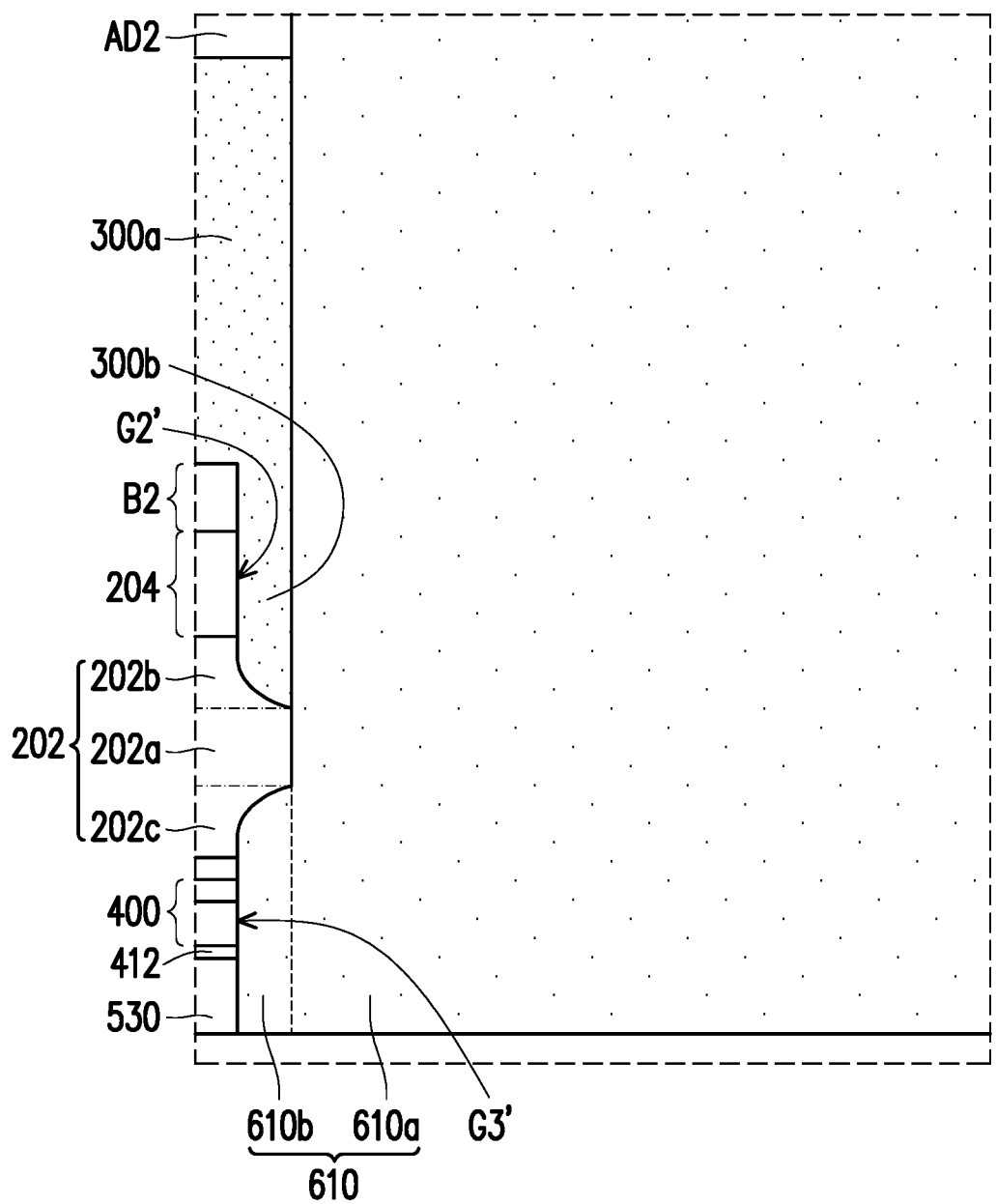
FIG. 4 is an enlarged cross-sectional view of the region A illustrated in FIG. 3K.

Referring to FIG. 3A, a structure same as the structure of FIG. 2F is provided. Details or descriptions (e.g. the materials, formation processes, positioning configurations, etc.) of the reconstructed wafer RW, the redistribution circuit structure 400, the conductive pads 410, the insulating layer 412, the carrier C and the adhesive layer AD1 have been described in conjunction with FIGS. 1A-1C and FIGS.

2A-2F above, and will not be iterated herein again. Accordingly, for details or descriptions of the reconstructed wafer RW, the redistribution circuit structure 400, the conductive pads 410, the insulating layer 412, the carrier C and the adhesive layer AD1 not iterated herein, please refer to the aforesaid embodiments.

Continued on FIG. 3A, after forming the insulating layer 412, the conductive terminals 520 are formed in the openings O to contact the exposed conductive pads 410. In other word, the conductive pads 410 are electrically connected between the redistribution circuit structure 400 and the conductive terminals 520. From another point of view, the redistribution circuit structure 400 is located between the conductive terminals 520 and the semiconductor wafer SW2 of the reconstructed wafer RW. Furthermore, as mentioned above, the redistribution circuit structure 400 is electrically connected with the bottom tier semiconductor dies 200 of the semiconductor wafer SW2, thereby the redistribution circuit structure 400 is electrically connected between the conductive terminals 520 and the bottom tier semiconductor dies 200. In some embodiments, the conductive terminals 520 are formed as through semiconductor vias. As shown in FIG. 3A, each conductive terminal 520 includes a metal post 522 and a glop 524 disposed on the metal post 522. However, the disclosure is not limited thereto. In some alternative embodiments, only the metal posts 522 are formed in the openings O1 and connected to the exposed conductive pads 410. In some embodiments, the material of the metal post 522 may include copper or copper alloys, and the material of the glop 524 may include solder. In some embodiments, as shown in FIG. 3A, the metal posts 522 are metal vias, such as copper vias. In some embodiments, the method for forming the conductive terminals 520 may include one or more plating process (e.g., electroplating process or electroless plating process) and a reflow process, but the disclosure is not limited thereto. In some embodiments, the conductive terminals 520 are connected to the redistribution circuit structure 400 through the conductive pads 410. The number of the conductive terminals 520 is not limited to the disclosure, and may be designated and selected based on the number of the conductive pads 410.

Subsequently, a dielectric layer 530 is formed over the redistribution circuit structure 400. As shown in FIG. 3A, the dielectric layer 530 is conformally formed over the reconstructed wafer RW to cover the conductive terminals 520 and the insulating layer 412. In detail, the dielectric layer 530 is in contact with sidewalls of the metal posts 522, doming-like top surfaces of the glops 524 and the illustrated top surface of the insulating layer 412. In some embodiments, the material of the dielectric layer 530 may include PI, PBO, BCB, or other suitable organic dielectric materials. In some embodiments, the dielectric layer 530 may be formed by suitable fabrication techniques such as spin-on coating, CVD, HDPCVD, PECVD, or other suitable film deposition processes.

Figure 3B:
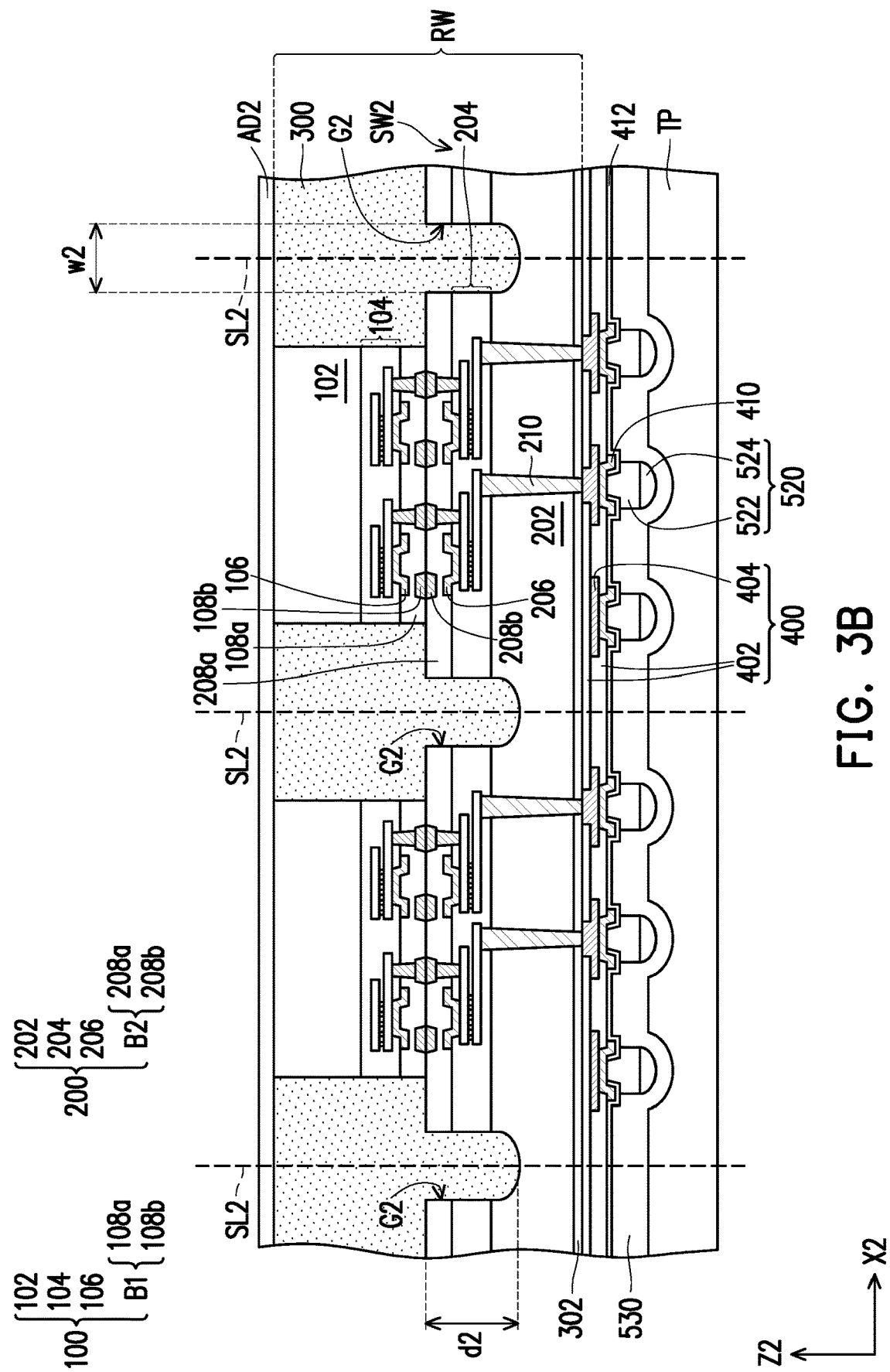

Referring to FIG. 3B, after forming the dielectric layer 530, the structure shown in FIG. 3A may be turned upside down and placed on a tape TP for further processing. As illustrated in FIG. 3B, the dielectric layer 530 contacts the tape TP. Further, as illustrated in FIG. 3B, the carrier C is de-bonded and is separated from the insulating encapsulation 300. In some embodiments, the tape TP may be formed of a material which can secure the structure shown in FIG. 3B during the de-bonding process of the carrier C. Subsequently, after the de-bonding process, a grinding process is performed on the insulating encapsulation 300 until the back surfaces of the top tier semiconductor dies 100 are revealed.

In some embodiments, the grinding process for partially removing the insulating encapsulation 300 may include a mechanical grinding process, a CMP process, or combinations thereof. In some embodiments, the tape TP may also be formed of a material which can secure the structure shown in FIG. 3B without the carrier C during the grinding process. Subsequently, after performing the grinding process of the reconstructed wafer RW, an adhesive layer AD2 is attached to the back surface of the reconstructed wafer RW. As shown in FIG. 3B, the adhesive layer AD2 is attached to the exposed surface of the top tier semiconductor dies 100. In some embodiments, the adhesive layer AD2 may include a die attach film (DAF), but the disclosure is not limited thereto.

Figure 3C:
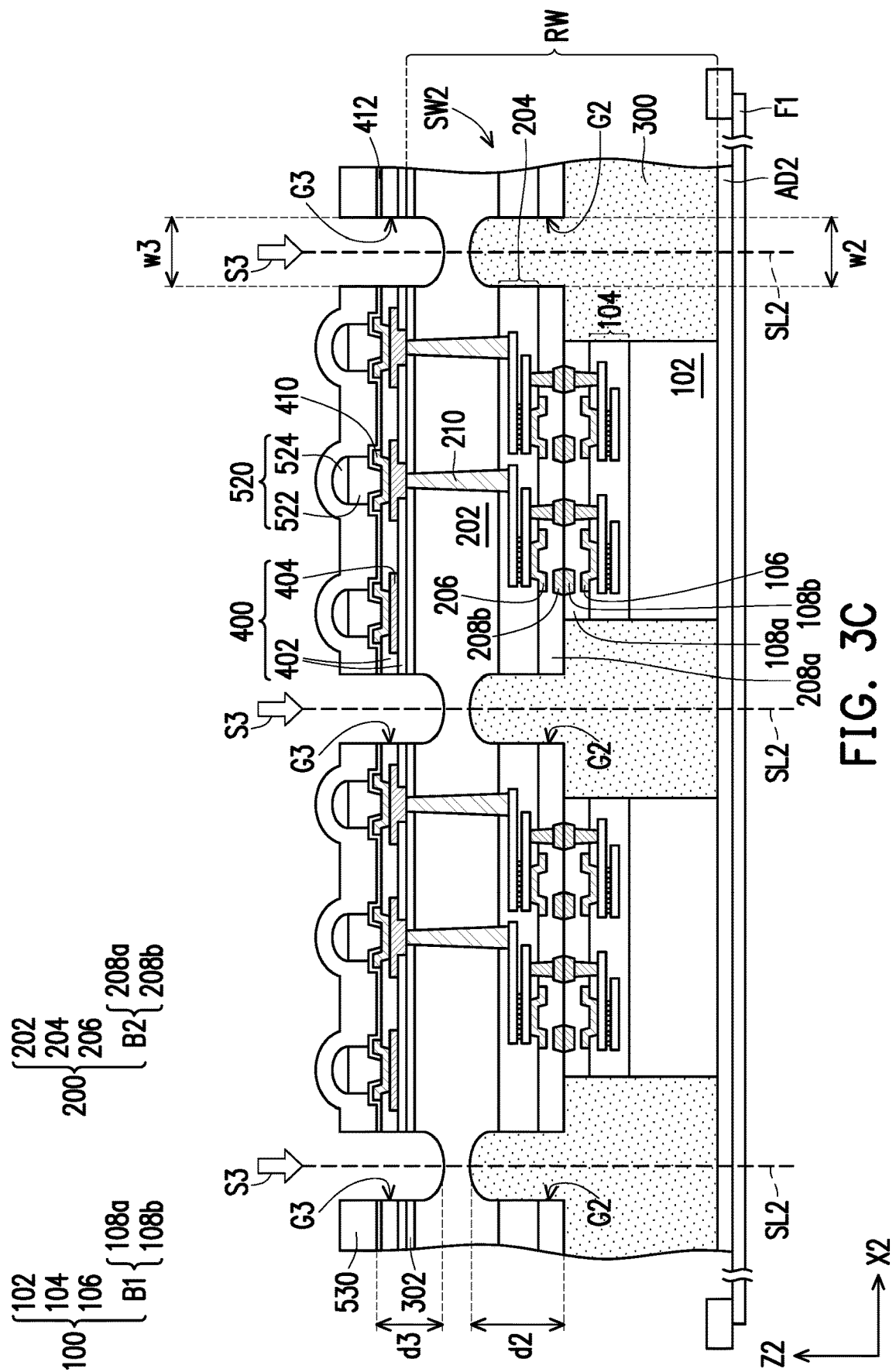

Referring to FIG. 3B and FIG. 3C, after forming the adhesive layer AD2, the tape TP is removed from the dielectric layer 530. Continued on FIG. 3C, the structure illustrated in FIG. 3B is mounted on a frame structure F1 for further processing. For example, a cleaning process may be performed to remove impurities or residues derived from the previous processes. Subsequently, a pre-cut process S3 is performed along the intersected scribe lines SL2 of the semiconductor wafer SW2 such that intersected grooves G3 are formed in the redistribution circuit structure 400. As shown in FIG. 3C, the grooves G3 may extend downwardly along the direction Z2 through the dielectric layer 530, the insulating layer 412 and the redistribution circuit structure 400, and portions of the semiconductor substrates 202 are revealed by the grooves G3. That is to say, the pre-cut process S3 cuts through the dielectric layer 530, the insulating layer 412 and the redistribution circuit structure 400, and over cuts into the semiconductor substrates 202. From another point of view, since the grooves G3 at the stage of FIG. 3C are defined by the dielectric layer 530, the insulating layer 412, the redistribution circuit structure 400, and the semiconductor substrates 202, the maximum depth d3 of the grooves G3 at the stage of FIG. 3C is greater than the maximum depth d3 of the grooves G3 at the stage of FIG. 2I. In certain embodiments, the maximum depth d3 of the grooves G3 at the stage of FIG. 3C may range from about 20 micrometers to about 70 micrometers. In other words, the maximum cutting depth of the pre-cut process S3 at the stage of FIG. 3C may range from about 20 micrometers to about 70 micrometers. Details or descriptions (e.g. the types, formation processes, positioning configurations, etc.) of the pre-cut process S3 and the grooves G3 have been described in conjunction with FIG. 2H above, and will not be iterated herein again. Accordingly, for details or descriptions of the pre-cut process S3 and the grooves G3 not iterated herein, please refer to the aforesaid embodiments.

Figure 3D:
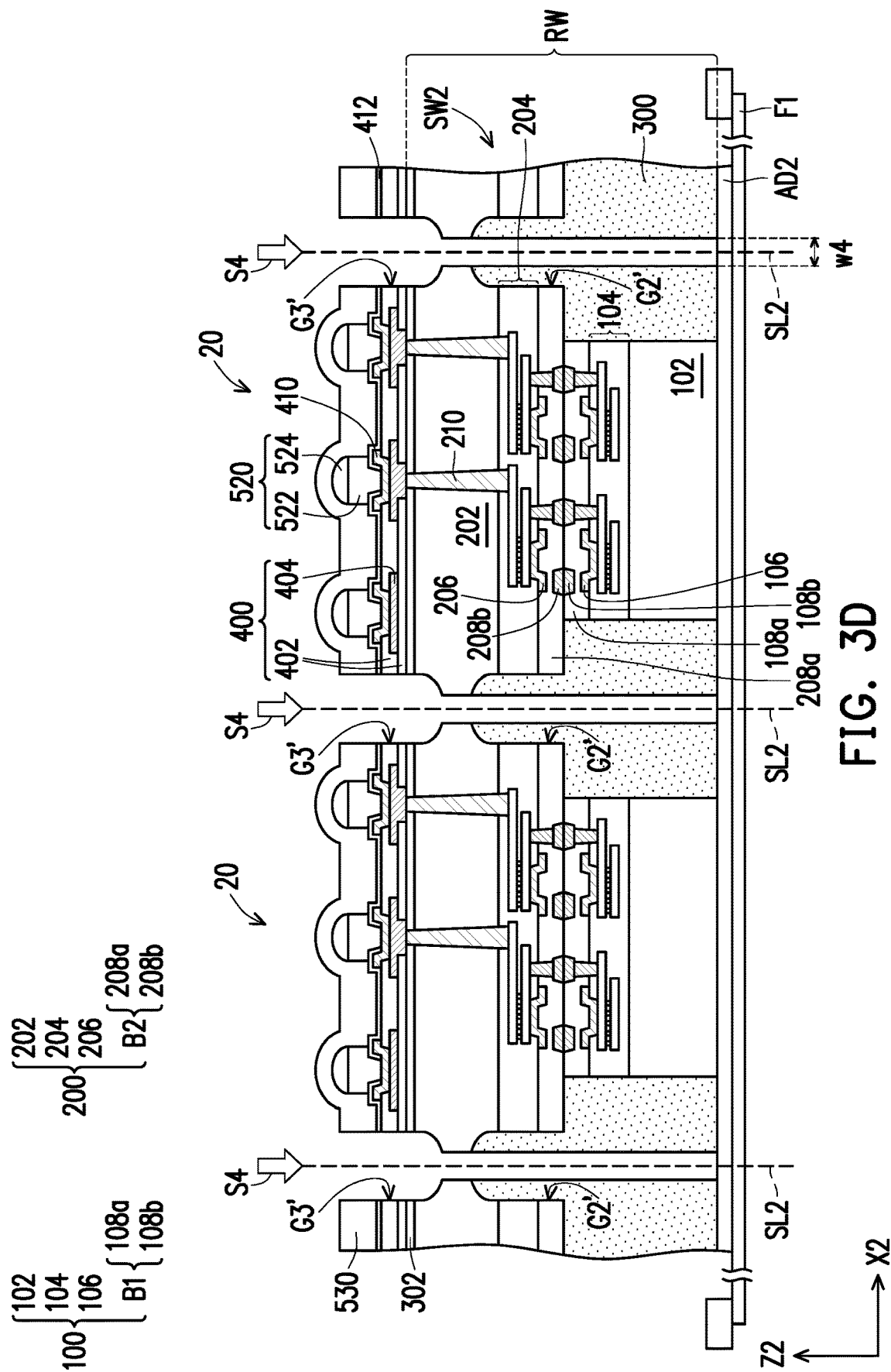

Referring to FIG. 3D, after performing the pre-cut process S3, a wafer sawing process S4 is performed from the back surface of the semiconductor wafer SW2 to saw the semiconductor substrates 202 of the semiconductor wafer SW2 and the insulating encapsulation 300. In detail, as shown in FIG. 3D, the wafer sawing process S4 is performed along the grooves G3 or the intersected scribe lines SL2 of the semiconductor wafer SW2 to obtain singulated die stack structures 20 each having a ring-shaped groove G2' and a ring-shaped groove G3'. Referring to both FIG. 3D and FIG. 2J, the die stack structure 20 is similar to the die stack structure 10, hence the same reference numerals are used to refer to the same or liked parts, and its detailed description will be omitted herein. Further, referring to both FIG. 3D and FIG. 2J, the main difference between the die stack structure 20 and the die stack structure 10 lies in that: the conductive terminals 520 of the die stack structure 20 are used as through semiconductor vias while the conductive terminals 420 of the die stack structure 10 are used as conductive bumps. In view of this, the size of the conductive terminals 520 may be different from the size of the conductive terminals 420. Up to here, the die stack structure 20 of the exemplary embodiment may be fabricated.

Figure 3E:
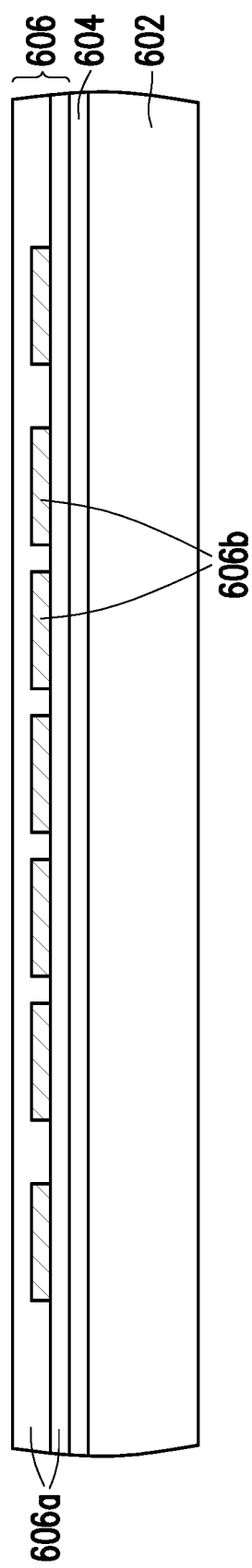

Referring to FIG. 3E, a carrier 602 is provided. In some embodiments, the carrier 602 may be a glass carrier or any suitable carrier for carrying a semiconductor wafer or a reconstituted wafer for the manufacturing method of the package structure. In some embodiments, the carrier 602 is coated with a debond layer 604. The material of the debond layer 604 may be any material suitable for bonding and de-bonding the carrier 602 from the above layer(s) or any wafer(s) disposed thereon. In some embodiments, the debond layer 604 may include a dielectric material layer made of a dielectric material including any suitable polymer-based dielectric material (such as BCB, PBO). In some alternative embodiments, the debond layer 604 may include a dielectric material layer made of an epoxy-based thermal-release material, which loses its adhesive property when heated, such as a light-to-heat-conversion (LTHC) release layer. In some alternative embodiments, the debond layer 604 may include a dielectric material layer made of an ultra-violet (UV) glue, which loses its adhesive property when exposed to UV lights. In certain embodiments, the debond layer 604 may be dispensed as a liquid and cured, or may be a laminate film laminated onto the carrier 602. The illustrated top surface of the debond layer 604, which is opposite to the illustrated bottom surface contacting the carrier 602, may be levelled and may have a high degree of coplanarity. In certain embodiments, the debond layer 604 is, for example, a LTHC release layer with good chemical resistance, and such layer enables room temperature de-bonding from the carrier 602 by applying laser irradiation, however the disclosure is not limited thereto.

In some alternative embodiments, a buffer layer (not shown) may be coated on the debond layer 604, where the debond layer 604 is sandwiched between the buffer layer and the carrier 602, and the top surface of the buffer layer may further provide a high degree of coplanarity. In some embodiments, the buffer layer may be a dielectric material layer. In some embodiments, the buffer layer may be a polymer layer which made of PI, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Continued on FIG. 3E, a redistribution circuit structure 606 is formed over the carrier 602. As shown in FIG. 3E, the redistribution circuit structure 606 is formed on the debond layer 604. In some embodiments, the formation of the redistribution circuit structure 606 includes sequentially forming one or more dielectric layers 606a and one or more conductive layers 606b in alternation. As shown in FIG. 3E, the redistribution circuit structure 606 includes two dielectric layers 606a and one conductive layer 606b, where the conductive layer 606b is sandwiched between the dielectric layers 606a. However, the disclosure is not limited thereto. The numbers of the dielectric layers 606a and the conductive layer 606b included in the redistribution circuit structure 606 is not limited thereto, and may be designated and selected based on the demand. For example, the numbers of the dielectric layer 606a and the conductive layer 606b may be one or more than one.

In certain embodiments, the material of the dielectric layers 606a may include PI, PBO, BCB, a nitride such as silicon nitride ($SiN_x$, where x>0), an oxide such as silicon oxide ($SiO_x$, where x>0), PSG, BSG, BPSG, a combination thereof or the like, which may be patterned using a photolithography and/or etching process. In some embodiments, the dielectric layers 606a may be formed by suitable fabrication techniques such as spin-on coating, CVD, HDPCVD, PECVD, ALD or the like. In some embodiments, the conductive layer 606b may be made of conductive materials formed by electroplating or deposition, such as aluminum, titanium, copper, nickel, tungsten, and/or alloys thereof. In certain embodiments, the conductive layer 606b may be formed by a damascene process. In certain embodiments, the conductive layer 606b may be formed by a bumping process. In some embodiments, the conductive layer 606b may be patterned copper layers or other suitable patterned metal layers.

Figure 3F:
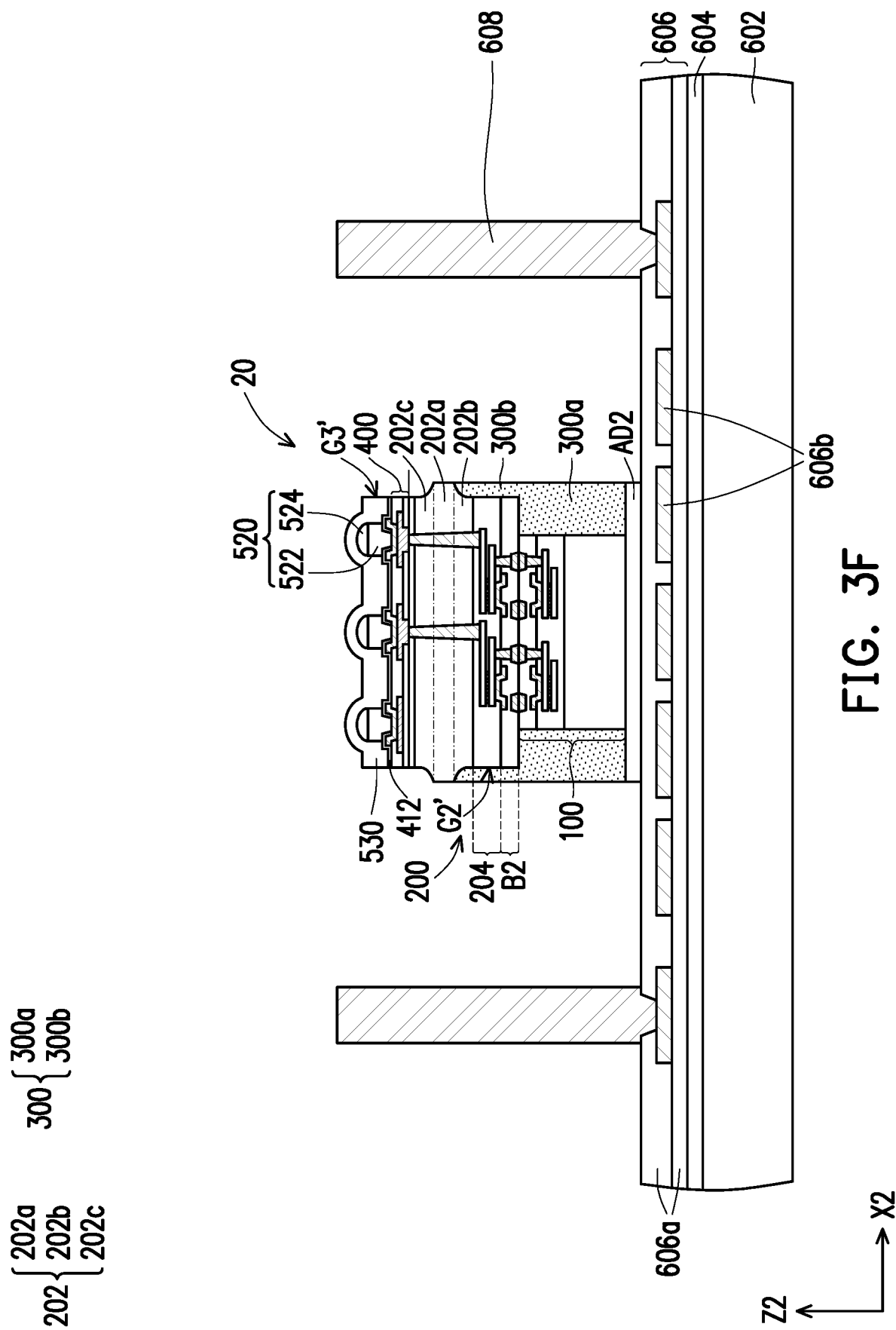

Referring to FIG. 3F, after forming the redistribution circuit structure 606, at least one die stack structure 20 described in conjunction with FIGS. 3A-3D, and a plurality of through insulator vias 608 are provided on the redistribution circuit structure 606 and over the carrier 602. In some embodiments, the through insulator vias 608 are through integrated fan-out ("InFO") vias. In one embodiment, the formation of the through insulator vias 608 includes forming a mask pattern (not shown) with openings, then forming a metallic material (not shown) filling up the openings by electroplating or deposition, and removing the mask pattern to form the through insulator vias 608 on the redistribution circuit structure 606. In certain embodiments, the through insulator vias 608 fills into via openings that reveals the conductive layer 606b of the redistribution circuit structure 606, so that the through insulator vias 608 may be electrically connected to the redistribution circuit structure 606. In some embodiments, the material of the mask pattern may include a positive photo-resist or a negative photo-resist. In one embodiment, the material of the through insulator vias 608 may include a metal material such as copper or copper alloys. The disclosure is not limited thereto.

In some alternative embodiments, the through insulator vias 608 may be formed by forming a seed layer (not shown) on the redistribution circuit structure 606; forming the mask pattern with openings exposing portions of the seed layer; forming the metallic material on the exposed portions of the seed layer to form the through insulator vias 608 by plating; removing the mask pattern; and then removing portions of the seed layer exposed by the through insulator vias 608. For example, the seed layer may be a titanium/copper composited layer. For simplification, only two through insulator vias 608 are illustrated in FIG. 3F. However, it should be noted that the number of the through insulator vias 608 is not limited thereto, and can be selected based on requirement.

Furthermore, in some embodiments, at least one die stack structure 20 is picked and placed on the redistribution circuit structure 606. In certain embodiments, the die stack structure 20 is attached to the redistribution circuit structure 606 through the adhesive layer AD2. In view of this, materials other than DAF may be adapted as the adhesive layer AD2 as long as the said materials are able to strengthen the adhesion between the die stack structure 20 and the redistribution circuit structure 606. However, the disclosure is not limited thereto. In some alternative embodiments, the die stack structure 20 may be attached to the redistribution circuit structure 606 through fusion bonding. In the exemplary embodiment, only one die stack structure 20 is illustrated. However, it should be noted that the number of the die stack structure 20 placed on the redistribution circuit structure 606 is not limited thereto, and this can be adjusted based on design requirement.

In some embodiments, when more than one die stack structure 20 are placed on the redistribution circuit structure 606, the die stack structures 20 may be arranged in an array, and when the die stack structures 20 are arranged in an array, the through insulator vias 608 may be classified into groups. The number of the die stack structures 20 may correspond to the number of groups of the through insulator vias 608. In the exemplary embodiment, the die stack structures 20 may be picked and placed on the redistribution circuit structure 606 after the formation of the through insulator vias 608. However, the disclosure is not limited thereto. In some alternative embodiments, the die stack structures 20 may be picked and placed on the redistribution circuit structure 606 before the formation of the through insulator vias 608.

Figure 3G:
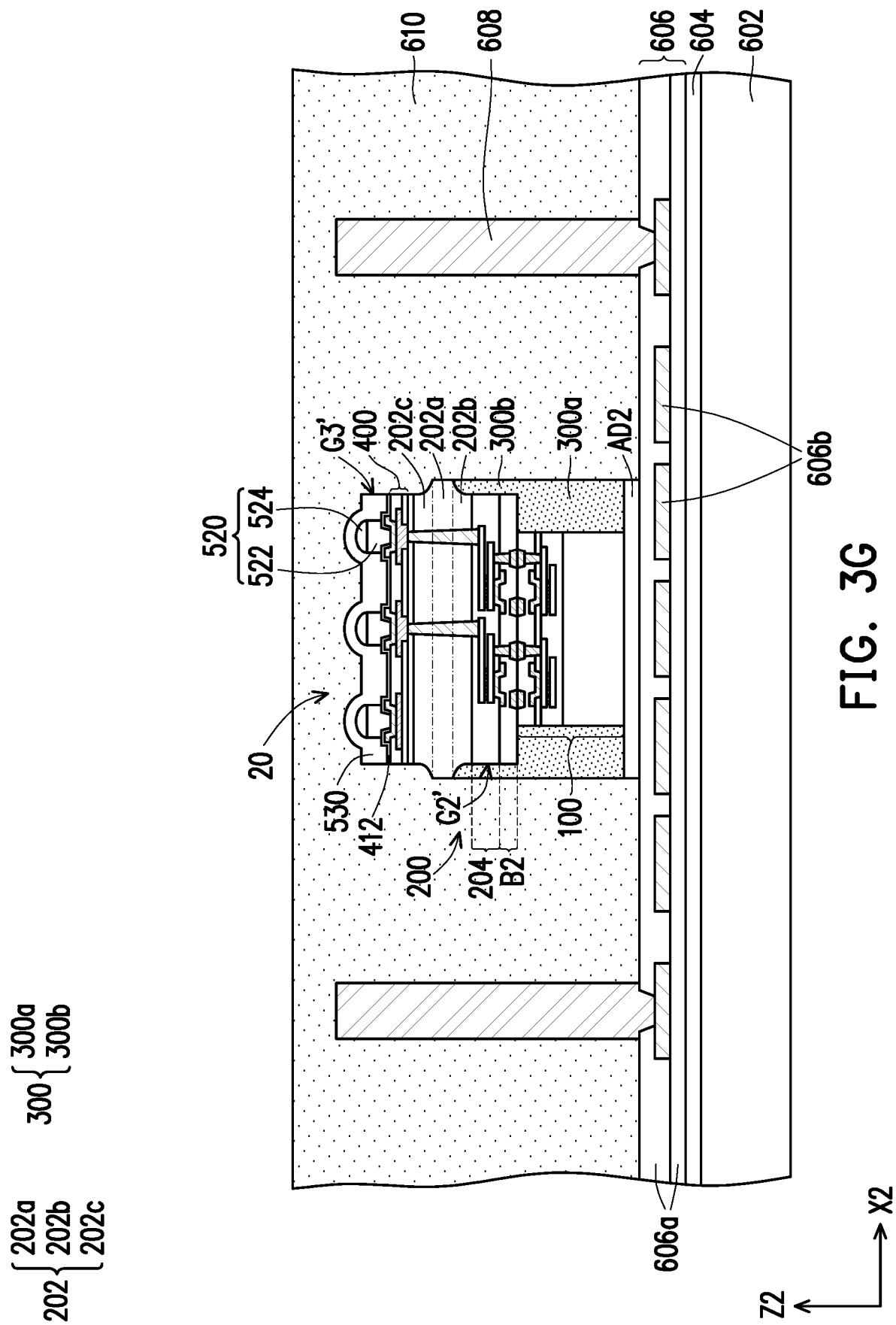

Referring to FIG. 3G, an insulating encapsulation 610 is formed on the redistribution circuit structure 606 and over the die stack structure 20 and the through insulator vias 608. As shown in FIG. 3G, the insulating encapsulation 610 is formed to fill the gaps between the die stack structure 20 and the through insulator vias 608 to encapsulate the die stack structure 20. The insulating encapsulation 610 also fills the gaps between adjacent through insulator vias 608 to encapsulate the through insulator vias 608. In some embodiments, the insulating encapsulation 610 may be referred to as "gap-fill material". Further, as shown in FIG. 3G, the die stack structure 20 is encapsulated by and well protected by the insulating encapsulation 610. In some embodiments, the insulating encapsulation 610 is formed through, for example, an over-molding process or a film deposition process. In some embodiments, the over-molding process is a compression molding process, for example. In some embodiments, the film deposition process may include CVD, HDPCVD, PECVD, ALD, or combinations thereof. In some embodiments, the insulating encapsulation 610 may include a molding compound, a molding underfill, a resin (such as epoxy resin), or the like. In some alternative embodiments, the insulating encapsulation 610 may include silicon oxide ($SiO_x$, where x>0), silicon oxynitride ($SiO_xN_y$, where x>0 and y>0), silicon nitride ($SiN_x$, where x>0), or other suitable dielectric material. In some embodiments, the insulating encapsulation 610 may include a base material (e.g., a polymer, a resin or the like) and filler particles (e.g., silica, clay or the like) distributed in the base material. The disclosure is not limited thereto. In one embodiment, the materials of the insulating encapsulation 300 and the insulating encapsulation 610 are the same. In an alternative embodiment, the material of the insulating encapsulation 610 is different from the material of the insulating encapsulation 300. In such case, the coefficient of thermal expansion (CTE) of the insulating encapsulation 610 may be different from that of the insulating encapsulation 300.

Figure 3H:
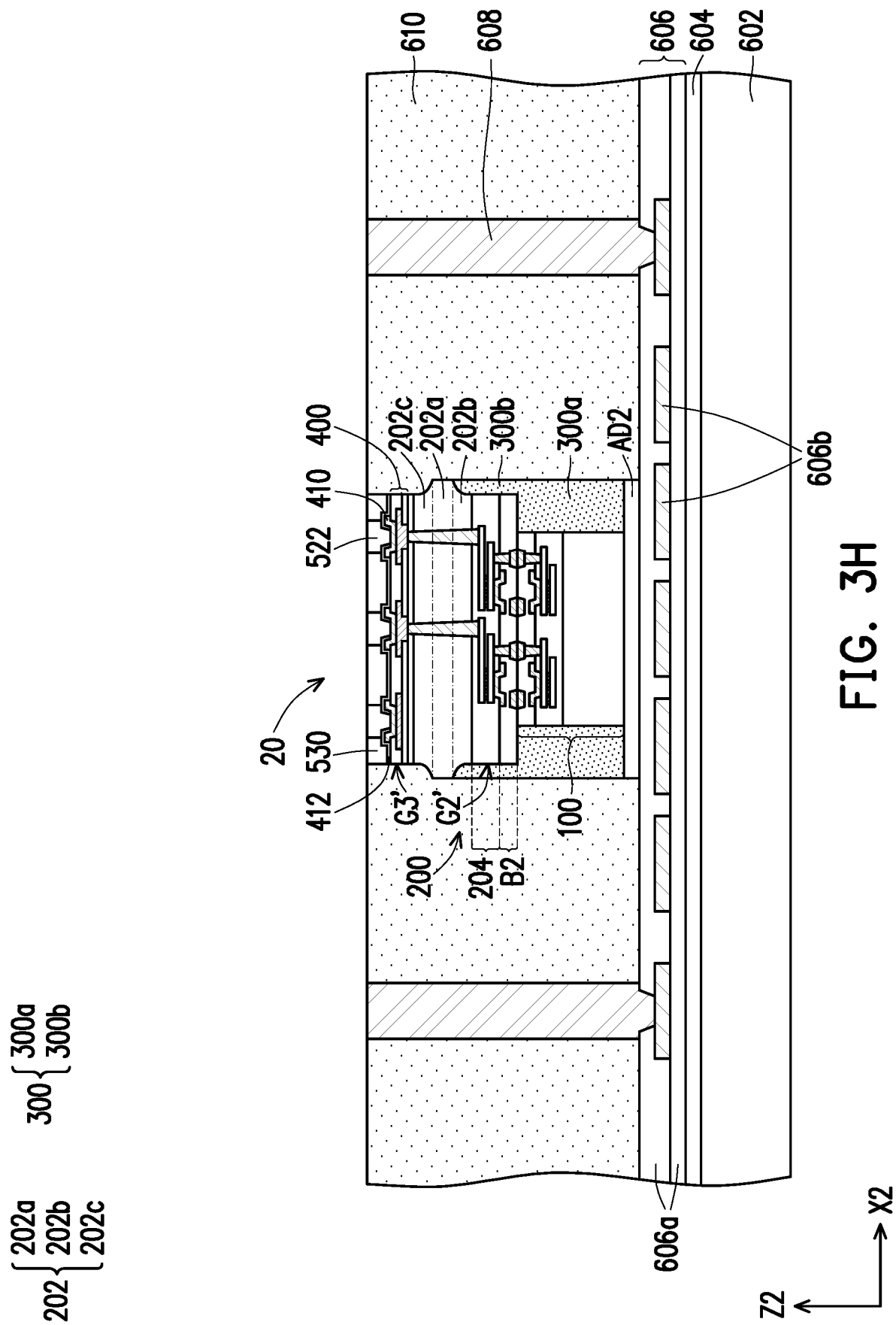

Referring to FIG. 3H, the insulating encapsulation 610 is partially removed to expose the through insulator vias 608, and the metal posts 522 of the die stack structure 20 through a grinding process. In detail, as shown in FIG. 3H, during the aforementioned grinding process, the dielectric layer 530 and the glops 524 are also ground until the metal posts 522 are revealed. In some embodiments, the metal posts 522 may be slightly ground or polished. Further, as shown in FIG. 2H, during the aforementioned grinding process, the through insulator vias 608 are also partially ground, such that the illustrated top surfaces of the through insulator vias 608 are levelled with the illustrated top surfaces of the metal posts 522. In some embodiments, after performing the said grinding process, the die stack structure 20 and the through insulator vias 608 are laterally encapsulated by the insulating encapsulation 610 having reduced thickness. As shown in FIG. 2H, after the said grinding process, the illustrated top surfaces of the through insulator vias 608, the illustrated top surfaces of the metal posts 522, the illustrated top surface of the dielectric layer 530 and the illustrated top surface of the insulating encapsulation 610 are substantially flush or coplanar with one another. In some embodiments, the grinding process for partially removing the insulating encapsulation 610 may include a mechanical grinding process, a CMP process, or combinations thereof. In some embodiments, after the grinding process, a cleaning step may be optionally performed. For example, the cleaning step is preformed to clean and remove the residue generated from the grinding process, and the planarization step may be performed through any other suitable methods.

Figure 3I:
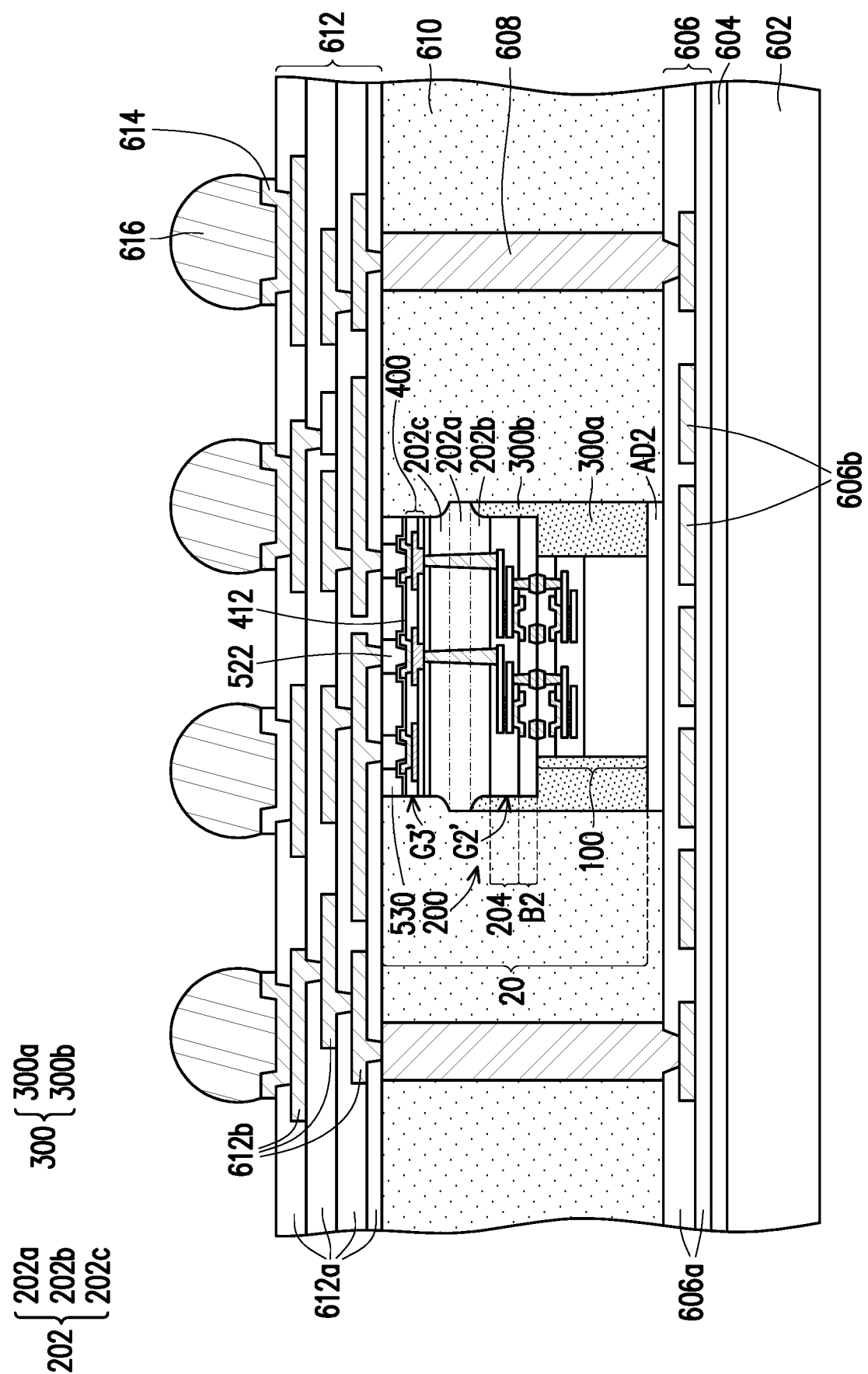

Referring to FIG. 3I, after the grinding process, a redistribution circuit structure 612 is formed on the insulating encapsulation 610, the through insulator vias 608 and on the die stack structure 20. As shown in FIG. 3I, the insulating encapsulation 610 is located between the redistribution circuit structure 612 and the redistribution circuit structure 606. In some embodiments, the redistribution circuit structure 606 may be referred as a back-side redistribution circuit structure, and the redistribution circuit structure 612 may be referred as a front-side redistribution circuit structure. In some embodiments, the redistribution circuit structure 612 is electrically connected with the through insulator vias 608, and is electrically connected with the bottom tier semiconductor die 200 and the top tier semiconductor die 100 through the metal posts 522. In some embodiments, the bottom tier semiconductor die 200 and the top tier semiconductor die 100 are electrically connected with the through insulator vias 608 through the redistribution circuit structure 612.

Furthermore, in some embodiments, the formation of the redistribution circuit structure 612 includes sequentially forming one or more dielectric layers 612a, and one or more conductive layers 612b in alternation. In certain embodiments, the conductive layers 612b are sandwiched between the dielectric layers 612a, but the illustrated top surface of the topmost layer of the conductive layers 612b is exposed by the topmost layer of the dielectric layers 612a to connect the conductive pads 614 (described hereinafter), and the lowest layer of the conductive layers 612b is exposed by the lowest layer of the dielectric layers 612a to connect the through insulator vias 608 and the metal posts 522. Although three layers of the conductive layers 612b and four layers of dielectric layers 612a are illustrated herein, the scope of the disclosure is not limited by the embodiments of the disclosure. In other embodiments, the number of the conductive layers 612b and the number of the dielectric layers 612a may be adjusted based on product requirement. In some embodiments, the material of the dielectric layer 612a of the redistribution circuit structure 612 is similar to the material of the dielectric layer 606a mentioned for the redistribution circuit structure 606, and the material of the conductive layer 612b of the redistribution circuit structure 612 is similar to the material of the conductive layer 606b mentioned for the redistribution circuit structure 606. Therefore, the detailed description of the dielectric layer 612a and the conductive layer 612b will be omitted herein.

Continued on FIG. 3I, after forming the redistribution circuit structure 612, a plurality of conductive pads 614 may be disposed on the exposed top surface of the topmost layer of the conductive layers 612b. In certain embodiments, the conductive pads 614 are for example, under-ball metallurgy (UBM) patterns used for ball mount. As shown in FIG. 3I, the conductive pads 614 are formed on and electrically connected with the redistribution circuit structure 612. In some embodiments, the material of the conductive pads 614 may include copper, nickel, titanium, tungsten, or alloys thereof or the like, and may be formed by plating process (e.g., electroplating process or electroless plating process). The number of conductive pads 614 are not limited in this disclosure, and may be selected based on the design layout. In some alternative embodiments, the conductive pads 614 may be omitted. In other words, conductive terminals 616 (described hereinafter) formed in subsequent steps may be directly disposed on the redistribution circuit structure 612.

After forming the conductive pads 614, a plurality of conductive terminals 616 may be disposed on the conductive pads 614 and over the redistribution circuit structure 612. In some embodiments, the conductive terminals 616 are attached to the conductive pads 614 through a solder flux (not shown). In some embodiments, the conductive terminals 616 are, for example, solder balls, or ball grid array (BGA) balls. However, the disclosure is not limited thereto. In some alternative embodiments, the conductive terminals 616 may be C4 bumps, ENEPIG formed bumps, or other suitable conductive bumps. In some embodiments, the conductive terminals 616 are made of a conductive material such as solder, copper, aluminum, gold, nickel, silver, palladium, tin, or a combination thereof. In some embodiments, the conductive terminals 616 may be formed by a suitable process such as evaporation, plating, ball drop, screen printing, a ball mounting process, a reflow process, or a combination thereof. In some embodiments, the conductive terminals 616 are connected to the redistribution circuit structure 612 through the conductive pads 614. In certain embodiments, some of the conductive terminals 616 may be electrically connected with the die stack structure 20 through the redistribution circuit structure 612. Furthermore, some of the conductive terminals 616 may be electrically connected with the through insulator vias 608 through the redistribution circuit structure 612. The number of the conductive terminals 616 is not limited to the disclosure, and may be designated and selected based on the number of the conductive pads 614.

Figure 3J:
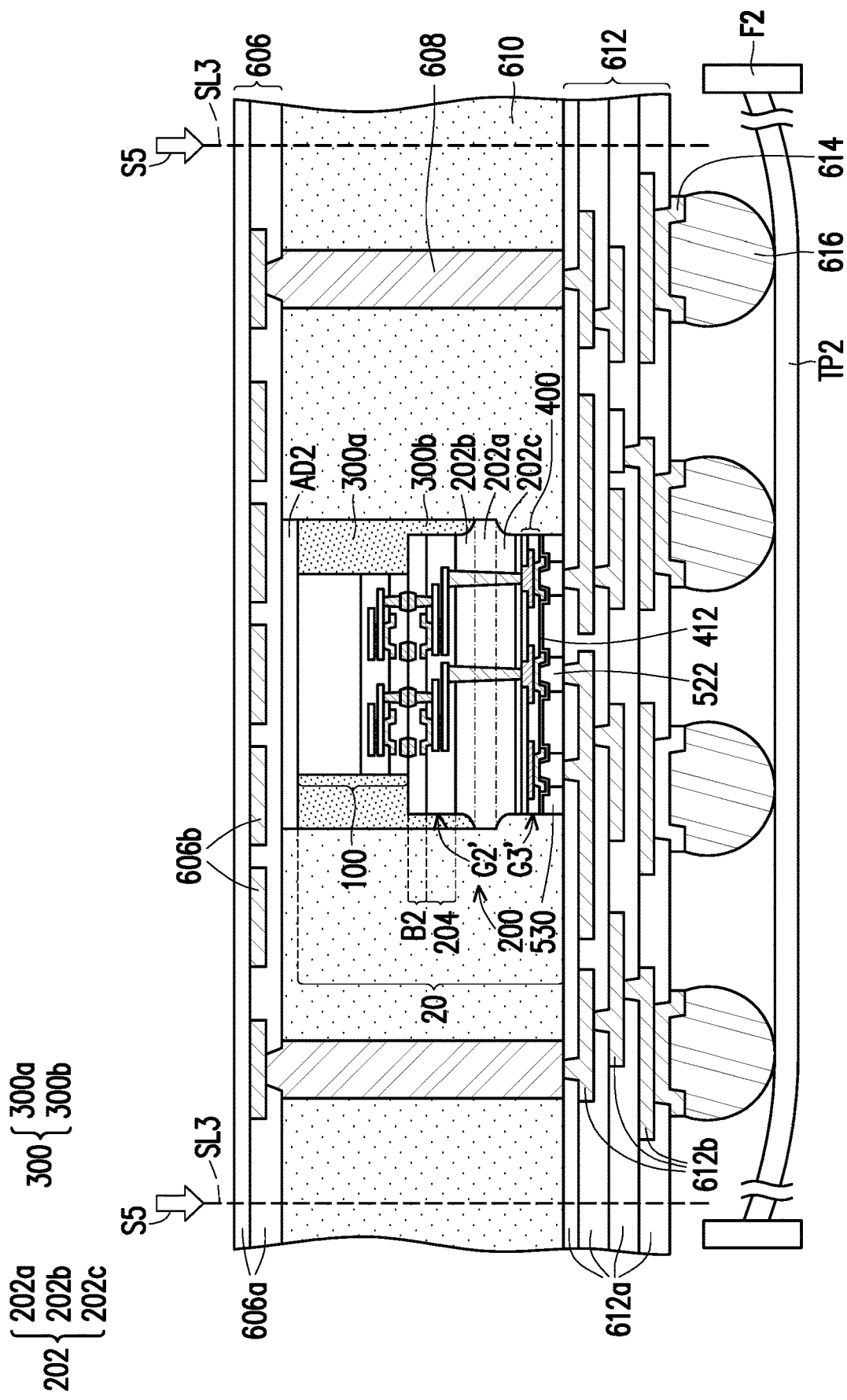

Referring to FIG. 3J, after forming the redistribution circuit structure 612 and placing the conductive terminals 616 thereon, the structure shown in FIG. 3I may be flipped (turned upside down) and attached to a tape TP2 (e.g., a dicing tape) supported by a frame F2. As illustrated in FIG. 3J, the carrier 602 is de-bonded and is separated from the redistribution circuit structure 606. In some embodiments, the de-bonding process includes projecting a light such as a laser light or an UV light on the debond layer 604 (e.g., the LTHC release layer) so that the carrier 602 can be easily removed along with the debond layer 604. During the de-bonding process, the tape TP2 is used to secure the package structure before de-bonding the carrier 602 and the debond layer 604. After the de-bonding process, a back surface (i.e., the illustrated top surface in FIG. 3J) of the redistribution circuit structure 606 is revealed or exposed.

Figure 3K:
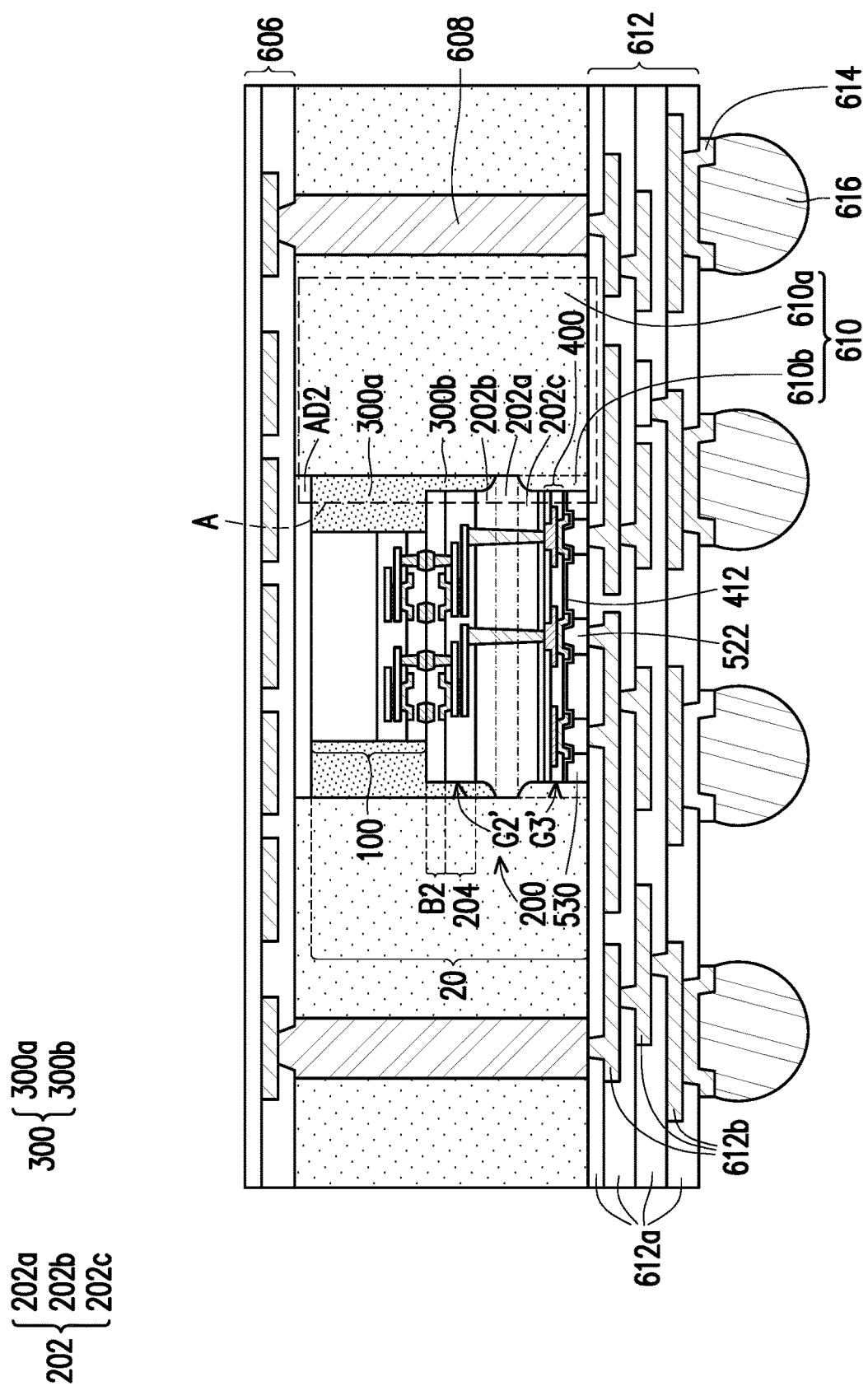

Referring to both FIG. 3J and FIG. 3K, after the de-bonding process, a wafer sawing process S5 is performed along intersected scribe lines SL3 to cut the whole wafer structure shown in FIG. 3J (i.e., cutting through the insulating encapsulation 610, the redistribution circuit structures 606 and 612) into a plurality of package structures 30. The package structures 30 are referred to as integrated fan-out (InFO) packages. In the exemplary embodiment, the wafer sawing process S5 may be a blade saw process or a laser cutting process. In a subsequent process, the separated package structures 50 may, for example, be disposed onto a circuit substrate or onto other components based on requirements.

Referring to both FIG. 3K and FIG. 4, the insulating encapsulation 610 laterally encapsulates the insulating encapsulation 300, the first portion 202a of the semiconductor substrate 202, the third portion 202c of the semiconductor substrate 202, the redistribution circuit structure 400, the insulating layer 412 and the dielectric layer 530. In detail, as shown in FIG. 3K and FIG. 4, the insulating encapsulation 610 may include a body portion 610a and a ring portion 610b, wherein the body portion 610a laterally encapsulates the insulating encapsulation 300, the first portion 202a and the ring portion 610b, and the ring portion 610b laterally extends from inner sidewalls of the body portion 610a to fills the ring-shaped groove G3'. In some embodiments, the ring portion 610b of the insulating encapsulation 610 may fill up the ring-shaped groove G3', such that the third portion 202c, the redistribution circuit structure 400, the insulating layer 412 and the dielectric layer 530 are in contact with and surrounded by the insulating encapsulation 610. In other words, sidewalls of the third portion 202c, the redistribution circuit structure 400, the insulating layer 412 and the dielectric layer 530 are covered and protected by the ring portion 610b of the insulating encapsulation 610. As mentioned above, since the ring portion 300b of the insulating encapsulation 300 extends into the ring-shaped groove G2', the interconnect structure 204, the bonding structure B2 and the second portion 202b of the bottom tier semiconductor die 200 are spaced apart from the insulating encapsulation 610 by the ring portion 300a of the insulating encapsulation 300.

As illustrated in FIG. 4, in the singulated package structures 30, the interconnect structure 204, the bonding structure B2, and the redistribution circuit structure 400 are not simultaneously in contact with the insulating encapsulation 300 and the insulating encapsulation 610, thereby even the insulating encapsulation 300 and the insulating encapsulation 610 have different CTE, the interconnect structure 204, the bonding structure B2, and the redistribution circuit structure 400 can suffer less stress. As such, the reliability of the package structure 30 can be improved.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 5:
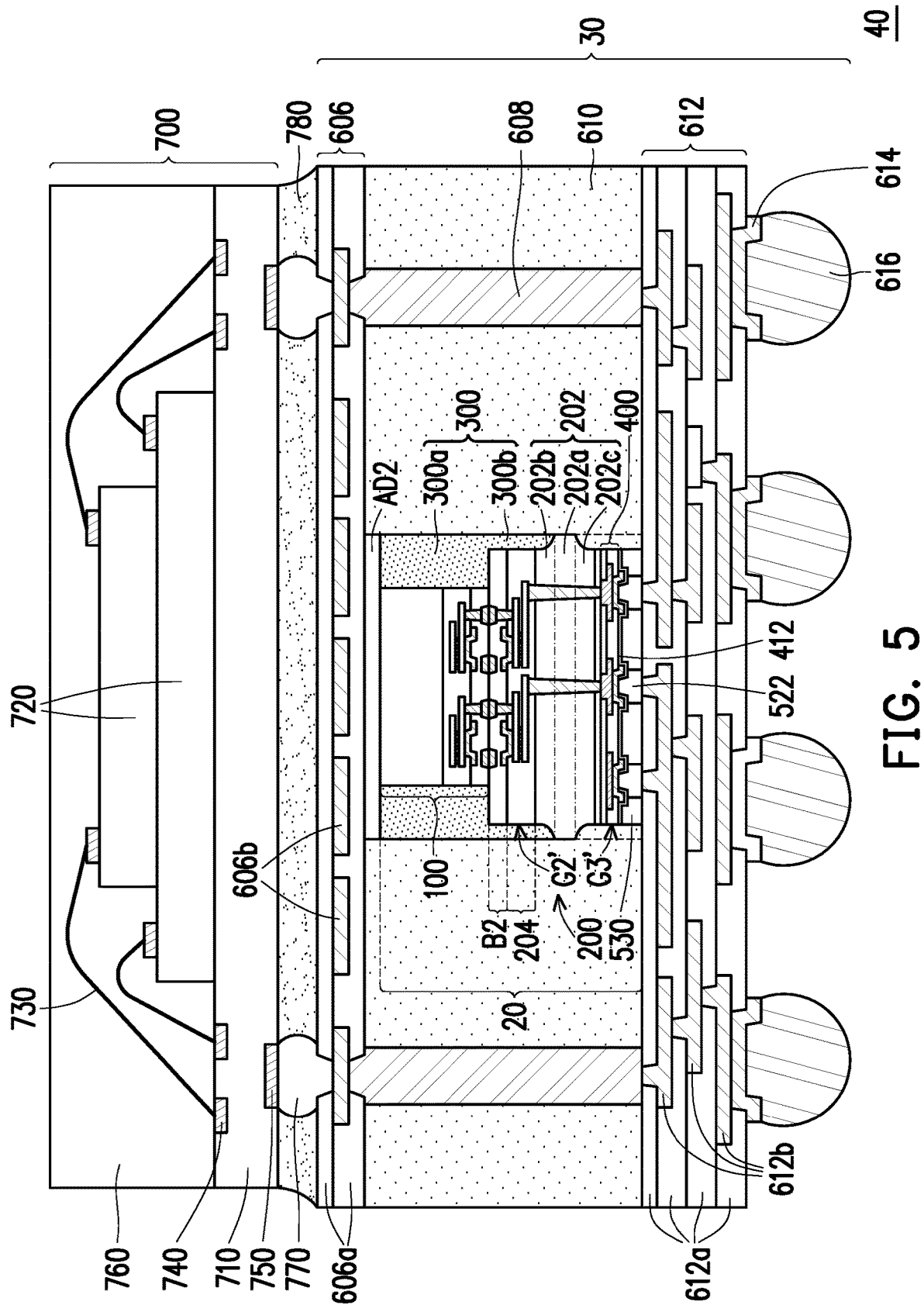
FIG. 5 is a schematic cross-sectional view of a package-on-package (PoP) structure in accordance with some embodiments of the present disclosure.

FIG. 5 is a schematic cross-sectional view of a package-on-package (PoP) structure in accordance with some embodiments of the present disclosure. Referring to FIG. 5, after fabricating a first package, such as the package structure 30 illustrated in FIG. 3K, a second package 700 may be stacked on the package structure 30 (first package) so as to form a package-on-package (PoP) structure 40. As illustrated in FIG. 5, the second package 700 is electrically connected to the conductive layer 606b of the package structure 30 (first package). In some embodiments, the second package 700 has a substrate 710, semiconductor dies 720, bonding wires 730, conductive pads 740, conductive pads 750, and an insulating encapsulation 760. In some embodiments, the semiconductor dies 720 are mounted on the illustrated top surface of the substrate 710 and stacked on top of one another, shown in FIG. 5. In some embodiments, the bonding wires 730 are used to provide electrical connections between the semiconductor dies 720 and the conductive pads 740 (such as bonding pads). In some embodiments, the insulating encapsulation 760 is formed to encapsulate and protect the semiconductor dies 720 and the bonding wires 730. In some embodiments, through insulator vias (not shown) may be used to provide electrical connections between the conductive pads 740 and the conductive pads 750 (such as bonding pads). In some embodiments, the conductive pads 740 and the conductive pads 750 are respectively disposed on two opposite surfaces of the substrate 710, as shown in FIG. 5. In certain embodiments, the conductive pads 750 are electrically connected with the semiconductor dies 720 through the through insulator vias (not shown). In some embodiments, the conductive pads 750 of the package structure 700 are electrically connected with conductive terminals 770. Furthermore, the conductive terminals 770 are electrically connected with the conductive layer 606b of the redistribution layer 606 in the package structure 30 (first package). In some embodiments, an underfill 780 is further provided to fill the gap between the second package 600 on the package structure 30 (first package) to protect the conductive terminals 770. Owing to the underfill 780, a bonding strength between the second package 700 and the package structure 30 (first package) are enhanced, thereby improving the reliability of the package-on-package structure 40.

Figure 6:
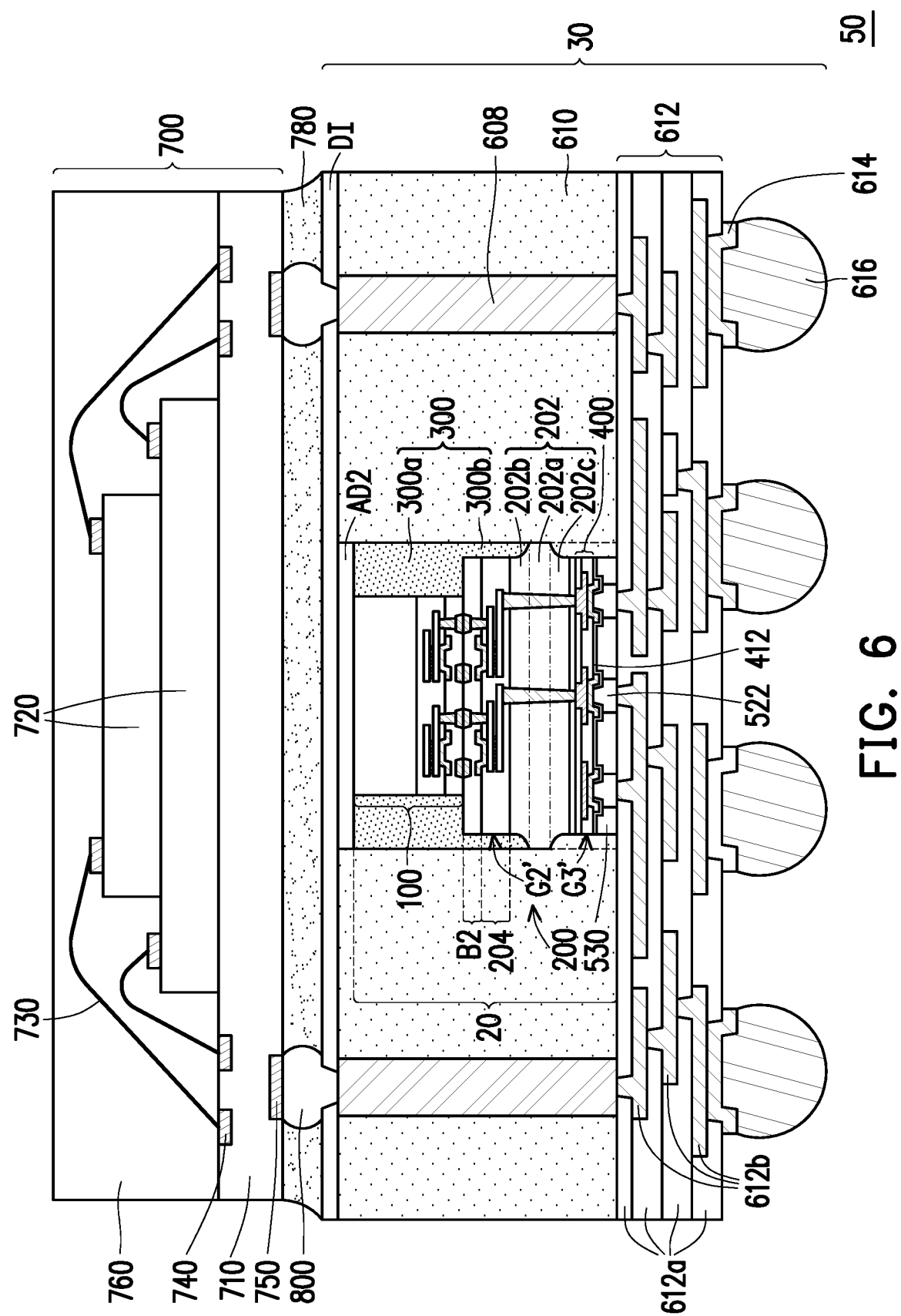
FIG. 6 is a schematic cross-sectional view of a package-on-package structure in accordance with some alternative embodiments of the present disclosure.

FIG. 6 is a schematic cross-sectional view of a package-on-package structure in accordance with some alternative embodiments of the present disclosure. The package-on-package structure 50 illustrated in FIG. 6 is similar to the package structure 40 illustrated in FIG. 5, hence the same reference numerals are used to refer to the same or liked parts, and its detailed description will be omitted herein. The main difference between the package-on-package structure 50 illustrated in FIG. 6 and package-on-package structure 40 illustrated in FIG. 5 lies in that: in the package-on-package structure 50, the redistribution circuit structure 606 is omitted from the package structure 30. Referring to FIG. 6, in some embodiments, a dielectric layer DI is formed on the backside of the die stack structure 20 in replacement of the redistribution circuit structure 606. In certain embodiments, the dielectric layer DI has openings that reveal the through insulator vias 608, and conductive terminals 800 are disposed in the openings of the dielectric layer DI to connect the through insulator vias 608. In other words, the package structure 30 of the package-on-package structure 50 with dual side terminals is accomplished without the redistribution circuit structure 606. In some alternative embodiments, the conductive terminals 800 may be omitted, and the dielectric layer DI may cover up the backside of the insulating encapsulation 610 and the backside of the die stack structure 20.

Figure 7:
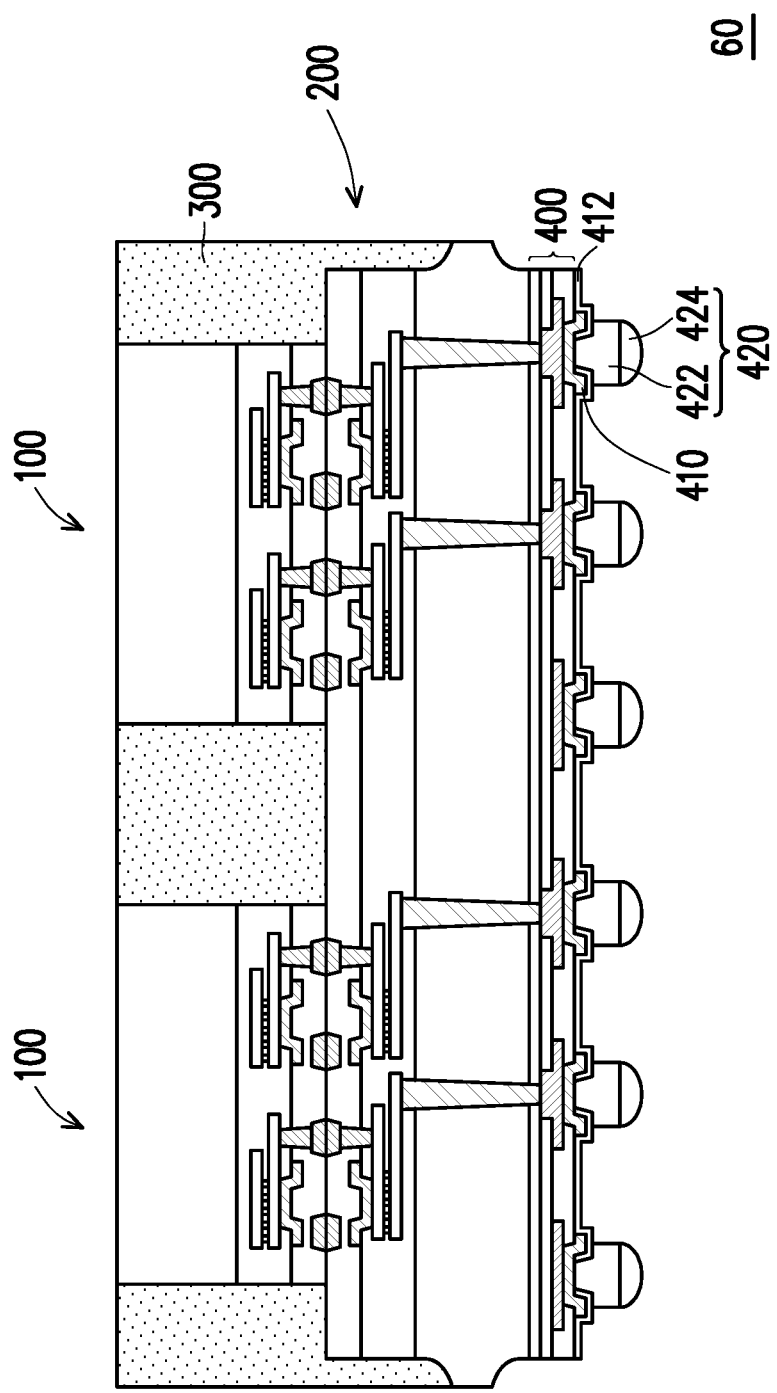
FIG. 7 is a schematic cross-sectional view of a package structure in accordance with some alternative embodiments of the present disclosure.

As shown in FIG. 2K, the die stack structure 10 includes one top tier semiconductor die 100 bonded with the bottom tier semiconductor die 200. However, the disclosure is not limited thereto. In some alternative embodiments, as shown in FIG. 7, in the die stack structure 60, multiple top tier semiconductor dies 100 may be bonded with the bottom tier semiconductor die 200. Although FIG. 7 illustrates that two top tier semiconductor dies 100 are bonded with the bottom tier semiconductor die 200, the number of top tier semiconductor dies 100 is not limited to the disclosure, and may be designated and selected based on the design layout. For example, the number of top tier semiconductor dies 100 bonded with the bottom tier semiconductor die 200 may be more than two.

Figure 8:
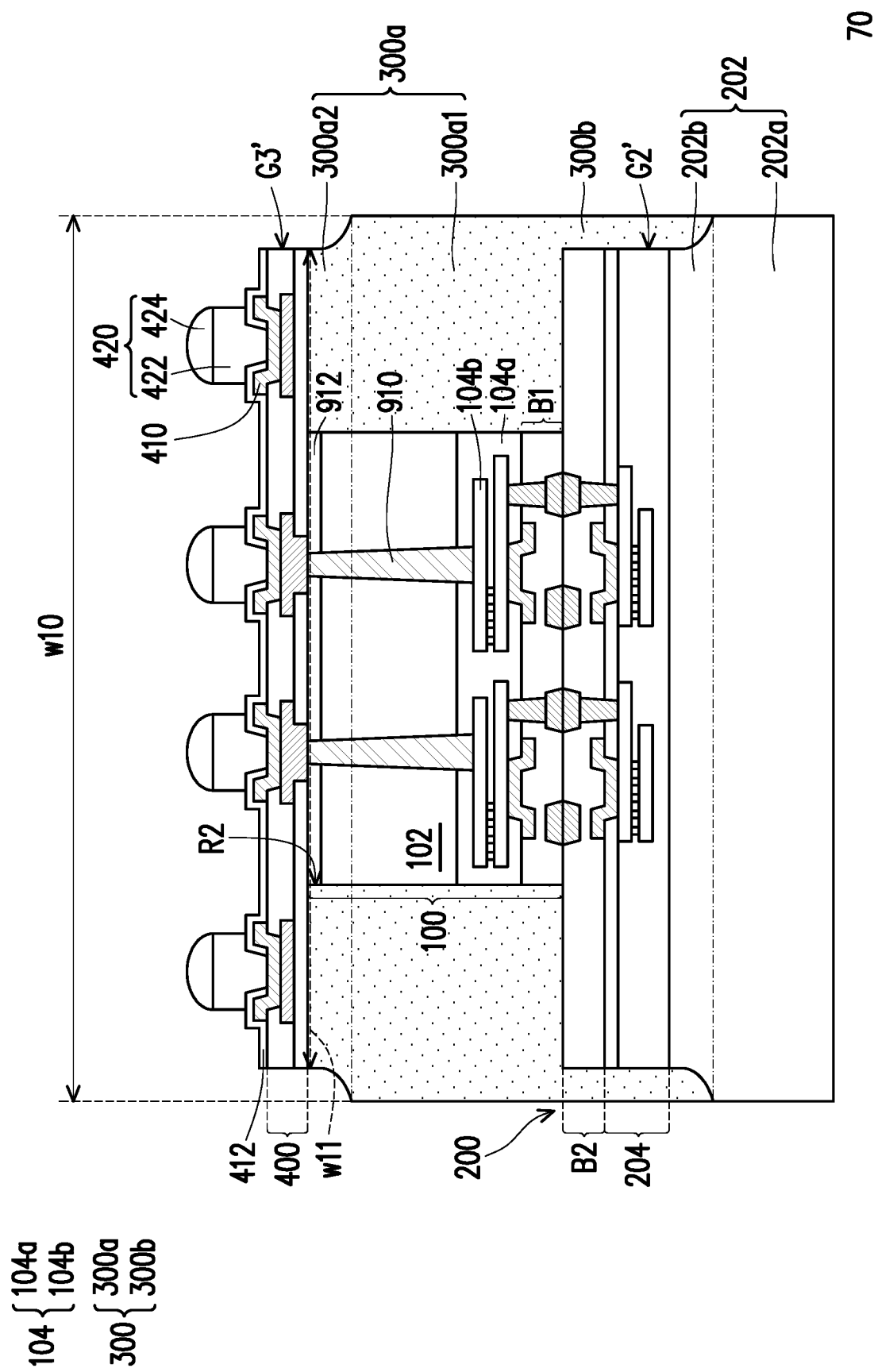
FIG. 8 is a schematic cross-sectional view of a package structure in accordance with some alternative embodiments of the present disclosure.

FIG. 8 is a schematic cross-sectional view of a package structure in accordance with some alternative embodiments of the present disclosure. Referring to FIG. 8 and FIG. 2K, the die stack structure 70 of FIG. 8 is similar to the die stack structure 10 of FIG. 2K, hence the same reference numerals are used to refer to the same or liked parts, and its detailed description will be omitted herein. The differences between the die stack structure 70 and the die stack structure 10 will be described below.

Referring to FIG. 8, in the die stack structure 70, the top tier semiconductor die 100 includes through semiconductor vias 910 while the bottom tier semiconductor die 200 does not include through semiconductor vias. In some embodiments, the through semiconductor vias 910 are located in the semiconductor substrate 102 and the interconnect structure 104. In some embodiments, the through semiconductor vias 910 are electrically connected with the conductive layers 104b of the interconnect structure 104. As illustrated in FIG. 8, the through semiconductor vias 910 penetrate through the semiconductor substrate 102, and portions of the through semiconductor vias 910 protrude from the semiconductor substrate 102. Based on the descriptions with respect to FIG. 2D to FIG. 2E mentioned above, those skilled in the art should understand that a recess R2 revealing portions of the through semiconductor vias 910 is formed by performing a thinning down process on the semiconductor substrate 102 and the insulating encapsulation 300, and after the recess R2 is formed, an isolation layer 912 is formed to fill the recess R2. Details or descriptions of the said thinning down process have been described in conjunction with FIG. 2E above, and will not be iterated herein again. As illustrated in FIG. 8, the protruding portion of each through semiconductor via 910 is laterally encapsulated by the isolation layer 912. As shown in FIG. 8, the illustrated top surfaces of the through semiconductor vias 910 are substantially flush or coplanar with the illustrated top surfaces of the isolation layer 912 and the insulating encapsulation 300. In some embodiments, the through semiconductor vias 910 penetrate through the thinned semiconductor substrate 102 and the isolation layer 912 for dual-side connection. The through semiconductor vias 910 may be similar to the through semiconductor vias 210, hence for details or descriptions of the through semiconductor vias 910 not iterated herein, please refer to the aforesaid embodiments. Also, the isolation layer 912 may be similar to the isolation layer 302, hence for details or descriptions of the isolation layer 912 not iterated herein, please refer to the aforesaid embodiments.

Moreover, based on the descriptions with respect to FIG. 2E to FIG. 2G mentioned above, those skilled in the art should understand that after the isolation layer 912 is formed, the redistribution circuit structure 400, the conductive pads 410, the insulating layer 412, and conductive terminals 420 are sequentially formed on the backside of the top tier semiconductor die 100. In some embodiments, the redistribution circuit structure 400 is electrically connected with the top tier semiconductor die 100 through the through semiconductor vias 910. Details or descriptions (e.g. the materials, formation processes, positioning configurations, etc.) of the redistribution circuit structure 400, the conductive pads 410, the insulating layer 412, and conductive terminals 420 have been described in conjunction with FIG. 2F to FIG. 2G above, and will not be iterated herein again. Accordingly, for details or descriptions of the redistribution circuit structure 400, the conductive pads 410, the insulating layer 412, and conductive terminals 420 not iterated herein, please refer to the aforesaid embodiments.

As shown in FIG. 8, in the die stack structure 70, due to the ring-shaped groove G3', the body portion 300a of the insulating encapsulation 300 may include a top portion 300a2 and a bottom portion 300a1, wherein the redistribution circuit structure 400 is in contact with the illustrated top surface of the top portion 300a2, and along the direction X2, the lateral dimension w10 of the bottom portion 300a1 is greater than the lateral dimension w11 of the illustrated top surface of the top portion 300a2. Details or descriptions (e.g. the materials, formation processes, positioning configurations, etc.) of the insulating encapsulation 300 have been described in conjunction with FIG. 2D to FIG. 2H above, and will not be iterated herein again. Accordingly, for details or descriptions of the insulating encapsulation 300 not iterated herein, please refer to the aforesaid embodiments.

Based on the descriptions with respect to FIG. 2I to FIG. 2K mentioned above, those skilled in the art should understand that the ring-shaped groove G3' is originated from grooves (e.g., the grooves G3 in FIG. 2I) formed by a pre-cut process (e.g., the pre-cut process S3 in FIG. 2I) performed on the redistribution circuit structure 400, thereby the lateral dimension of the top portion 300a2 and the lateral dimension w10 of the bottom portion 300a1 are determined by the maximum cutting width of the said pre-cut process (e.g., the maximum lateral dimension w3 of the grooves G3 as shown in FIG. 2I). In detail, as shown in FIG. 8, due to the ring-shaped groove G3', the top portion 300a2 may have a minimum lateral dimension at the illustrated top surface contacting the redistribution circuit structure 400 and a maximum lateral dimension at the illustrated bottom surface contacting the bottom portion 300a1. That is to say, in the die stack structure 70, the lateral dimension w10 of the bottom portion 300a1 is greater than the minimum lateral dimension w11 of the top portion 300a2. As shown in FIG. 8, the ring-shaped groove G3' is defined by the redistribution circuit structure 400 and the body portion 300a of the insulating encapsulation 300. In view of this, those skilled in the art should understand that the grooves (e.g., the grooves G3 in FIG. 2I) formed by the pre-cut process (e.g., the pre-cut process S3 in FIG. 2I) performed on the redistribution circuit structure 400 are formed to extend through the redistribution circuit structure 400 into the insulating encapsulation 300, and portions of the insulating encapsulation 300 are revealed by the said grooves. From another point of view, since the grooves (e.g., the grooves G3 in FIG. 2I) formed by the pre-cut process (e.g., the pre-cut process S3 in FIG. 2I) performed on the redistribution circuit structure 400 are formed to extend through the redistribution circuit structure 400 into the insulating encapsulation 300, the semiconductor substrate 202 of the bottom tier semiconductor die 200 includes the first portion 202a and the second portion 202b without having the third portion 202c.

Further, based on the descriptions with respect to FIG. 2I to FIG. 2K mentioned above, those skilled in the art should understand that the pre-cut process (e.g., the pre-cut process S3 in FIG. 2I) performed on the redistribution circuit structure 400 can protect the redistribution circuit structure 400 and the insulating layer 412 from being damaged during the wafer sawing process (e.g., the wafer sawing process S4 in FIG. 2J) for singulating the die stack structure 70 by allowing the redistribution circuit structure 400 and the insulating layer 412 of each singulated die stack structure 70 being not be in contact with the blade used in the said wafer sawing process.

And, based on the descriptions with respect to FIG. 2A to FIG. 2K mentioned above, those skilled in the art should understand that in the manufacturing method of the die stack structure 70, the pre-cut process (e.g., the pre-cut process S3 in FIG. 2I) performed on the redistribution circuit structure 400 and a pre-cut process (e.g., the pre-cut process S2 in FIG. 2C) performed on the bottom tier semiconductor die 200 are performed from the same side of the bottom tier semiconductor die 200, i.e., the front side of the bottom tier semiconductor die 200.

Figure 9:
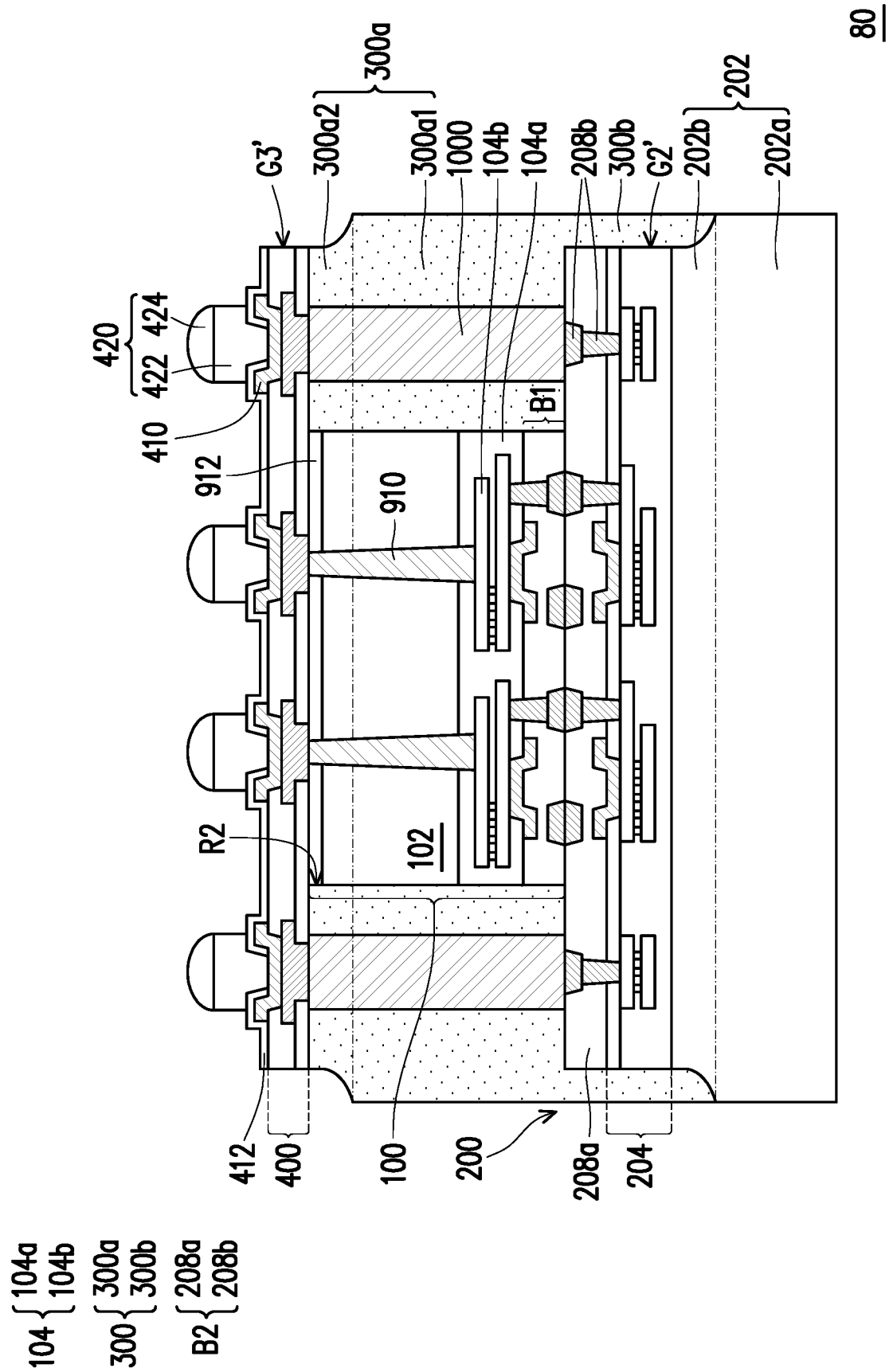
FIG. 9 is a schematic cross-sectional view of a package structure in accordance with some alternative embodiments of the present disclosure.

FIG. 9 is a schematic cross-sectional view of a package structure in accordance with some alternative embodiments of the present disclosure. Referring to FIG. 9 and FIG. 8, the die stack structure 80 of FIG. 9 is similar to the die stack structure 70 of FIG. 8, hence the same reference numerals are used to refer to the same or liked parts, and its detailed description will be omitted herein. The differences between the die stack structure 80 and the die stack structure 70 will be described below.

Referring to FIG. 9, the die stack structure 80 includes a plurality of through insulator vias 1000 embedded in the insulating encapsulation 300. In some embodiments, the through insulator vias 1000 are disposed to surround the top tier semiconductor die 100 and are attached to the bonding conductors 208b of the bonding structure B2. For example, the through insulator vias 1000 are plated on the bonding conductors 208b. In other words, the through insulator vias 1000 are directly in contact with the bonding conductors 208b and are physically and electrically connected with the bonding structure B2 of the bottom tier semiconductor die 200. In some embodiments, the material and the formation of the through insulator vias 1000 is similar to those of the through insulator vias 608 mentioned above in conjunction with FIGS. 3A-3K. As such, for the detailed descriptions of the through insulator vias 1000 not iterated herein, please refer to the aforesaid embodiments. Further, as shown in FIG. 9, the through insulator vias 1000 are electrically connected with the redistribution circuit structure 400. That is to say, the bottom tier semiconductor die 200 may be electrically connected with the redistribution circuit structure 400 through the through insulator vias 1000. In some embodiments, the top tier semiconductor die 100 is electrically connected with the through insulator vias 1000 through the redistribution circuit structure 400. In certain embodiments, some of the conductive terminals 420 may be electrically connected with the top tier semiconductor die 100 through the redistribution circuit structure 400 and the through semiconductor vias 910. Furthermore, some of the conductive terminals 420 may be electrically connected with the through insulator vias 1000 through the redistribution circuit structure 400. For simplification, only two through insulator vias 1000 are illustrated in FIG. 9. However, it should be noted that in the single die stack structure 80, the number of the through insulator vias 1000 is not limited thereto, and can be selected based on requirement.

Figure 10:
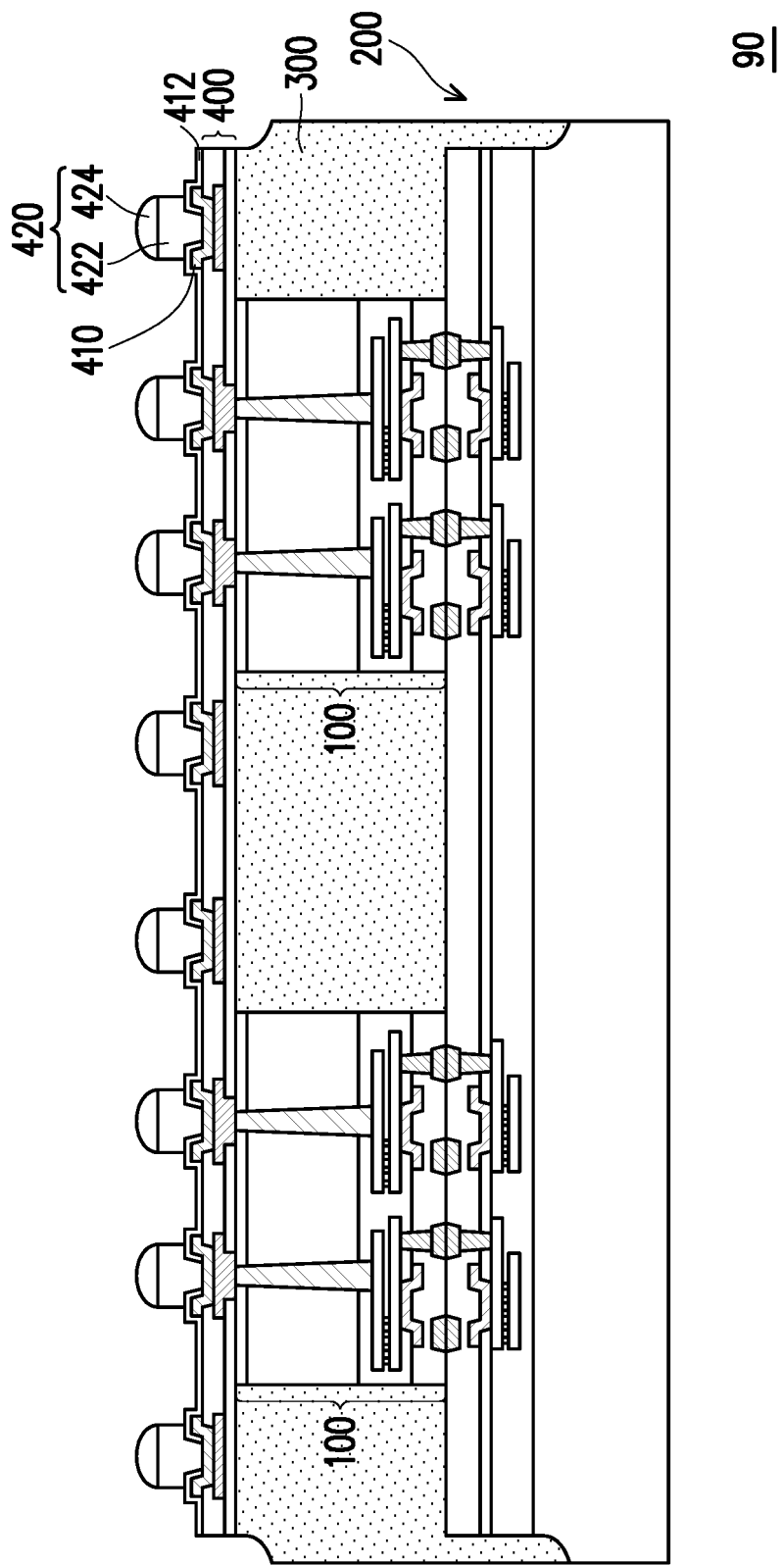
FIG. 10 is a schematic cross-sectional view of a package structure in accordance with some alternative embodiments of the present disclosure.

As shown in FIG. 8, the die stack structure 70 includes one top tier semiconductor die 100 bonded with the bottom tier semiconductor die 200. However, the disclosure is not limited thereto. In some alternative embodiments, as shown in FIG. 10, in the die stack structure 90, multiple top tier semiconductor dies 100 may be bonded with the bottom tier semiconductor die 200. Although FIG. 10 illustrates that two top tier semiconductor dies 100 are bonded with the bottom tier semiconductor die 200, the number of top tier semiconductor dies 100 is not limited to the disclosure, and may be designated and selected based on the design layout. For example, the number of top tier semiconductor dies 100 bonded with the bottom tier semiconductor die 200 may be more than two.

In accordance with some embodiments of the disclosure, a die stack structure including a first semiconductor die, a second semiconductor die, an insulating encapsulation and a redistribution circuit structure is provided. The first semiconductor die includes a first semiconductor substrate, a first interconnect structure, and a first bonding structure, the first semiconductor substrate includes a first portion and a second portion disposed on the first portion, the first interconnect structure is disposed on a top surface of the second portion, a lateral dimension of the first portion is greater than a lateral dimension of the top surface of the second portion, the first bonding structure is disposed on and electrically connected with the first interconnect structure, and the first bonding structure includes a first dielectric layer and first conductors embedded in the first dielectric layer. The second semiconductor die is disposed on the first semiconductor die and includes a second bonding structure, the second bonding structure includes a second dielectric layer and second conductors embedded in the second dielectric layer, the first dielectric layer is in contact with the second dielectric layer, and the first conductors is in contact with the second conductors. The insulating encapsulation is disposed on the first portion and laterally encapsulates the second portion and the second semiconductor die. The redistribution circuit structure is electrically connected with the first semiconductor die and the second semiconductor die, wherein the lateral dimension of the first portion is greater than a lateral dimension of the redistribution circuit structure.

In accordance with some other embodiments of the disclosure, a package structure including a first semiconductor die, a second semiconductor die, a first insulating encapsulation, a first redistribution circuit structure, a second insulating encapsulation and a second redistribution circuit structure. The first semiconductor die includes a first semiconductor substrate, a first interconnect structure and a first bonding structure, the first semiconductor substrate includes a first portion and a second portion disposed on the first portion, the first interconnect structure is disposed on a top surface of the second portion, a lateral dimension of the first portion is greater than a lateral dimension of the top surface of the second portion, and the first bonding structure is disposed on and electrically connected to the first interconnect structure. The second semiconductor die includes a second semiconductor substrate, a second interconnect structure disposed on the second semiconductor substrate and a second bonding structure disposed on the second interconnect structure, the second semiconductor die is electrically connected with the first semiconductor die through the first and second bonding structures. The first insulating encapsulation is disposed on the first portion of the first semiconductor substrate, and laterally encapsulates the second semiconductor die and the second portion of the first semiconductor substrate. The first redistribution circuit structure is electrically connected with the first semiconductor die and the second semiconductor die, wherein the lateral dimension of the first portion is greater than a lateral dimension of the redistribution circuit structure. The second insulating encapsulation laterally encapsulates the first insulating encapsulation, the first portion and the first redistribution circuit structure. The second redistribution circuit structure is disposed on the first redistribution circuit structure and the second insulating encapsulation, and electrically connected with the first redistribution circuit structure.

In accordance with some other embodiments of the disclosure, a method including the followings is provided. Top tier semiconductor dies are bonded to a semiconductor wafer including bottom tier semiconductor dies, wherein the semiconductor wafer includes a semiconductor substrate and an interconnect structure disposed on the semiconductor substrate. First grooves are formed on the semiconductor wafer, wherein the first grooves extend through the interconnect structure into the semiconductor substrate, and the semiconductor substrate is revealed by the first grooves. An insulating encapsulation is formed over the semiconductor wafer to laterally encapsulate the top tier semiconductor dies and fill the first grooves to form a reconstructed wafer. A redistribution circuit structure is formed on the reconstructed wafer to be electrically connected with the top tier semiconductor dies and the bottom tier semiconductor dies. A wafer sawing process is performed to saw the reconstructed wafer along scribe lines of the semiconductor wafer, wherein a maximum lateral dimension of the first grooves is wider than a maximum cutting width of the wafer sawing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A die stack structure, comprising:
a first semiconductor die comprising a first semiconductor substrate, a first interconnect structure, and a first bonding structure, the first semiconductor substrate comprising a first portion and a second portion disposed on the first portion, the first interconnect structure being disposed on a top surface of the second portion, a lateral dimension of the first portion being greater than a lateral dimension of the top surface of the second portion, the first bonding structure being disposed on and electrically connected with the first interconnect structure, and the first bonding structure comprising a first dielectric layer and first conductors embedded in the first dielectric layer;
a second semiconductor die disposed on the first semiconductor die and comprising a second bonding structure, the second bonding structure comprising a second dielectric layer and second conductors embedded in the second dielectric layer, the first dielectric layer being in contact with the second dielectric layer, and the first conductors being in contact with the second conductors;
an insulating encapsulation disposed on the first portion and laterally encapsulating the second portion and the second semiconductor die; and
a redistribution circuit structure electrically connected with the first semiconductor die and the second semiconductor die, wherein the lateral dimension of the first portion is greater than a lateral dimension of the redistribution circuit structure.
2. The die stack structure as claimed in claim 1, wherein the insulating encapsulation covers sidewalls of the second portion, and sidewalls of the insulating encapsulation are substantially aligned with sidewalls of the first portion.

3. The die stack structure as claimed in claim 1, wherein the first semiconductor die comprises through semiconductor vias electrically connected with the first redistribution circuit structure.

4. The die stack structure as claimed in claim 3, wherein the first semiconductor substrate further comprises a third portion, the first portion is located between the second portion and the third portion, the first portion contacts a top surface of the third portion, the lateral dimension of the first portion is greater than a lateral dimension of a bottom surface of the third portion, and the top surface of the third portion is opposite to the bottom surface of the third portion.

5. The die stack structure as claimed in claim 1, wherein the insulating encapsulation comprises a body portion and a ring portion, the body portion laterally encapsulating the second semiconductor die, the ring portion extending along sidewalls of the first interconnect structure, sidewalls of the first bonding structure and the sidewalls of the second portion.

6. The die stack structure as claimed in claim 5, wherein the second semiconductor die comprises through semiconductor vias electrically connected to the first redistribution circuit structure.

7. The die stack structure as claimed in claim 6, wherein the body portion of the insulating encapsulation comprises a top portion and a bottom portion, the redistribution circuit structure is in contact with a top surface of the top portion, and a lateral dimension of the bottom portion is greater than a lateral dimension of the top surface of the top portion.

8. A package structure, comprising:
   a first semiconductor die comprising a first semiconductor substrate, a first interconnect structure and a first bonding structure, the first semiconductor substrate comprising a first portion and a second portion disposed on the first portion, the first interconnect structure being disposed on a top surface of the second portion, a lateral dimension of the first portion being greater than a lateral dimension of the top surface of the second portion, and the first bonding structure being disposed on and electrically connected to the first interconnect structure;
   a second semiconductor die comprising a second semiconductor substrate, a second interconnect structure disposed on the second semiconductor substrate and a second bonding structure disposed on the second interconnect structure, the second semiconductor die being electrically connected with the first semiconductor die through the first and second bonding structures;
   a first insulating encapsulation disposed on the first portion of the first semiconductor substrate, and laterally encapsulating the second semiconductor die and the second portion of the first semiconductor substrate;
   a first redistribution circuit structure electrically connected with the first semiconductor die and the second semiconductor die, wherein the lateral dimension of the first portion is greater than a lateral dimension of the redistribution circuit structure;
   a second insulating encapsulation laterally encapsulating the first insulating encapsulation, the first portion and the first redistribution circuit structure; and
   a second redistribution circuit structure disposed on the first redistribution circuit structure and the second insulating encapsulation, and electrically connected with the first redistribution circuit structure.

9. The package structure as claimed in claim 8, wherein the first insulating encapsulation covers sidewalls of the second portion of the first semiconductor substrate, sidewalls of the first insulating encapsulation are substantially aligned with sidewalls of the first portion of the first semiconductor substrate, and the second insulating encapsulation covers sidewalls of the first portion of the first semiconductor substrate and sidewalls of first redistribution circuit structure.

10. The package structure as claimed in claim 8, wherein the first insulating encapsulation comprises a body portion and a ring portion, the body portion laterally encapsulating the second semiconductor die, the ring portion extending along sidewalls of the first interconnect structure, sidewalls of the first bonding structure and the sidewalls of the second portion of the first semiconductor substrate.

11. The package structure as claimed in claim 8 further comprising through insulator vias penetrating the second insulating encapsulation, and electrically connected with the second redistribution circuit structure.

12. The package structure as claimed in claim 10, wherein the first semiconductor die comprises through semiconductor vias electrically connected to the first redistribution circuit structure.

13. The package structure as claimed in claim 12, wherein the first semiconductor substrate further comprises a third portion, the first portion is located between the second portion and the third portion, the first portion contacts a top surface of the third portion, the lateral dimension of the first portion is greater than a lateral dimension of a bottom surface of the third portion, the top surface of the third portion is opposite to the bottom surface of the third portion, and the second insulating encapsulation covers sidewalls of the third portion of the first semiconductor substrate.

14. The package structure as claimed in claim 8, wherein the second semiconductor die comprises through semiconductor vias electrically connected to the first redistribution circuit structure.

15. The package structure as claimed in claim 14, wherein the body portion of the first insulating encapsulation comprises a top portion and a bottom portion, the first redistribution circuit structure is in contact with a top surface of the top portion, a lateral dimension of the bottom portion is greater than a lateral dimension of the top surface of the top portion, and the second insulating encapsulation covers sidewalls of the top portion of the body portion of the first insulating encapsulation.

* * * * *